US006667184B2

(12) United States Patent
Motoki et al.

(10) Patent No.: US 6,667,184 B2
(45) Date of Patent: Dec. 23, 2003

(54) SINGLE CRYSTAL GAN SUBSTRATE, METHOD OF GROWING SAME AND METHOD OF PRODUCING SAME

(75) Inventors: Kensaku Motoki, Hyogo (JP); Takuji Okahisa, Hyogo (JP); Seiji Nakahata, Hyogo (JP); Ryu Hirota, Hyogo (JP); Koji Uematsu, Hyogo (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 10/246,559

(22) Filed: Sep. 19, 2002

(65) Prior Publication Data

US 2003/0080345 A1 May 1, 2003

(30) Foreign Application Priority Data

Sep. 19, 2001 (JP) ........................ 2001/284323
Aug. 8, 2002 (JP) ........................ 2002/230925

(51) Int. Cl.[7] .............................................. H01L 21/00
(52) U.S. Cl. ............................ 438/22; 438/22; 438/24; 438/42
(58) Field of Search ........................... 438/22, 24, 42, 438/46, 47, 481, 478; 257/13, 22

(56) References Cited

U.S. PATENT DOCUMENTS 6,537,839 B2 * 3/2003 Ota et al. ..................... 438/22
6,555,846 B1 * 4/2003 Watanabe et al. ............. 257/94

FOREIGN PATENT DOCUMENTS

| JP | 10-171276 | 6/1998 |
| JP | 10-9008 | 1/2000 |
| JP | 10-102546 | 4/2001 |
| WO | WO99/23693 | 5/1999 |

* cited by examiner

Primary Examiner—David Nelms
Assistant Examiner—Thinh T. Nguyen
(74) Attorney, Agent, or Firm—McDermott, Will & Emery

(57) ABSTRACT

Seeds are implanted in a regular pattern upon an undersubstrate. A GaN crystal is grown on the seed implanted undersubstrate by a facet growth method. The facet growth makes facet pits above the seeds. The facets assemble dislocations to the pit bottoms from neighboring regions and make closed defect accumulating regions (H) under the facet bottoms. The closed defect accumulating regions (H) arrest dislocations permanently. Release of dislocations, radial planar defect assemblies and linear defect assemblies are forbidden. The surrounding accompanying low dislocation single crystal regions (Z) and extra low dislocation single crystal regions (Y) are low dislocation density single crystals.

42 Claims, 14 Drawing Sheets

Fig.1 Prior Art
decrement of dislocations by a pit made by facets
(a) a pit made by facets
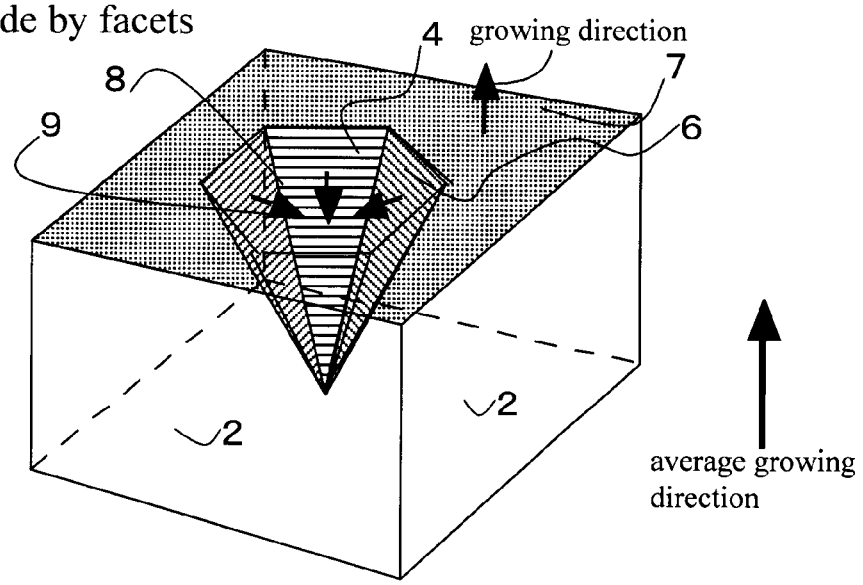
(b) after continual growth
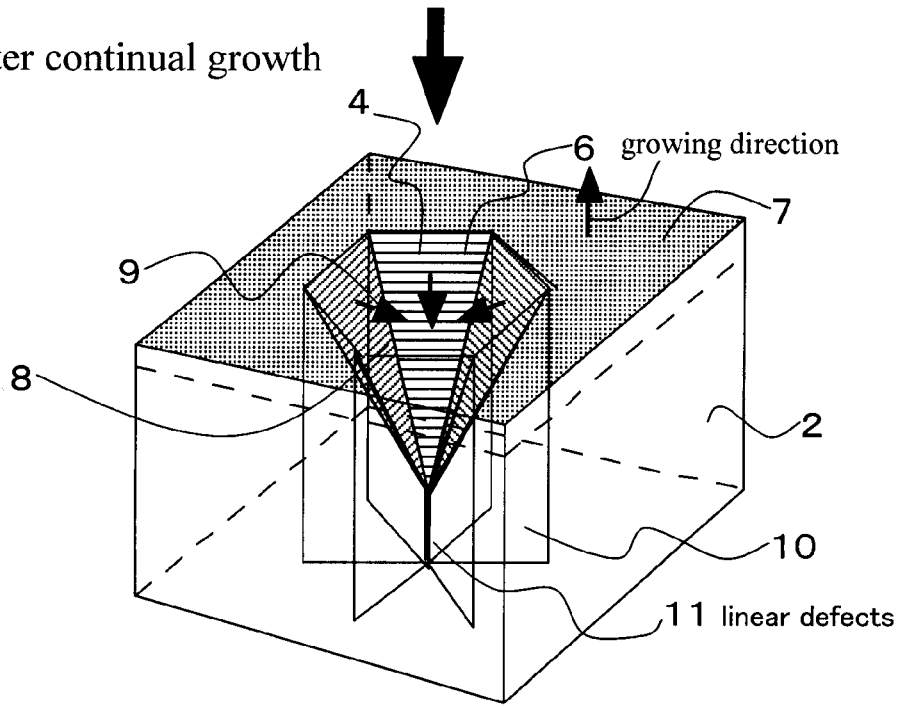

Movements of dislocations inside a pit made by facets

Fig.3 Prior Art facet growth
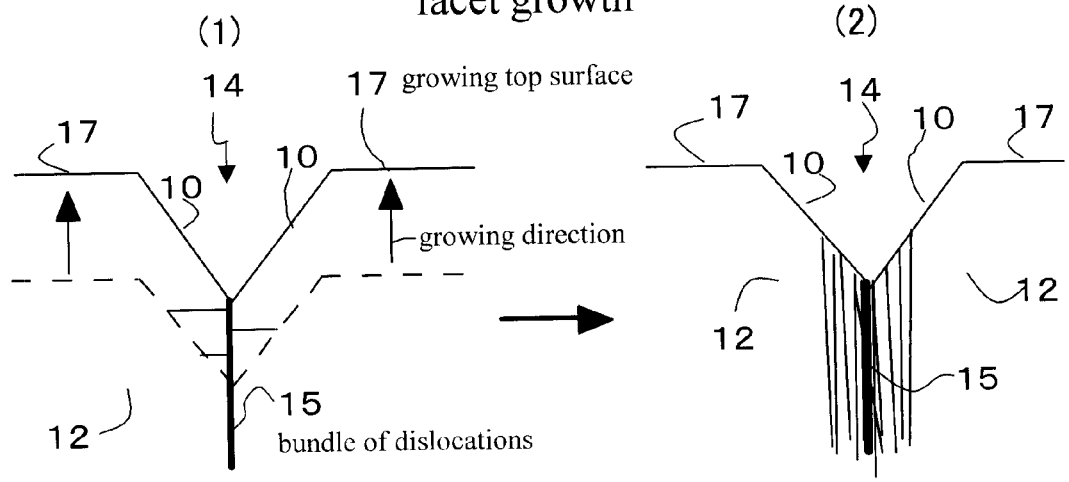
Fig.4 growing method of the present invention
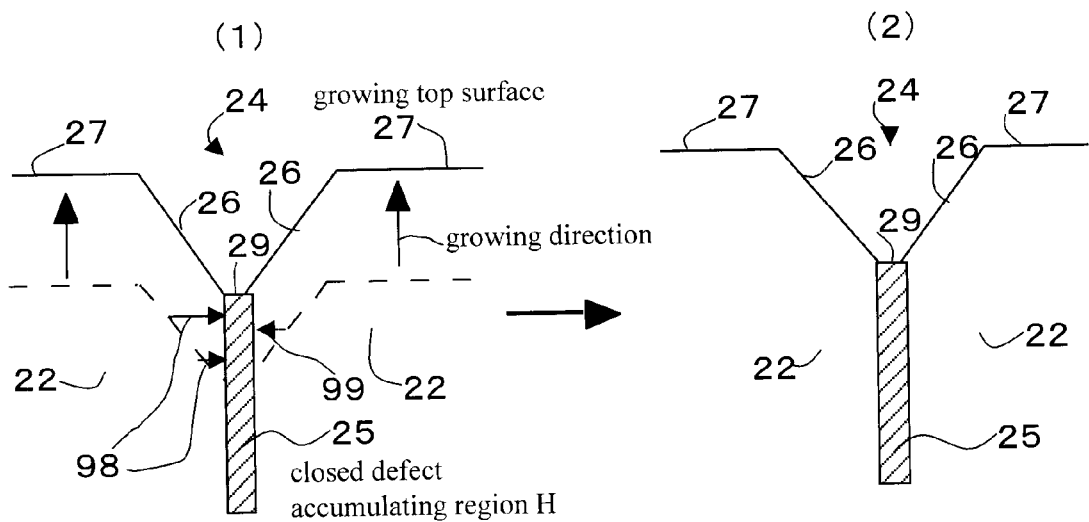

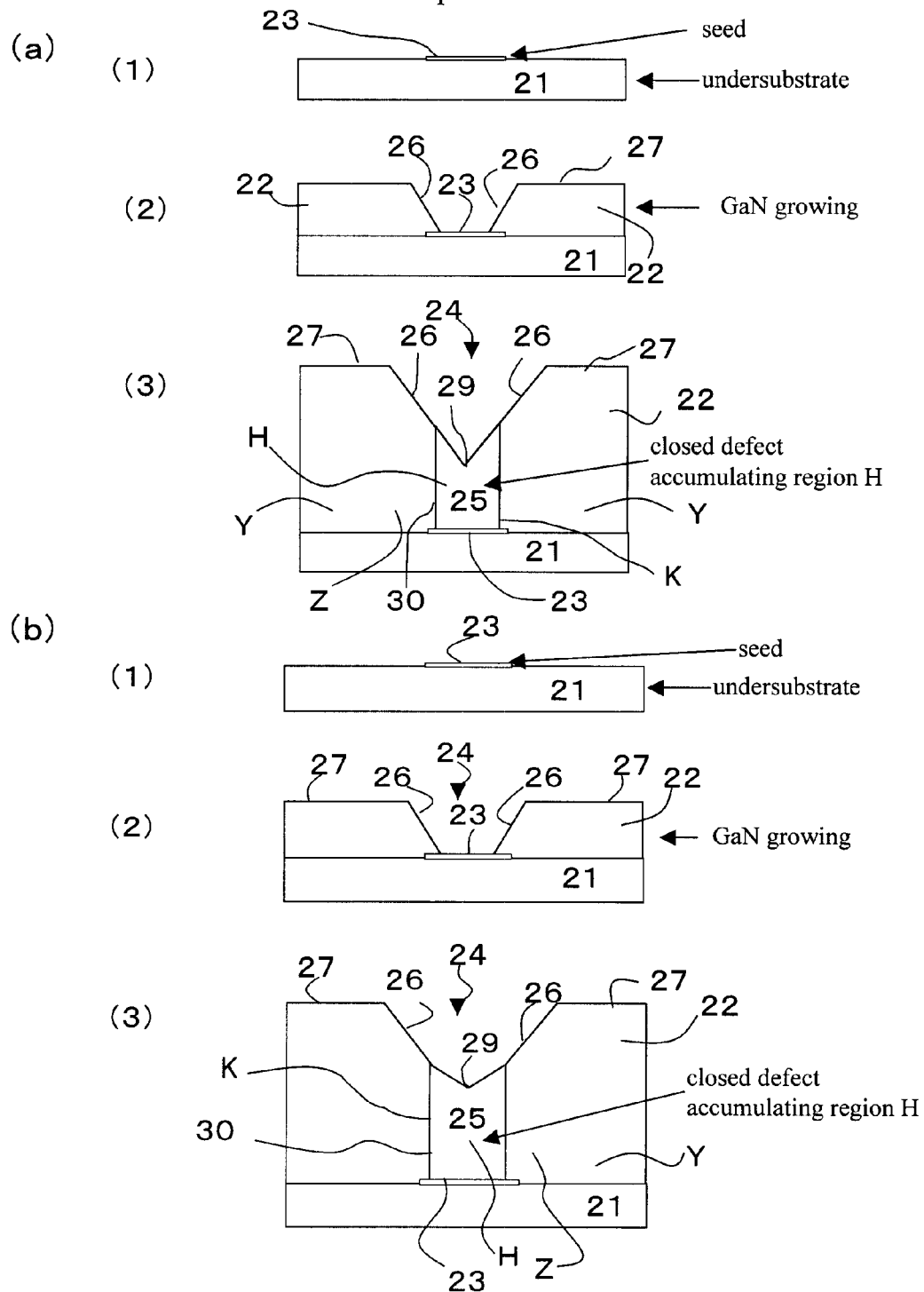
Fig.5 relation between seed and closed defect accumulating region H in the present invention relation between seeds and closed defect accumulating regions H in the present invention six-fold rotational symmetry arrangement on undersubstrate two-fold rotational symmetry arrangement on undersubstrate

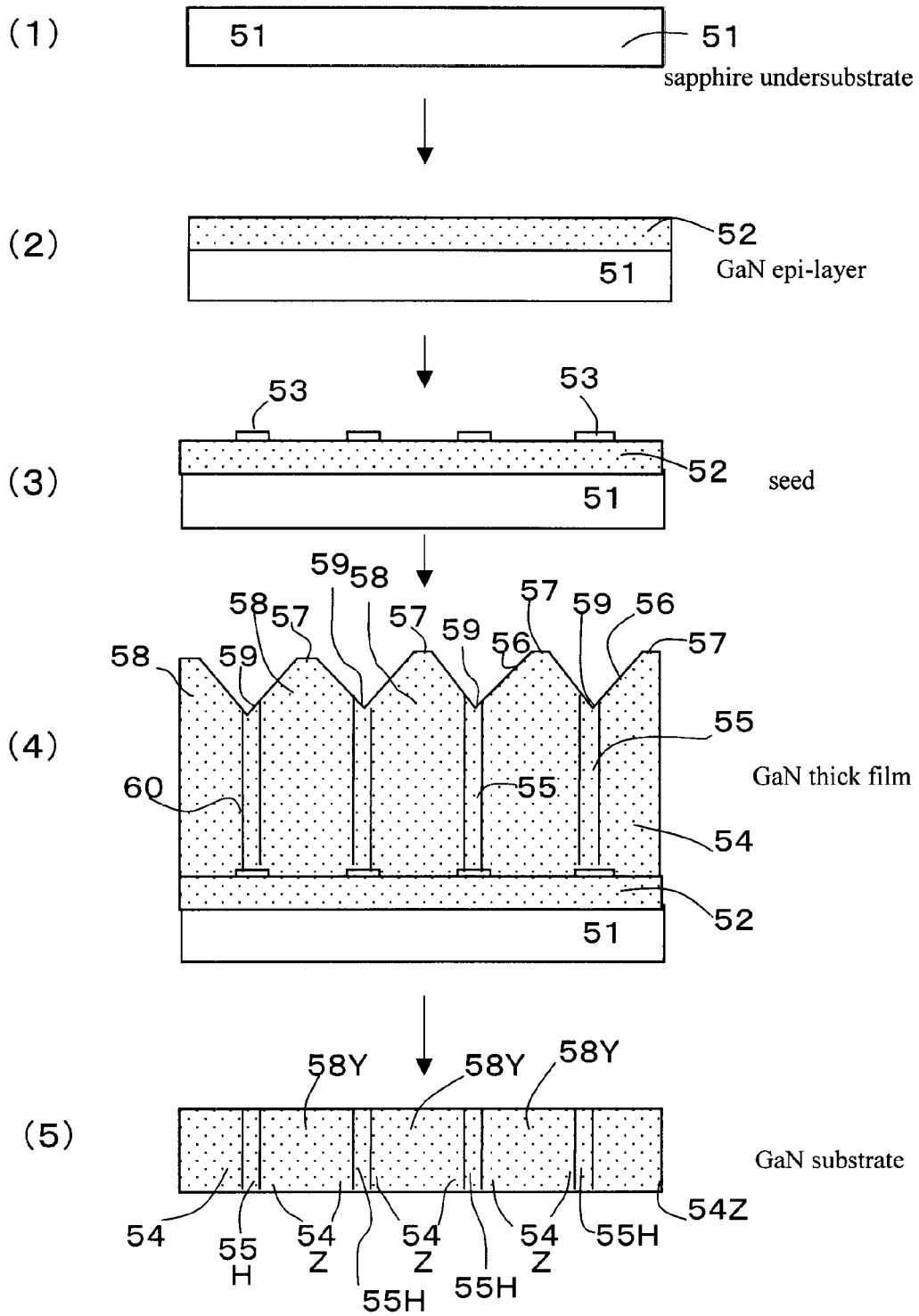

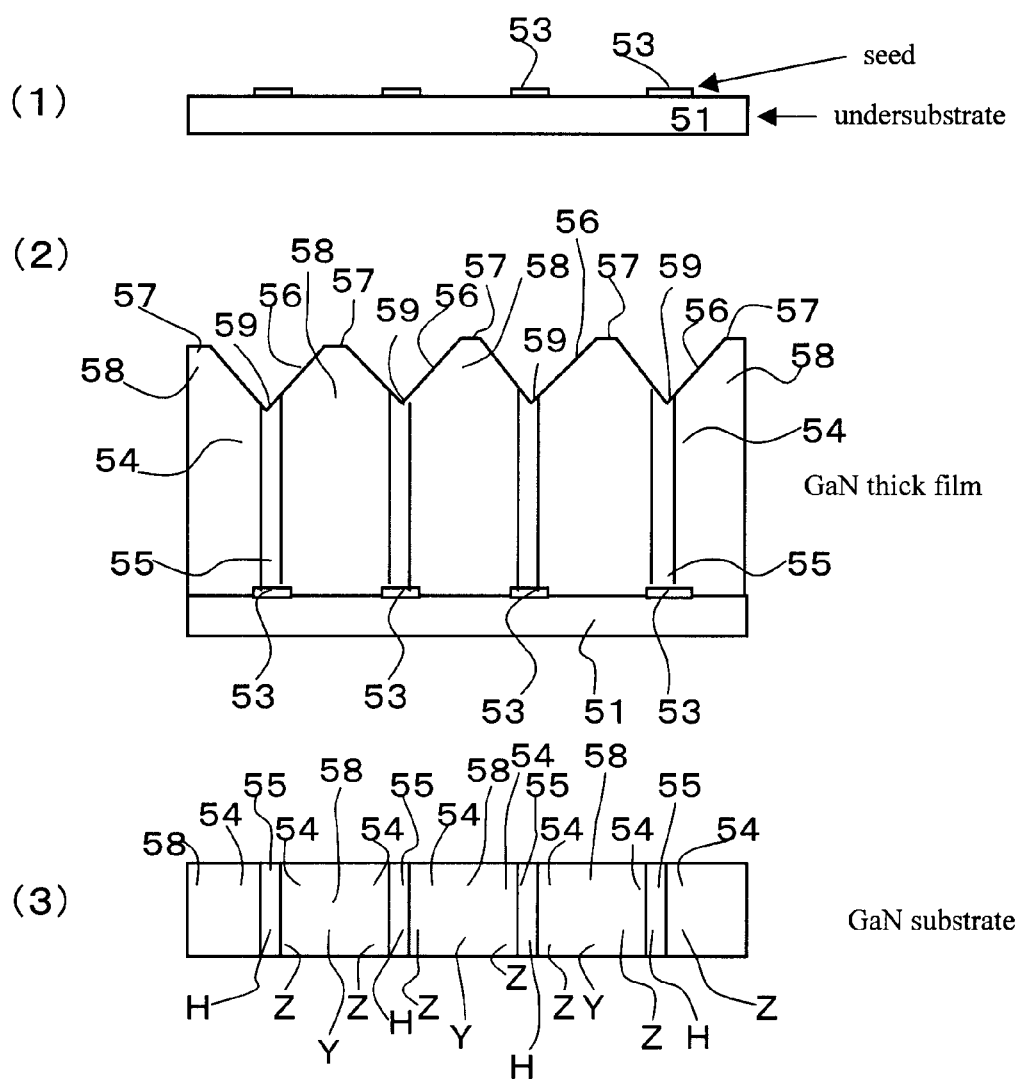
Fig.12 Embodiment 2
processes of producing a GaN substrate

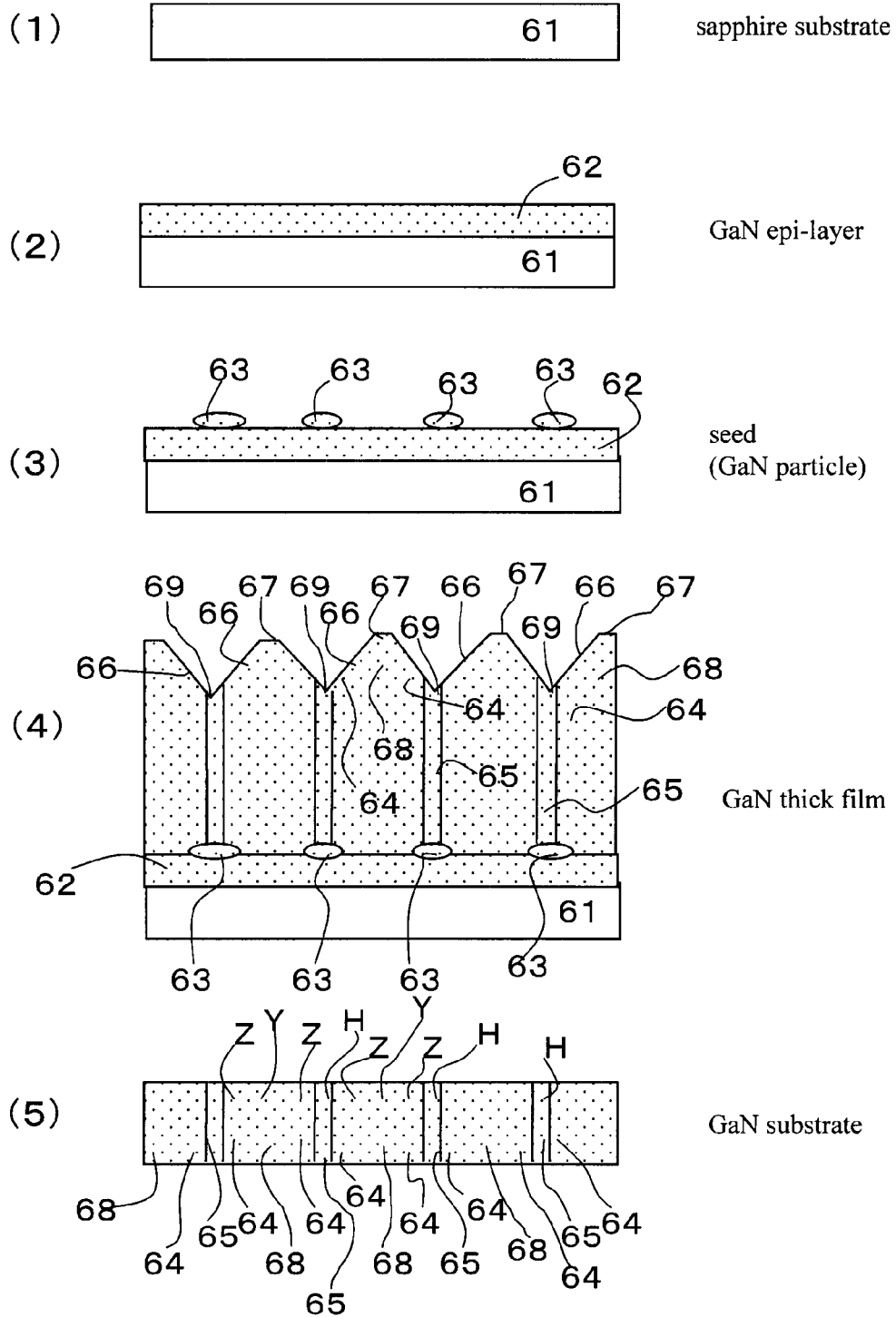
Fig.13 Embodiment 4
Processes of producing a GaN substrate

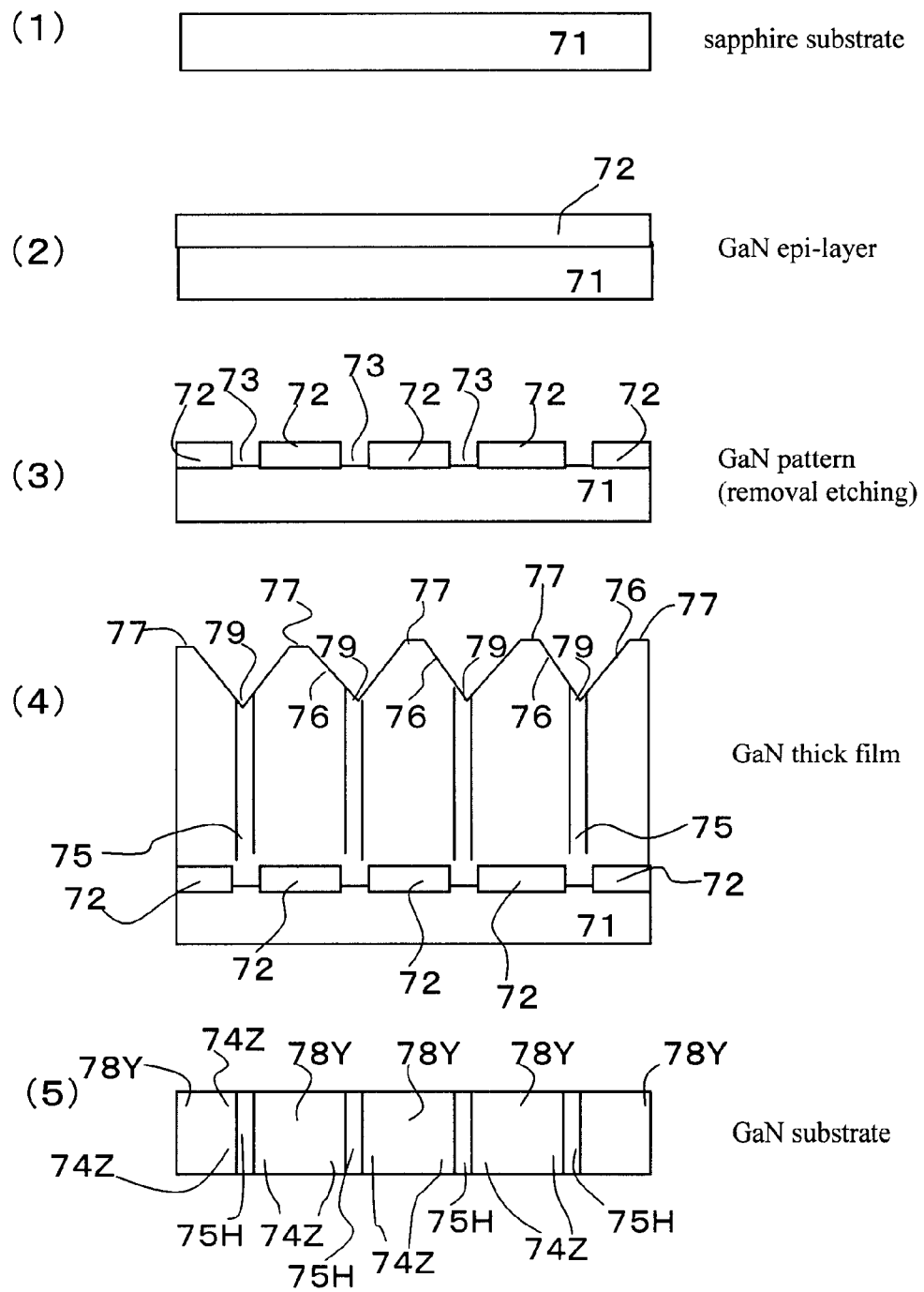
Fig.14 Embodiment 5 Processes of producing a GaN substrate

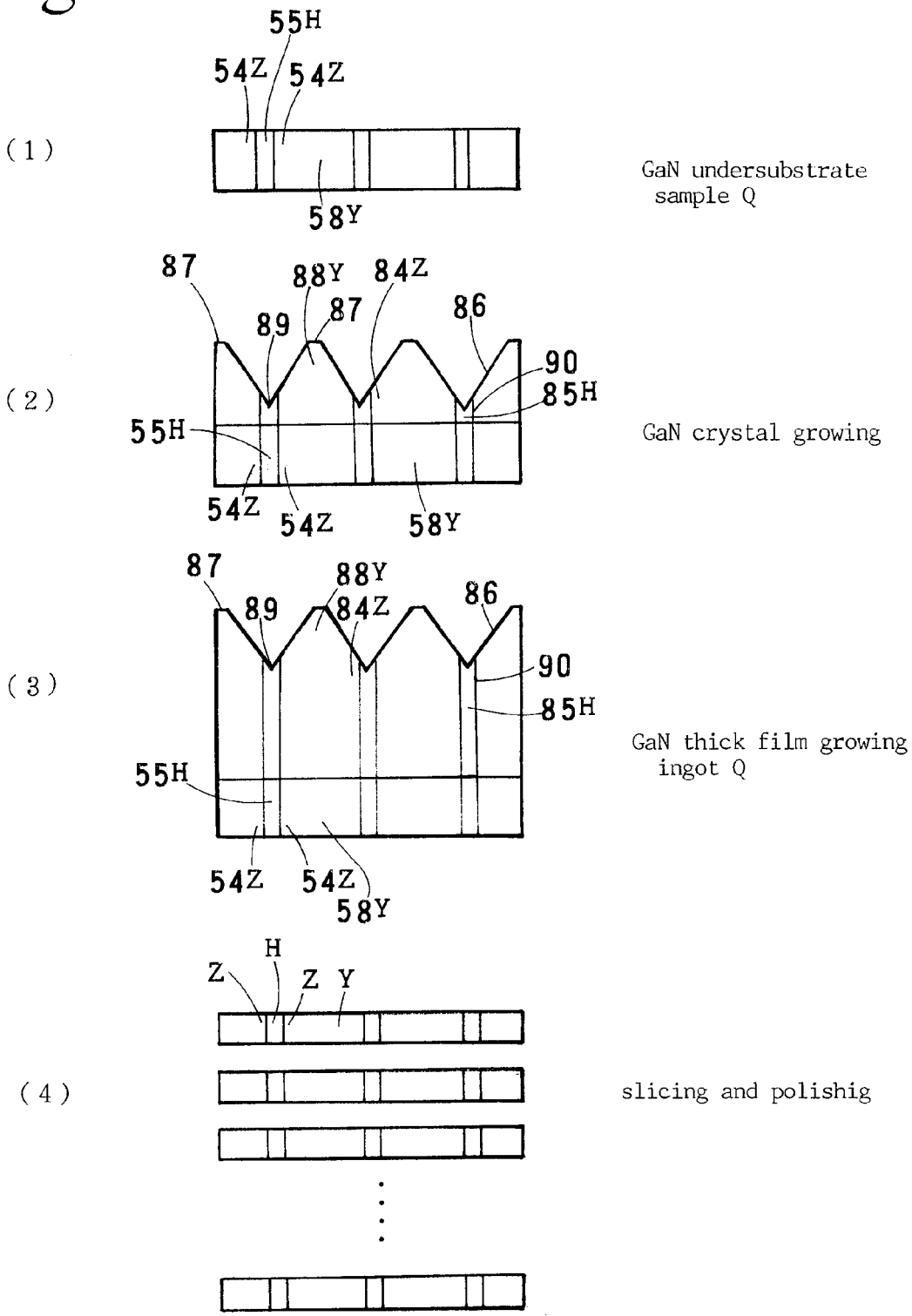
Fig.15 Embodiment 6
(1) GaN undersubstrate sample Q
(2) GaN crystal growing
(3) GaN thick film growing ingot Q
(4) slicing and polishig

SINGLE CRYSTAL GAN SUBSTRATE, METHOD OF GROWING SAME AND METHOD OF PRODUCING SAME

BACKGROUND OF THE INVENTION

1. Field of the Invention

This invention relates to a single crystal gallium nitride (GaN) substrate for producing blue light emitting diodes (LEDs) and blue light laser diodes (LDs) composed of group 3–5 nitride type semiconductors, a method of growing a single crystal gallium nitride substrate, and a method of producing a single crystal gallium nitride substrate.

This application claims the priority of Japanese Patent Applications No.2001-284323 filed on Sep. 19, 2001 and No.2002-230925 filed on Aug. 8, 2002, which are incorporated herein by reference.

Blue light emitting diodes (LEDs) based upon the group 3–5 nitride type semiconductors (InGaN, GaN) have been manufactured, sold and used on a large scale. Almost all the practical nitride type LEDs are made upon insulating sapphire ($\alpha$-$Al_2O_3$) substrates. Sapphire belongs to trigonal symmetry group (a=b=c, $\alpha$, $\beta$, $\gamma$<120,$\neq$90). GaN films and InGaN films are heteroepitaxially grown on a sapphire three rotationally symmetric plane for producing LEDs. On-SiC GaN type LEDs having a silicon carbide SiC substrate have been proposed and used on a small scale. On-sapphire LEDs made upon sapphire substrates have very high dislocation density of $10^9$ to $10^{10}$ cm$^{-2}$. Despite great many dislocations, on-sapphire LEDs do not degenerate and enjoy a long lifetime.

Since low-cost techniques of manufacturing sapphire have been established, sapphire substrates are easily produced and are sales on the market at an inexpensive price. Sapphire is chemically stable, physically sturdy and rigid. Sapphire crystal plates have been most suitable for substrates of blue light emitting device chips. Sapphire will be favorably used as a substrate for making blue light LEDs and LDs in future.

Sapphire has, however, some drawbacks as a substrate. Sapphire lacks natural cleavage. Sapphire is an insulator. Lack of natural cleavage incurs a problem of chip-division. A device-fabricated sapphire wafer is cut and separated into individual device chips by mechanical dicing. The mechanical dicing lowers the yield and enhances the cost.

Insulating sapphire cannot lead electric current. A sapphire substrate cannot be an n-type substrate which carries an n-electrode at the bottom as a cathode. Then, InGaN-type LEDs are made by piling a thick n-GaN film on the insulating sapphire substrate, epitaxially growing n-GaN, n-InGaAs, p-GaN films, etching away a peripheral part of the epitaxial films from the top p-GaN film to the lowest n-GaN film, forming an n-electrode upon an exposed region of the n-GaN film, and forming a p-electrode on the top p-GaN film. Thus, on-sapphire devices must have a wide double-stepped shape. The intermediate n-GaN requires an extra area of a chip. Twice wirebondings are required for connecting n- and p-electrodes formed on upper layers with two lead pins. Extra etching and extra wirebonding increase steps and time of fabrication. The upper n-electrode curtails an effective area of a light emitting region. The extra area and the extra steps enhance the cost.

The above is drawbacks of sapphire as a substrate of an LED. Additional weak points appear as a substrate of an LD (laser diode). An LD requires a set of resonator mirrors for reflecting light reciprocally and amplifying light power by repetition of stimulation. Sapphire lacks cleavage. Resonator mirrors cannot be fabricated on on-sapphire LDs by cleavage. The resonator mirrors should be formed by mechanical polishing or etching which requires much time. The further weak point of the on-sapphire LDs is extremely high dislocation density. GaN, InGaN or AlGaN films grown on sapphire substrates have many dislocations of more than $10^9$ cm$^{-2}$. Despite high density of dislocations, InGaN LEDs emanate blue, green light with high efficiency and a long lifetime. But in the case of InGaN-laser diodes (LDs), excess high density of current flowing at a narrow area will degenerate LDs. Sapphire substrates have been the most prevalent substrates for InGaN LEDs till now. Sapphire, however, will not necessarily the most suitable substrates for InGaN-LDs in future.

2. Description of Related Art

The most suitable substrate for nitride type (InGaN) LDs and LEDs should be a GaN single crystal substrate which allows InGaN, GaN, AlGaN films to grow homoepitaxially. But, immaturity of crystal growth technology forbids device makers from obtaining wide, high quality GaN single crystal wafers till now. If high quality, wide GaN single crystal wafers can be manufactured, GaN single crystal wafers will be the optimum substrates for the nitride type LDs. GaN has advantages over sapphire. First of all, GaN has natural cleavage. Cleavability facilitates wafer-to-chip separation and enhances yield of the process. Resonator mirrors can be formed by the natural cleavage. An n-type GaN substrate has electric conductivity. The n-GaN substrate allows an LD or an LED to have an n-electrode at the bottom of a chip. The bottom n-electrode simplifies the device structure and widens the area of a light emanating region. There is no lattice misfit between the substrate and epi-films, which reduces the possibility of incurring inner stress and distortion. The lattice fitting will ensure a long lifetime for nitride type LDs.

However, it is impossible to make a melt of gallium nitride (GaN), since heating does not convert GaN polycrystals into a melt but sublimes GaN polycrystals into vapor. Thus, Czochralski method and Bridgman method which a melt polycrystal material into a melt, cool a part of the melt and make a large single crystal bulk solid at a thermal equilibrium, are unavailable for making a GaN single crystal. Somebody says that it may be possible to make a single crystal GaN bulk by heating under ultrahigh-pressure which forbids GaN from subliming. But, the allegation has not been confirmed. Even the ultrahighpressure would make a GaN melt, very small GaN crystals would be made by the melt of GaN. Such tiny crystal is no use for making a large diameter wafer of GaN.

A new method of making a thick GaN film on a foreign material substrate (e.g., sapphire) by vapor phase epitaxial growth method was proposed. It is an extension of a film growth method. However, a sapphire substrate which is chemically stable and physically rigid cannot be eliminated after the GaN film has been grown on the sapphire substrate. Thus, sapphire is not pertinent for the substrate for growing GaN films for the purpose of obtaining a freestanding GaN crystal. Recently trials have been done for eliminating sapphire substrates from grown GaN films by a laser. However, the separation of the sapphire substrates from the GaN films is difficult even by high power lasers.

Instead of the sapphire substrate, another candidate which can be eliminated from grown GaN films would be a GaAs substrate. A (111) plane of GaAs has three-fold rotation symmetry. A C-plane GaN film would be grown in vapor phase along c-axis on the (111) GaAs substrate. However, it is found that thick GaN is not grown upon a GaAs substrate. Perhaps differences of lattice constants and thermal expansions between GaAs and GaN cause the difficulty of growing thick GaN on the GaAs substrate. The lattice misfit and the thermal distortion induce large inner stress which forbids a GaN film from growing to a thick crystal. A breakthrough was required for making a thick GaN crystal in vapor phase.

The inventors of the present invention contrived a GaAs-based epitaxial lateral overgrowth method (ELO) for making low-dislocation GaN crystals by preparing a GaAs substrate, making an ELO mask having many small regularly-populated windows on the GaAs substrate, and growing GaN films by a vapor phase growing method on the ELO-masked GaAs substrate. The inventors had filed a series of patent applications based on the GaAs-based ELO methods for making GaN crystal bulks.

① Japanese Patent Application No.9-298300
② Japanese Patent Application No.10-9008
③ Japanese Patent Application No.10-102546
(①, ② and ③ have been combined into a PCT application of WO 99/23693.)
④ Japanese Patent Application No.10-171276
⑤ Japanese Patent Application No.10-183446

An ELO mask is made by preparing a three-fold rotation symmetric GaAs (111) substrate, piling a thin SiN film (e.g., 100 nm thickness) on the GaAs substrate, and forming many small regularly-distributed striped or dotted windows on the SiN film by etching. The round, rectangle or square dotted windows should be arranged at corner points of repeated equilateral triangles forming a six-fold symmetric pattern. The distribution of the windows have hexagonal (six-fold) symmetry. A window has six nearest neighboring windows at sixty degree rotating points on an imaginary circle around the window.

The orientation of the ELO mask is predetermined by equalizing the sides of the basic equilateral triangles parallel to a GaAs[−110] direction or a GaAs[11-2] direction. The SiN mask has a negative function of suppressing GaN growth. The GaAs substrate has a positive function of facilitating GaN growth. At first a thin GaN buffer layer (e.g., 80 nm) is grown on the ELO-masked substrate at a low temperature (500 to 600° C.). At an early stage, GaN nuclei occur only on the exposed substrate in the windows but no GaN nucleus appears on the SiN mask. In this case, the thin buffer layer is formed only on the exposed GaAs substrate parts within the windows. The buffer layer is an assembly of GaN films independently growing from separated GaN nuclei on the GaAs texture.

Then, an epitaxial GaN film is grown in vapor phase at a high temperature. GaN grows further on the buffer layers. Soon the surface of the GaN layer coincides with the mask surface. Then, isolated GaN films enlarge upward within the windows, forming facets following the sides of the windows. Isolated independent facet cones are completed on every windows. Then, conical GaN films change the growing direction from the upward direction to horizontal directions. All the windows generate horizontally preceding GaN film edges in radial directions. Dislocations turn into horizontal directions and accompany the GaN film edges. Since the GaN cones begin to dilate in horizontal directions, dislocation turning points align in slanting planes which coincide with the conical surface of the GaN cones at the time of turning.

Horizontally growing GaN films soon meet with other films growing horizontally from the neighboring windows. There are six identical windows at three points from which GaN films creep on the mask outward at a similar speed. Two opposite GaN films meet on a vertical bisector of a line connecting the windows. Three GaN films meet at a center of an equilateral triangle constructing by the starting windows. The shape of the films creeping from a window is hexagonal at the collision. Since dislocations extend horizontally in parallel with the growing direction, dislocations of antiparallel directions collide with each other. A part of the dislocations is annihilated at the straight collision. Other dislocations again change the direction of extension from horizontal directions to the vertical direction.

After two neighboring GaN films meet on the bisector, the growing direction changes. The GaN films grow in the vertical direction along an c-axis. It is a C-plane growth which maintains the C-plane as a unique, smooth, flat surface. The C-plane growth is a well known-method of GaN growth. A long-term vapor phase growth makes a thick GaN/mask/GaAs samples of several hundreds of thickness. Then, the mask and the GaAs substrate are eliminated by, for example, aqua regia.

The ELO method has an advantage of reducing dislocations by the twice changes of the extending direction of the dislocations. The ELO method enabled the inventors to make a thick (more than about 100 $\mu$m) GaN single crystal. The GaN freestanding crystal without a foreign material undersubstrate was produced by the inventors of the present invention for the first time in the world.

However, when the GaN substrate is of low quality, no good devices can be produced on the GaN substrate. Mass production of GaN devices requires good GaN substrates of everywhere low dislocation density.

The epitaxial lateral overgrowth method which makes use of a mask having many windows can produce a GaN crystal of $1{\sim}2{\times}10^7$ cm$^{-2}$ dislocation density. Reduction of dislocations is insufficient. ELO-made GaN crystals are unsatisfactory as a GaN substrate upon which InGaN type LDs are fabricated. InGaN-LDs require better GaN crystals of far smaller dislocation density.

The inventors of the present invention contrived a new method of reducing dislocations during the growth for making a low dislocation density GaN single crystal of high quality.

⑥ Japanese Patent Laying Open No.2001-102307 (Japanese Patent Application No.11-273882)

Facet growth was proposed in the document ⑥ by the same inventors as the present invention. All the known GaN growth has been C-plane growth which maintains a smooth, flat C-plane as a surface of c-axis growing GaN. ⑥ denied the conventional C-plane growth and advocated facet growth which makes facets and pits composed of the facets on a growing GaN surface and maintains the facets and pits without burying pits. A GaN facet grows in a direction normal to the facet. Although an average direction of growth is a c-axis direction, microscopic growing directions are non-c-axis directions.

FIG. 1 to FIG. 3 show our previous facet growth. In FIGS. 1(a) and (b), a GaN crystal 2 is growing in a c-axis direction, having a C-plane top surface 7. Crystallographical planes inclining to the C-plane are called facets 6. The facet growth forms facets and maintains the facets without burying facets. In the example of FIG. 1, six facets 6 appear and form a polygonal reverse cone pit 4 on the C-plane surface. The pits built by the facets are hexagonal cones or dodecagonal cones. Hexagonal pits are formed by six-fold rotation symmetric facets of either {11-2m} or {1-10m} (m: integer). Dodecagonal pits are composed of {11-2m} and {1-10m}

(m: integer). Although FIGS. 1(a) and (b) show the hexagonal pit, dodecagonal pits appear prevalently.

To form facet pits, to maintain pits and not to bury pits are the gist of the facet growth. A facet 6 displaces at a direction normal to the facet. A dislocation extends along a growing direction. A dislocation extending along a c-axis and attaining the facet turns an extending direction in a horizontal direction parallel to the facet and reaches a crossing line 8. The crossing lines 8 include many dislocations. As the top surface moves upward, loci of the crossing lines 8 make crossing planes 6 which meet with each other at 60 degrees. Planar defect assemblies 10 are formed on the crossing planes. The planar defect assemblies are a stable state.

Some dislocations attaining to the crossing line turn an extending direction again inward, move inward along the rising slanting crossing line 8 and fall into a manifold point D at a pit bottom. The dislocation substantially runs inward in the horizontal direction. A linear defect assembly 11 is formed along the manifold point D at the bottom of the pit. The linear defect assembly 11 is less stable than the planar defect assemblies 10.

The facets and the pits create the planar defect assemblies and linear defect assemblies by depriving other parts of dislocations. Losing dislocations, other parts are improved to low dislocation density crystals. When the GaN grows to a predetermined thickness, a GaN/GaAs sample is taken out of the furnace. The GaAs substrate and the ELO mask are removed. A freestanding GaN film is obtained. The GaN film can be finished to a smooth substrate by polishing. The GaN film is transparent like a glass substrate. The dislocations cannot be seen by human eyesight. The dislocations are detected by etching the GaN sample by a suitable etchant and observing the etched surface by a microscope. Differences of crystal structures are discernible by cathode luminescence (CL) microscope observation.

The dislocation density of the low dislocation density regions is examined by microscope. The dislocation density there turns out to be as low as $10^6$ cm$^{-2}$. The former ELO obtained a GaN crystal of dislocation density of 1 to $2 \times 10^7$ cm$^{-2}$. In comparison with the ELO, the facet growth method succeeded in reducing dislocation density down by one order of magnitude. The facet growth was an effective sophisticated method for reducing dislocations.

The inventors noticed that the facet growth method has still problems for producing GaN wafers for making LD chips.

The facet growth can gather dislocations into a narrow volume by making facet pits, growing a GaN crystal without burying facets, gathering dislocations into the bottoms of pits. Dislocations do not necessarily converge to a single point but diffuse outward. When a plurality of 100 $\mu$m$\phi$ pits are formed, dislocations converge to a narrow spot at a bottom of a pit somewhere. But at other regions, dislocations diffuse till about 30 $\mu$m$\phi$ wide range. The 30 $\mu$m$\phi$ diffusion makes a hazy dislocation nebula.

This means that once converged dislocations disperse again to a hazy nebula of dislocation. It was confirmed that lines of the hazy nebulae diffusing from the pit bottom assembly include many dislocations.

If the diameters of pits are increased for enlarging the low dislocation density regions, lines included in the hazy dislocation nebulae increase. Enlargement of pits increases the number of dislocations converged into the pit bottom and the area of the dislocations escaping the bottom and forming hazy nebulae.

Why do once converged dislocations leak and diffuse from the core at the pit bottom? What does release the once core-assembled dislocations from the pit bottom? The inventors of the present invention found that the motivation of release is repulsive forces acting among dislocations. Mutual repulsion is the ground of release of dislocations.

Dislocations extend in the direction of growth, as long as the crystal growth continues. Dislocations sometimes aggregate or segregate. Dislocations do not perish easily by themselves. Dislocations are disorder of lattice structures. When one dislocation comes close to another dislocation, lattice disorder is compressed. Energy of lattices is increased by the approach. The increase of the lattice energy brings about mutual repulsion among dislocations. The repulsion and the lattice dynamics do not appear till the dislocation density is raised at a high value multiplied by $10^3$ times or $10^4$ times of natural density.

When a thousand dislocations or ten thousand dislocations are converged within a narrow volume, repulsion acting between dislocations increases. Although dislocations are once gathered within a narrow manifold point D at a pit bottom, strong repulsion releases the highly packed assembly of dislocations from the manifold D. Dislocations escaping from the pit bottom make hazy dispersion of dislocation. Occurrence of the nebular hazy dislocation dispersion was a drawback of the previous facet growth.

Hazy dislocation nebulae have very high dislocation density of $10^7$ cm$^{-2}$ which is ten times as much as an average dislocation density ($10^6$ cm$^{-2}$). Such high dislocation density $10^7$ cm$^{-2}$ of the hazy dislocation nebulae is insufficient for making use of the GaN crystal as an LD substrate for making LD devices. An LD substrate requires low dislocation density less than $10^6$ cm$^{-2}$. The occurrence of the hazy dislocation nebulae is the first problem of the previous facet growth.

The second problem is planar defect assemblies which are born by gathering dislocations to the pit bottoms and inclining to each other at 60 degrees. The planar defect assemblies dangle from the crossing lines 8. 60 degrees spacing planar defect assemblies 10 have six-fold rotation symmetry. The planar defect assemblies include high density dislocations. In addition to the hazy dislocation nebulae, the radially extending planar defects assemblies are a serious problem for an LD substrate, since the planar defects would induce degeneration and would restrict lifetime of LDs. An LD substrate requires a reduction of the planar defect assemblies.

The last problem is more fundamental. Occurrence and distribution of pits are stochastic, accidental and unprogrammable. The distribution of pits are entirely at random. The previous facet growth method which reduces dislocations by growing facet pits without burying, has a weak point of undeterminable positions of pits. It is impossible to previously determine or know the spots at which facet pits happen. An accident makes a pit at an undetermined spot. The positions of pits are stochastic variables. The formation of pits are uncontrollable. Accidental formation of pits, stochastic pit positions, stochastic dislocation bundles and random concentration of dislocations are essential feature of the previous facet growth method. Uncontrollability of pit positions is a serious problem.

When many GaN-LD chips were made on the GaN having random pit distribution, it would be probable that an active stripe of an LD overlaps on dislocation bundles. The dislocation bundles in the active layer would accelerate degradation of the laser diodes (LDs) and would shorten the lifetime.

LD chips fabricated on a GaN substrate wafer have various sizes. For example, an LD chip of a 400 $\mu$m width and a 600 µm length has an emission stripe of 2 to 3 µm width by 600 µm length. A rate of the (active) emission stripe to the full width of the chip is 3 µm/400 µm. The probability of hazy dislocation nebulae or dislocation bundles overlapping on the stripe is not low. The stripe is as long as a chip length. Hazy dislocation nebulae disperse widely. Planar defects have large sizes. Overlapping of dislocation bundles or hazy dislocation nebulae on an active stripe occurs frequently.

LD producing GaN substrates should enable device makers to avoid active stripes overlapping on dislocation bundles or hazy dislocation nebulae. Such a method which cannot determine the positions at which dislocation bundles happen is inconvenient. For avoiding stripes overlapping on the dislocation bundles, a new method which allows us to control the positions of dislocation bundles positively is ardently desired. The occurrence of dislocation bundles is unavoidable. What is required is a method which can control occurrence and positions of dislocation bundles.

Three matters aforementioned are the problems to be solved by the present invention. In short, the objects of the present invention are converged into three matters;

(1) Reduction of hazy diffusion of dislocations from the defect assemblies of the centers of facet pits.

(2) Annihilation of planar defects occurring at the centers of the facet pits.

(3) Controlling of positions of defect assemblies at the centers of facet pits.

Technical terms are clarified before describing the subject matters of the present invention. Vapor phase growing methods for growing gallium nitride applicable for the present invention include an HVPE method, an MOCVD method, an MOC method and a sublime method. These methods are all inherently used for making very thin films of GaN of about 0.1 µm to 1 µm. The present invention uses these methods for making a very thick bulk crystal of GaN of an order of a 1000 µm thickness. Such a thick crystal is called a GaN "substrate" for discriminating it from a thin film of an order of 1 µm. For avoiding confusion, a starting substrate of a foreign material for growth is often called an "undersubstrate" till now.

1. HVPE (Hydride Vapor Phase Epitaxy) Method

Gallium source is metal gallium (Ga). Nitrogen source is ammonia ($NH_3$). An HVPE apparatus has a hot-wall furnace, heaters enclosing the furnace, a Ga-boat positioned at a higher spot in the furnace, a susceptor installed at a lower level in the furnace, a vacuum pump and material gas ($H_2$, $NH_3$, HCl) supplying tubes. An undersubstrate is put on the susceptor. Metal gallium is supplied into the Ga-boat. The heater heats the Ga-metal into a Ga-melt and the undersubstrate on the susceptor. A mixture gas of hydrogen ($H_2$) and hydrochloric acid (HCl) is supplied to the heated Ga-boat for synthesizing gallium chloride (GaCl). Gallium chloride (GaCl) is conveyed downward to the undersubstrate on the heated susceptor. Another mixture of hydrogen ($H_2$) and ammonia ($NH_3$) is supplied to the heated undersubstrate for making gallium nitride (GaN) by the reaction of $GaCl + NH_3 \rightarrow GaN + HCl + H_2$. Synthesized GaN is piled upon the undersubstrate for producing a GaN film. The HVPE has an advantage of being immune from carbon contamination, since the Ga-source is metallic gallium (Ga) which includes no carbon and makes GaCl as an intermediate compound.

2. MOCVD (Metallorganic Chemical Vapor Deposition) Method

This is the most popular method for making GaN films on a foreign material (sapphire) substrate at present. Materials of gallium and dopants are organic metals including carbon. Thus, this method is called "metallorganic". The MOCVD method uses a cold-wall furnace having a susceptor for holding an undersubstrate and a heater for heating the susceptor.

3. MOC (Metallorganic Chloride) Method

The MOC method employs a Ga-including metallorganic compound (e.g., trimethyl gallium) as a Ga material like the MOCVD. The nitrogen material is ammonia ($NH_3$) gas. Unlike the MOCVD, TMG does not react with ammonia ($NH_3$). In a hot wall type furnace, TMG reacts with HCl gas for synthesizing GaCl. Vapor GaCl falls toward a heated substrate on a susceptor. The substrate is supplied with ammonia gas. GaCl reacts with ammonia for making GaN. GaN piles upon the substrate and makes a GaN film. The use of the metallorganic compound (TMG) may induce contamination by carbon. However, this method can absorb material gasses higher efficiently than the MOCVD method.

4. Sublimation Method

This method uses no gas as a material. The material of this method is polycrystalline GaN. The solid GaN and a substrate are allocated respectively on places of different temperatures. The solid GaN on higher temperature is heated to vapor and moved to the substrate on lower temperature, so that a GaN film is piled on the substrate.

Orientations of crystals are clarified. Such an elementary matter should belong to a common sense to the skilled in art. But it is not true. Designations of crystal orientations are not well known even to the skilled. There are confusion, misunderstanding and misuse of crystallographical symbols in many academic reports or patent descriptions. The inventors of the present invention are afraid that readers cannot understand space geometric symbols required for describing the present invention. The definition of orientations is now clarified. Unlike sapphire (trigonal symmetry), gallium nitride (GaN) belongs to hexagonal symmetry ($a=b=d\neq c$, $\alpha=\beta=\delta=120°$, $\gamma=90°$). Three axes, a-axis, b-axis and d-axis, extend in three directions with 120 degrees rotation on the xy-plane. The c-axis is orthogonal to the a-, b-, d-axes. Three index representation and four index representation type have been used for designating hexagonal symmetry structure. Here, the four index representation is employed for describing the present invention. Rules of the four-index representation are preliminarily described.

Rules have been determined for the representation of crystallographic planes and directions. There are collective representation and individual representation both for a plane and a direction. Collective representation of planes is wavy-bracketed four Miller indices {hkmn}. Here, h, k, m and n are integers called Miller indices (or plane indices) which are used in common for representing both planes and directions. Individual representation of directions is round-bracketed four Miller indices (hkmn). Collective representation of directions is key-bracketed four Miller indices <hkmn>. Individual representation of planes is rectangular-bracketed four Miller indices [hkmn]. An individual direction [hkmn] is perpendicular to an individual plane (hkmn) having the same Miller indices.

Allowable symmetry operations are determined by the symmetry group to which the crystal belongs. Even hexagonal symmetry includes several different symmetry groups. If a plane or a direction is converted to another plane or direction by the allowable symmetry operations, the two planes or directions are represented by a common collective representation. GaN has three-fold rotation symmetry which allows cyclic commutations of three indices $khm \rightarrow hmk \rightarrow mkh \rightarrow khm$. However, the c-axis index "n" is a unique one which cannot be exchange with three other indices k, h and m. Collective plane representation {hkmn} includes all the individual planes to which an individual plane (hkmn) can attain by the allowable symmetry operations. As mentioned before, hexagonal symmetry still has variations with regard to the allowable symmetry operations.

The above fate is restricted to GaN which has three-fold rotation symmetry. Rigorously speaking, (hkmn) is not identical to (khmn) in GaN which lacks six-fold rotation symmetry and inversion symmetry. But it is promised here that a collective representation {hkmn} includes six different individual representations (hkmn), (kmhn), (mhkn), (hmkn), (khmn) and (mkhn). Collective representations {hkmn}, {kmhn}, {mhkn}, {hmkn}, {khmn} and {mkhn} are all an identical representation. Miller indices are negative or positive integers. Negativity should be designated by an upperline by crystallography. However, patent description forbids upperlines. Then, negativity is denoted here by affixing "−" sign before an integer. The above rules are also applicable to the representations of directions <hkmn> or [hkmn].

Hexagonal GaN has three identical axes which can be converted by three-fold rotations. Two of the three are called a-axis and b-axis. Third axis has no name. The third axis is here named d-axis for alleviating inconvenience. Namely, a-axis, b-axis and d-axis are defined with a 120 degree angular spacing on a horizontal plane. The three are equivalent axes. A unique axis perpendicular to the three axes is a c-axis. Crystal planes (hkmn) are a set of an indefinitely large number of parallel planes with a definite spacing which are imagined in an indefinitely large crystal. Miller indices are defined by inverse numbers of the lengths of segments at which a first plane crosses the four axes. When the first plane crosses a-axis at a/n, b-axis at b/k, d-axis at d/m and c-axis at c/n, the set of planes is designated by Miller indices (hkmn).

A plane with smaller plane indices is a more fundamental plane having smaller numbers of equivalent planes. An individual orientation [hkmn] is defined as a direction which is perpendicular to an individual (hkmn) plane. Three forward indices k, h and m are not independent. The freedom allocated to the three indices is two. Two-dimensional directions and planes on xy-plane can be denoted by two independent parameters. Thus, an alternative representation indicates two dimensional orientations with two indices. However, this description employs the four index representation hkmn which uses three indices k, h and m for designating two dimension orientations and planes for the sake of simplicity of symmetry. In the four index representation, three forward indices always satisfy a sum rule h+k+m=0.

GaN has three primary planes. One is C-plane which is represented by (0001). C-plane is a plane which is vertical to c-axis. Corresponding plane and axis are perpendicular to each other. Don't confuse planes with axes. For clearly discerning planes from axes, planes are denoted by capital letters and axes are denoted by small letters. A GaN crystal has three-fold symmetry around c-axis. Namely, it is invariant for a 120 degree rotation by c-axis. When a GaN film is grown heteroepitaxially upon a substrate of a foreign material, e.g., GaAs or sapphire, only a c-axis growth occurs. GaN lacks inversion symmetry. (0001) plane is different from (000-1) plane. C-plane satisfies the sum rule h+k+m=0+0+0=0.

Another typical plane is M-plane which is a cleavage plane. M-plane crosses one axis of three symmetric axes at a positive unit edge, crosses another axis at a negative unit edge and is parallel with the last symmetric axis and c-axis. M-plane is indicated by collective representations {1-100}, {01-10}, {-1010}, {-1100}, {0-110} and {10-10} which are all equivalent and denote the same set of six planes. M-plane is otherwise indicated by individual representations (1-100), (01-10), (-1010), (-1100), (0-110) and (10-10) which denote different individual planes belonging to M-plane. Each of the collective representations { . . . } indicates an equivalent set of six planes. But the individual representations { . . . } designate different planes. M-plane satisfies the sum rule h+k+m=1+(−1)+0=0. Individual planes cross each other at 60 degrees. M-plane is a convenient nickname of {1-100}, {01-10}, {-1010}, {-1100}, {0-110} or {10-10} planes. M-plane is important planes.

Third typical plane is A-plane. A-plane crosses two axis of three symmetric axes at positive unit edges, crosses the last axis at a negative half of unit, and is parallel with c-axis. A-plane is indicated by collective representations {2-1-10}, {-12-10}, {-1-120}, {-2110}, {1-210} and {11-20} which are all equivalent and denote the same set of six planes. A-plane is otherwise indicated by individual representations (2-1-10), (-12-10), (-1-120), (-2110), (1-210) and (11-20) which denote different individual planes belonging to M-plane. Each of the collective representations indicates an equivalent set of six planes. But the individual representations designate different planes. Individual planes cross each other at 60 degrees. A-plane satisfies the sum rule h+k+m= 2+(−1)+(−1)=0.

GaN crystal lacks six-fold rotation symmetry. All the six individual planes are different planes in the category of A-plane. The individual planes meet each other at 60 degrees. A-plane is also a nickname. <2-1-10> direction is perpendicular to (2-1-10), one of A-planes. <2-1-10> direction is parallel with one of M-planes. Although (2-1-10) is called an A-plane. <2-1-10> is not called "a-direction". Similarly, <1-100> direction is perpendicular to (1-100), one of M-planes and parallel to one of A-planes. C-plane, A-plane and M-plane are primary, typical, significant planes in GaN crystals. One of A-planes, one of M-planes and C-plane are orthogonal to each other. Thus, one of A-planes, one of M-planes and C-plane can form a three dimensional orthogonal coordinate system.

A "facet" is another important concept for describing the technical idea of the present invention. A facet is a crystallographical plane (hkmn) which can be also represented by low Miller indices h, k, m and n. But, facets are not the aforementioned typical planes A, M and C. Facets have different indices from three primary planes. Some facets have indices resembling the primary planes A, M and C. {2-1-11} and {2-1-12} are facets deriving from A-plane. {1-101} and {1-102} are facets originating from M-plane. Equivalent six facets built a hexagonal conical pit. A hexagonal pit consists of A-plane-derivative {2-1-11} facets or {2-1-12} facets. Another hexagonal pit constructed by M-plane-derivative {1-101} facets and {1-102} facets. Sometimes dodecagonal conical pits are formed. An assembly of the six A-plane-derivative {2-1-11} or {2-1-12} facets and six M-plane-derivative {1-101} or {1-102} facets form dodecagonal cone pits. Further, sometimes double stepped dodecagonal pits appear. An upper dodecagonal reverse-cone comprises lower n facets {2-1-11} and {1-101} which have steeper inclinations. A lower dodecagonal reverse-cone comprises higher n facets {2-1-12} and {1-102} which have smaller inclinations.

The fourth index "n" takes 1 or 2 in the above facets. In many cases, facets having low indices appear on GaN surfaces in practice. High indices facets do not appear so frequently. For example, if A-planes {2-1-10} are inclined to c-axis by a small angle, {2-1-11} facets are obtained. If {2-1-11} facets are further inclined to c-axis by an additional small angle, {2-1-12} facets are obtained. They are A-plane-derivatives. A bigger fourth index n means a bigger pitch angle to c-axis and a smaller inclination to the horizontal plane. The fourth index "n" takes n=1 or n=2 for many facets. Higher than 3 of index n is exceptional for practical facets.

Concepts of double stepped facets or double stepped pits are clarified. Steeper facets or steeper pits are upper facets or pits having smaller n. A steeper facet pit appears on upper part of a double stepped pit. Milder facets or milder pits are lower facets or pits having larger n. A milder facet pit appears on lower part of a double stepped pit.

Most of the facets appearing at pits are A-derivative {11-22} and M-derivative {1-101} facets. A length of a-axis is denoted by "a". Another length of c-axis is denoted by "c". An inclination angle of {1-101} facet to c-axis is $\tan^{-1}(3^{1/2}a/2c)$. Another inclination angle of {11-22} facet to c-axis is $\tan^{-1}(a/c)$.

Shallower, milder facets are, for example, {11-23}, {1-102}, {11-24}, {1-103} which have a large index n. An inclination angle of {1-10n} (n≧2) facet to c-axis is, in general, $\tan^1(3^{1/2}a/2cn)$. A smaller inclination angle is given by a bigger n. Another inclination angle of {11-2n} (n≧3) facet to c-axis is, in general, $\tan^1(2a/cn)$. A smaller inclination angle is given by a bigger n. Thus, a facet of higher n is a milder, shallower facet.

GaN crystal is a wurtzite (ZnS) structure belonging to the hexagonal symmetry group. An equilateral hexagonal column includes a hexagonal bottom plane having six Ga atoms at six corners and a Ga atom at the center, a ⅜ unit height intermediate plane having six N atoms at six corners and a N atom at the center, a ½ unit height intermediate plane having three Ga atoms at centers of three sub-triangles, a ⅞ unit height intermediate plane having three N atoms at centers of three sub-triangles which are just above the Ga atoms on the ½ plane, a top plane having six Ga atoms at six corners and a Ga atom at the center. A hexagonal symmetric column (6Ga+6N) has three unit cells which include two Ga atom and two N atoms. A GaN crystal has three-fold rotation symmetry. But, the GaN crystal lacks inversion symmetry and six-fold rotation symmetry.

Suitable undersubstrates for growing the GaN crystal are sapphire ($\alpha$-$Al_2O_3$), silicon (Si), or gallium arsenide (GaAs) etc. Sapphire has not hexagonal symmetry but trigonal symmetry. Symmetry is poor. Sapphire lacks three-fold rotation symmetry and inversion symmetry. Poor symmetry deprives sapphire of cleavage.

Silicon (Si) does not have hexagonal symmetry but has cubic symmetry which requires three Miller indices (khm). Si takes the diamond structure. The three Miller indices have no sum rule. Thus, k+h+m≠0 in general. A three-fold rotation symmetric axis is a <111> direction of an orthogonal line. A three-fold rotation symmetric plane is described as (111). Ordinary Si devices are fabricated on a (001) Si wafer for making use of the natural cleavage. Since (001) plane lacks three-fold rotation symmetry, a (111) Si can be a candidate as a substrate for growing hexagonal GaN.

A Gallium arsenide (GaAs) crystal has not hexagonal symmetry but cubic symmetry. GaAs takes zinc blende (ZnS) structure. Miller indices are three. A three-fold rotation symmetric axis is a <111> direction of an orthogonal line. A three-fold rotation symmetric plane is described as a (111) plane. Ordinary GaAs devices are made upon a (001) GaAs wafer for making use of natural cleavage {1-10} perpendicular to surfaces. GaN growth requires three-fold rotation symmetry. Thus, a three-fold symmetric GaAs (111) wafer should be employed. GaAs lacks inversion symmetry. Thus, (111) planes and (−1-1-1) planes are not equivalent. One of {111} planes is Ga atoms overall aligning surface. The other {111} plane is As atoms overall aligning surface. The former is designated by a (111) Ga plane. The latter is designated by a (111)As plane.

Denying the prevalent C-plane growth, the former GaN facet growing method contrived by the present inventors was an excellent method for growing a low dislocation GaN film by maintaining the facet growth without burying facets, gathering dislocations to pit bottoms and reducing dislocations in extra portions except the pit bottoms. As described till now in detail, the previous GaN facet growth method has still three problems which should be solved.

(1) To reduce hazy dispersion of dislocations diffusing from defect assemblies at pit bottoms (FIG. 3(2)), (2) To annihilate planar defect assemblies following facet boundaries (FIG. 1(b)), (3) To control positions of defect assemblies formed below facet pit centers.

All the three are difficult problems. Difficulties are again clarified here. The serious problem of the previous facet growth of the inventors which maintains facets and pits without burying the facets was an unstable state of defect assemblies at pit bottoms. FIGS. 3(1) and (2) show the states of defect assemblies of our previous facet growth method. Accidentally a pit 14 with facets 16 occurs somewhere on a growing GaN film surface. The positions of the pits cannot be determined previously. Occurrence of pits and points of occurrence of pits fully depended on contingency. Occurrence of pits and positions of pits were uncontrollable. In accordance with the GaN growth in an upward direction, facets 16 rise and dislocations move in the horizontal direction to the center of the pit 14. A dislocation bundle 15 is formed at the bottom of the pit 14. As shown in FIG. 3(2), the dislocation bundle is neither encapsulated nor arrested by anything. Ephemerally assembling, individual dislocations in the dislocation bundle have a strong tendency of diffusing and dispersing outward again by mutually acting repulsive force.

The facet growth gathers plenty of dislocations to the center bottoms of facet pits by making use of the anisotropy of the movements of dislocation on the facets. One problem is the dislocation-assembled state at the pit bottoms. The anisotropic sweeping function of the facet pits can gather dislocations to the pit bottoms. But, the fact pits have no function of perishing dislocations. Besides, the pits are open. The pit-dangling dislocation assemblies are not closed. Dislocations survive. Total number of dislocations is not reduced.

Excess high concentration of dislocations gives the dislocation assemblies the tendency of releasing and relaxing dislocations outward. The tendency incurs difficult problems.

When two dislocations having plus and minus Burgers vectors collide, the two dislocations will perish by cancellation. However, the dislocations occurring in the same facet should have Burgers vectors of a common sign with high probability. Collision of two dislocations having common sign Verger's vectors has no power of annihilating two dislocations. Dislocations of common Burgers vectors survive the collision. Without extinction, dislocations are converged to the open pit bottoms for making planar defect assemblies and linear defect assemblies as shown in FIG. 1(b), FIG. 2 and FIG. 3.

Assembling of dislocations of common sign Burgers vectors into planar defect assemblies and linear defect assemblies is not permanent but transient. Dislocations diffuse from the assemblies to hazy dispersion. Hazy dispersion raises the dislocation density of the regions around the defect assemblies again. What induces such a hazy distribution of dislocations? Why do dislocations diffuse as haze? The inventors of the present invention think that the motivation of the dislocation diffusion would be the repulsive forces acting between two dislocations having same sign Burgers vectors.

Dislocations are displacements of lattices. If dislocations having the same sign Burgers vectors are converged at a point, the displacements are enhanced, which raises the lattice dynamic energy. Repulsive forces are caused by the convergence of the same sign Burgers vector dislocations for reducing dynamical energy. Strong repulsion acts the aggregate of dislocations, releases the dislocations from the aggregate and makes a hazy dispersion of dislocations. FIG. 3(2) shows the release of once aggregated dislocations from the central dislocation bundle. It is a regrettable fact for the prior contrivance that once-converged dislocations again diffuse outward by the strong repulsion into hazy dislocation distribution.

Mergers of pits perturb dislocation bundles. Unification of dislocation bundles concentrates dislocations. Enhancement of dislocation density widens the hazy dispersion of dislocations. This is the aforementioned problem (1) of the hazy dislocation dispersion.

When dislocations are swept into the facet pit centers, 60 degree rotating planar defect assemblies are sometimes generated under the pit bottom center. The planar defect assemblies 10 are shown in FIG. 1(b). Hanging from the boundaries, the defects assemble into 60 degree rotating planes. The same sign dislocations cannot fully converge to a central point due to the strong repulsion. Then, the planar defect assemblies 10 are built below the bottom of the pit. The repulsion stabilizes the diffused planar defect assemblies 10.

When a plurality of facet pits merge into a big pit, the number of the dislocations which converge to the pit center is also increased and large planar defect assemblies are produced.

The positions at which the facets appear are accidental and irregular, since the facet pits are born at random by natural phenomenon for reducing free energy. The positions of the pits are uncontrollable. The pit positions are irregular, unpredeterminable and random. The relaxed hazy dislocation bundles is an obstacle of making devices on the GaN substrate which has been made by the previous method. An increase of the area of hazy dislocation bundles lowers the quality of devices and decreases the yield of making devices.

A serious problem of the previous contrivance is that the dislocations once gathered to the centers of the facet pits are not permanently captured but are soon released from the bottoms of the facet pits (relaxing bundles 15 in FIG. 3(2)).

The inventors of the present invention think that if the dislocation aggregate would have a dislocation annihilation/ accumulation mechanism which arrests dislocation everlastingly, the diffusion and the release of dislocations would not occur. The dislocation annihilation/accumulation mechanism would be very useful.

The dislocation annihilation/accumulation mechanism can annihilate and capture many dislocations in a narrow, restricted region. The dislocation annihilation/accumulation mechanism would prevent dislocations from releasing outward or making planar defect assemblies.

What is the dislocation annihilation/accumulation mechanism? What can be utilized as a dislocation annihilation/ accumulation mechanism?

The present invention intentionally produces crystal boundaries and makes the best use of the boundaries for manufacturing low dislocation density GaN single crystals. FIG. 4 shows the action of the facets, pits and grain boundary of reducing dislocations. A growing GaN crystal 22 has a pit 24 consisting of facets 26. The facet pit 24 is not buried but maintained during the GaN growth. Top of the crystal is a C-plane surface 27. The facet pit 24 has a central bottom 29. When the GaN film further grows, facets 26 grow in the direction vertical to the facets 26. Dislocations are swept in the centripetal, horizontal directions to the pit center. The directions of dislocations are parallel to the C-plane 27. The dislocations attracted to the center are affiliated to dislocation assembly 25 at the pit bottoms 29. The dislocation assembly 25 is encapsulated by boundaries (K) 30. The dislocation assembly is called a "closed defect accumulating region (H)", since the region arrests, accumulates and is closed by the boundary (K). The closed defect accumulating regions (H) 25 have a very significant function of attracting, absorbing, annihilating and accumulating dislocations permanently.

Once dislocations are arrested, the dislocations cannot escape from the closed defect accumulating regions (H). Thus, the region (H) is "closed". What closes the region (H) is the grain boundary (K).

The next problem is how to make a grain boundary K encapsulating the closed defect accumulating region (H). The fact that the facet growth which maintains facets without burying facets has the power of gathering the dislocations to the bottoms of the facet pits has been already described. The boundary (K) can be produced by making a crystal different from the surrounding single crystal parts at the bottom centers of the pits. The difference between the central crystal (core) and the surrounding single crystal parts makes an interface boundary. Various differences are allowed for the core crystal enclosed by the boundary, since the surrounding single crystals have a definite predetermined orientation. The central core may be a single crystal of an entirely different orientation from the surroundings, a single crystal of an orientation slightly inclining to the surroundings, a single crystal of an antiparallel c-axis <0001> to the surrounding region orientation, or a polycrystal having not a uniquely-defined orientation. In any case, the boundary K is produced between the core crystal and the surroundings. First, the polycrystalline core is clarified.

In the concrete, a polycrystalline region is formed at the center of a pit. The crystal boundary K is made between the surrounding single crystal regions and the narrow polycrystal region below the pit center. The present invention exploits the boundary K as a dislocation annihilation/ accumulation region. The boundary solely or the boundary and the polycrystalline core cooperatively annihilate and accumulate dislocations. For the purpose of decreasing the dislocations, the present invention positively creates a dislocation-full boundary K for annihilating and accumulating the dislocations. It is a surprising, novel idea.

The formation of a sink (absorber; K) of dislocations enables the present invention to prevent hazy dislocation distribution from dispersing further and planar defects at the pit centers from diffusing outward. The sink absorbs and annihilates dislocations.

A pile of search has taught the inventors that some other regions besides a boundary of a bottom-following polycrystal region can act as a dislocation annihilation/accumulation region. A single crystal region following the pit bottom can prepare a dislocation annihilation/accumulation region, so long as the orientation of the bottom-following single crystal has an orientation different from the surrounding single crystal portions. The difference of the orientations produces a boundary (K) between the bottom-following single crystal region and the surrounding single crystal portions. The boundary (K) can be assigned as a dislocation annihilation/accumulation region. For example, a bottom-following single crystal having a reverse <0001> axis can make an interface boundary (K) as a dislocation annihilation/accumulation region.

Furthermore, even a bottom-following single crystal having the same orientation as the surrounding single crystal portions can be a candidate for preparing a dislocation annihilation/accumulation region, so long as the bottom-following single crystal is enclosed by a planar defect assembly or a small angle boundary. The encapsulating planar defect assembly or the small angle boundary acts as a dislocation annihilation/accumulation region.

If a pit bottom following region is one of the following;
A. polycrystal region,
B. single crystal region having a unique orientation different from that of the surrounding single crystal portions,
C. single crystal region having a common orientation with that of the surrounding single crystal portions but being encapsulated by a small angle boundary,
a boundary (K) is generated between the bottom-following region and the surrounding single crystal portions, and the boundary (K) can be a dislocation annihilation/accumulation region. The a dislocation annihilation/accumulation region is effective for lowering dislocation density. The inner region for producing a boundary contains high density defects. The inner region is enclosed by the boundary. Then, the inner region is a closed part accommodating many dislocations. The inner region is named a "closed defect accumulating region (H)". This is a novel structure.

The closed defect accumulating region (H) means a region which is formed just below a bottom of a facet pit by the facet growth and is composed of a core (S) having a different crystal from the surrounding single crystal portions and a crystal boundary (K) enclosing the core (S). Namely, a closed defect accumulating region (H) consists of a core (S) and a boundary (K). The core (S) is one of polycrystal A, slanting single crystal B and small-angle-boundary-enclosed single crystal C. Symbolically speaking,

H=S+K.

K=A, B or C.

The boundary (K) can annihilate and accumulate dislocations. Dislocation annihilation power is a novel function of the boundary (K). Permanent confinement of dislocations is another important function of the boundary (K). Encapsulation of the core (S) is another function of the boundary (K). A core (S) is formed at a bottom of a facet pit. The core (S) is either a polycrystal or a single crystal. The core (S) is enclosed by the boundary (K). The core (S) sometimes has a function of the dislocation annihilation/accumulation region. A sum of the boundary (K) and the core (S) is a closed defect accumulating region (H). The boundary (K) and some kinds of the core have the function of the dislocation annihilation/accumulation.

The above-cited ⑥ Japanese Patent Laying Open No.2001-102307 was unable to predetermine positions of the pits on a surface. The positions of the closed defect accumulating regions (H) which hang from the bottoms of the pits were undeterminable in the method. ⑥ has still a significance of clarifying the tight relation between the pit bottoms and the closed defect accumulating regions (H). The inventors of the present invention wished to determine the positions of pits. The inventors have hit on an idea of predetermining the positions of the pits. The present invention derives from the idea.

If the positions of the closed defect accumulating regions (H) can be determined by some means, the positions of the pits are also determined indirectly by the same means.

The contrivance of determining the positions of the closed defect accumulating regions (H) will be described later in detail. By short, the positions of the closed defect accumulating regions (H) can be definitely determined by implanting seeds at desired positions. The seeds should have a function of delaying the growth of GaN. The seeds will produce pits which yield the closed defect accumulating regions (H).

If a closed defect accumulating region (H) is made at a predetermined spot, a small cavity is formed at the same spot, since the growing speed at the closed defect accumulating regions (H) is slower than that in the other regions of the C-plane growth. Once the small cavity is formed, an inner conical wall is composed of stable facets of low Miller indices. Crystal growth enlarges the cavity to a pit. The pits survive the whole crystal growth, rising upward. The pits produce the closed defect accumulating regions (H) just at the bottoms. Since the pits and the bottoms rise, the hanging closed defect accumulating regions (H) grow in the vertical direction. Thus, the positions of the closed defect accumulating regions (H) become a controllable factor. Probability of producing the closed defect accumulating regions (H) at arbitrary points is one of the important features of the present invention.

There is another mode of making a closed defect accumulating region (H) beside the aforementioned case. A pit is composed of a set of facets. Sometimes the facets are formed in two steps. FIG. 5(B) shows the two step pit. Upper larger, steeper facets and lower smaller, milder facets coexist in a pit. The milder, shallower facets fix the position of the pit bottom. The shallower facets form upper interface of the following closed defect accumulating region (H).

There are several motives of forming the closed defect accumulating regions (H). When a polycrystal is once generated upon a seed, a polycrystalline closed defect accumulating region (H) is made. The polycrystalline closed defect accumulating region (H) is clearly discriminated from the surrounding single crystal regions. The single/poly interface is the boundary (K).

The closed defect accumulating regions (H) are sometimes single crystals. Single crystalline closed defect accumulating regions (H) have orientations different from the surrounding single crystal regions. Difference of orientations varies further. Why the orientations of the closed defect accumulating regions (H) vary? The facet pits make lower, smaller, milder facets with lager index n. The lower facets which compose a part of the following closed defect accumulating region (H) determine the orientation of the following closed defect accumulating region (H). Then, single crystalline closed defect accumulating regions (H) differ from the surrounding single crystal regions in orientations. The difference of the orientations forces to make the boundary (K). The boundary (K) encloses the core (S). Thus, the inner region within the boundary (K) becomes a "closed" defect accumulating region (H).

The present invention succeeds in solving three above-mentioned problems by producing the closed defect accumulating regions (H) where H=S+K. The hazy dislocation diffusion is completely forbidden, since the dislocations are annihilated/accumulated in the boundaries (K) or both the boundary (K) and cores (S) of the closed defect accumulating regions (H). 60 degree rotation symmetric planar defects at the bottom are extinguished, since the dislocations are annihilated/accumulated in the boundaries (K) or both the boundaries (K) and cores (S). The positions of the closed defect accumulating regions (H) are definitely determined by the seeds.

The present invention solves the problem of uncertainty of the pit positions which would allow LD active stripes to overlap pits by predetermining the pit positions by regular, periodic seed implantation. Programmable pit positions are an advantage of the present invention.

The principles founding the present invention have been described.

SUMMARY OF THE INVENTION

This invention makes the best use of seeds made on a substrate and facet growth following the seeds. The facet growth minimizes dislocation density of regions except closed defect accumulating regions (H) by sweeping many dislocations into the bottoms of facet pits and the closed defect accumulating regions (H) hold many dislocations captive. The seed-defined closed defect accumulating regions (H) and the facet growth enable us to accomplish all the aforementioned three purposes, (1) a decrease of foggy dislocations leaking from the centers of the facet pits,
(2) an elimination of planar defect assemblies at the centers of the facet pits, and
(3) a control of the positions of the defect assemblies at the centers of the facet pits.

The present invention succeeds in producing a low-dislocation GaN single crystal substrate by controlling the positions of the closed defect accumulating regions (H) which gather the dislocations from other regions by implanting seeds on a starting substrate. The GaN substrate crystal made by the present invention is a low-dislocation single crystal in Z and Y except the definite small regions (closed defect accumulating regions (H)). The present invention can supply low-defect density GaN substrates best for making InGaN blue-violet laser diodes (LDs).

BRIEF DESCRIPTION OF THE DRAWINGS

FIG. 1(a) is a partial perspective view of a facet pit occurring on a GaN surface in the facet growth proposed by previous Japanese Patent Laying Open No.2001-102307 for showing that facets growing inward sweep dislocations to crossing lines, the rising crossing lines convey inward the dislocations and dislocations are converged at the bottom of the pit.

FIG. 1(b) is a partial perspective view of a facet pit on the GaN surface after continual facet growth proposed by previous Japanese Patent Laying Open No.2001-102307 for showing that strong repulsion among the dislocations releases dislocations and forms hexagonal symmetric radial planar defects dangling from the pit.

FIG. 3(1) is a sectional view of a facet pit occurring on a GaN surface in the facet growth proposed by previous Japanese Patent Laying Open No.2001-102307 for showing that facets grow in inward directions different from an average growing direction (c-axis), the inward growing facets sweep dislocations to crossing lines, the rising crossing lines carry the dislocations inward in parallel with a C-plane, the converged dislocations form a bundle of dislocations at a multiple point at the pit bottom.

FIG. 3(2) is a sectional view of a facet pit occurring on a GaN surface in the facet growth proposed by previous Japanese Patent Laying Open No.2001-102307 for showing that the bottom dislocation bundles are not closed and the once converged dislocations diffuse outward from the pit bottom by repulsion acting among dislocations during the growth.

FIG. 4(1) is a sectional view of a facet pit occurring on a GaN surface in the facet growth proposed by the present invention for showing that facets grow in inward directions different from an average growing direction (c-axis), the inward growing facets sweep dislocations to crossing lines, the rising crossing lines carry the dislocations inward in parallel with a C-plane, the facet pit makes a closed defect accumulating region (H) at the bottom and the converged dislocations are accumulated in the closed defect accumulating region (H).

FIG. 4(2) is a sectional view of a facet pit occurring on a GaN surface after the facet growth proposed by the present invention for showing that dislocations once accumulated in the closed defect accumulating region (H) do not escape from the closed defect accumulating region (H).

FIG. 5(a) is a series of sectional figures showing a method of growing a GaN single crystal of the present invention by implanting a seed on an undersubstrate (1), growing a GaN crystal on the seeded undersubstrate on the condition of facet growth, making a simpler one-step pit composed of facets (2), inducing a closed defect accumulating region (H) between the seed and a pit bottom, forming an accompanying low dislocation single crystal region (Z) surrounding the closed defect accumulating region (H) under the facets, and producing an extra low dislocation single crystal region (Y) under a C-plane top surface (3).

FIG. 5(b) is a series of sectional figures showing a method of growing a GaN single crystal of the present invention by implanting a seed on an undersubstrate (1), growing a GaN crystal on the seeded undersubstrate on the condition of facet growth, making a two-step pit composed of facets (2), inducing a closed defect accumulating region (H) between the seed and a pit bottom, forming an accompanying low dislocation single crystal region (Z) surrounding the closed defect accumulating region (H) under the facets, and producing an extra low dislocation single crystal region (Y) under a C-plane top surface (3).

FIG. 11 is a series of sectional views of the steps of making a GaN crystal of Embodiment 1 of the present invention by preparing an undersubstrate, coating the undersubstrate with a GaN epi-layer, implanting seeds upon the epi-layer, growing a thick GaN crystal on the condition of facet growing, forming facets and facet pits at the position of the seeds, producing closed defect accumulating regions (H) following bottoms of the pits, forming accompanying low dislocation single crystal regions (Z) surrounding the closed defect accumulating regions (H) just under the facets, forming extra low dislocation single crystal regions (Y) under C-plane growing tops, eliminating the facets and the undersubstrate by mechanical processing, and obtaining a flat, smooth GaN single crystal. FIG. 11(1) is a section of the prepared undersubstrate. FIG. 11(2) is a section of the undersubstrate coated with the epi-layer. FIG. 11(3) is a section of the seed implanted GaN epi-layer on the undersubstrate. FIG. 11(4) is a CL-observed section of a thick GaN with H, Z and Y grown on the seed implanted GaN epi-layer. FIG. 11(5) is a CL-observed section of the polished GaN single crystal.

FIG. 12 is a series of sectional views of the steps of making a GaN crystal of Embodiment 2 of the present invention by preparing an undersubstrate, implanting seeds upon the undersubstrate, growing a thick GaN crystal on the condition of facet growing, forming facets and facet pits at the position of the seeds, producing closed defect accumulating regions (H) following bottoms of the pits, forming accompanying low dislocation single crystal regions (Z) surrounding the closed defect accumulating regions (H) just under the facets, forming extra low dislocation single crystal regions (Y) under C-plane growing tops, eliminating the facets and the undersubstrate by mechanical processing, and obtaining a flat, smooth GaN single crystal. FIG. 12(1) is a section of the undersubstrate implanted by the seeds. FIG. 12(2) is a CL-observed section of a thick GaN with H, Z and Y grown on the seed implanted undersubstrate. FIG. 12(3) is a CL-observed section of the polished GaN single crystal.

FIG. 13 is a series of sectional views of the steps of making a GaN crystal of Embodiment 4 of the present invention by preparing a sapphire undersubstrate, coating the undersubstrate with a GaN epi-layer, disposing particle seeds upon the epi-layer via a stencil, growing a thick GaN crystal on the condition of facet growing, forming facets and facet pits at the position of the particle seeds, producing closed defect accumulating regions (H) following bottoms of the pits, forming accompanying low dislocation single crystal regions (Z) surrounding the closed defect accumulating regions (H) just under the facets, forming extra low dislocation single crystal regions (Y) under C-plane growing tops, eliminating the facets and the undersubstrate by mechanical processing, and obtaining a flat, smooth GaN single crystal. FIG. 13(1) is a section of the prepared sapphire undersubstrate. FIG. 13(2) is a section of the undersubstrate coated with the epi-layer. FIG. 13(3) is a section of the seed particles arranged GaN epi-layer on the undersubstrate. FIG. 13(4) is a CL-observed section of a thick GaN with H, Z and Y grown on the seed particle arranged GaN epi-layer on the sapphire undersubstrate. FIG. 13(5) is a CL-observed section of the polished GaN single crystal.

FIG. 14 is a series of sectional views of the steps of making a GaN crystal of Embodiment 5 of the present invention by preparing a sapphire undersubstrate, coating the sapphire undersubstrate with a GaN epi-layer, etching selectively parts of the GaN epi-layer which are assigned to be seeds for giving the role of seeds to the exposed window parts, growing a thick GaN crystal on the condition of facet growing, forming facets and facet pits at the position of the exposed part seeds, producing closed defect accumulating regions (H) following the bottoms of the pits, forming accompanying low dislocation single crystal regions (Z) surrounding the closed defect accumulating regions (H) just under the facets, forming extra low dislocation single crystal regions (Y) under C-plane growing tops, eliminating the facets and the undersubstrate by mechanical processing, and obtaining a flat, smooth GaN single crystal. FIG. 14(1) is a section of the prepared sapphire undersubstrate. FIG. 14(2) is a section of the undersubstrate coated with the epi-layer. FIG. 14(3) is a section of the partially etched GaN epi-layer having the exposed part seeds. FIG. 14(4) is a CL-observed section of a thick-grown GaN with H, Z and Y grown on the window-seeded GaN epi-layer on the sapphire undersubstrate. FIG. 14(5) is a CL-observed section of the polished GaN single crystal having repetitions of $(YZHZ)^n$.

FIG. 15 is a series of sectional views of the steps of making a GaN crystal of Embodiment 6 of the present invention by preparing a GaN crystal having the structure of repetitions $(YZHZ)^n$ which has been made by Embodiment 1 of Pattern A as an undersubstrate for making the best use of the closed defect accumulating regions (H) as seeds, growing a thick GaN crystal on the condition of facet growing, forming facets and facet pits at the position of the closed defect accumulating regions (H) on the GaN undersubstrate, producing closed defect accumulating regions (H) following bottoms of the pits upon the closed defect accumulating regions (H) of the undersubstrate, forming accompanying low dislocation single crystal regions (Z) surrounding the closed defect accumulating regions (H) just under the facets, forming extra low dislocation single crystal regions (Y) under C-plane growing tops, eliminating the facets by mechanical processing, obtaining a flat, smooth GaN thick single crystal, slicing the thick GaN crystal into a plurality of GaN wafers and polishing the GaN wafers into a plurality of GaN smooth, flat wafers. FIG. 15(1) is a section of the prepared GaN undersubstrate which has made by Embodiment 1. FIG. 15(2) a CL-observed section of a faceted GaN crystal with H, Z and Y grown on the GaN undersubstrate. FIG. 15(3) a CL-observed section of the faceted thick GaN crystal with the H, Z and Y structure grown on the GaN undersubstrate with the same H, Z and Y structure. FIG. 15(4) is a CL-observed section of a plurality of sliced and polished GaN single crystal wafers having repetitions of $(YZHZ)^n$ structure.

DETAILED DESCRIPTION OF THE PREFERRED EMBODIMENTS

Figure 2:
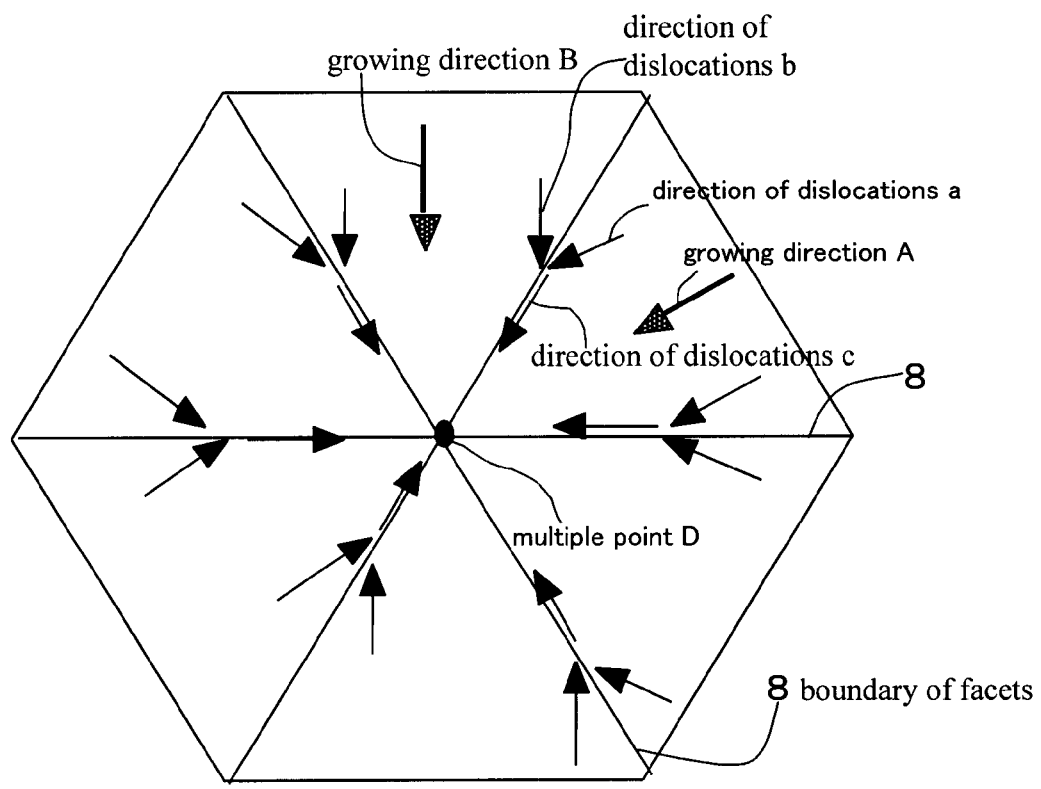
FIG. 2 is a plan view of a facet pit occurring on a GaN surface in the facet growth proposed by previous Japanese Patent Laying Open No.2001-102307 for showing that facets grow in inward directions (B) different from an average growing direction (c-axis), the inward growing facets sweep dislocations to crossing lines and a multiple point D at the pit bottom accumulates high density dislocations.

The present invention makes a low dislocation density GaN single crystal substrate by growing a GaN crystal, maintaining facets and facet pits on a surface, making closed defect accumulating regions (H) following pit bottoms, accumulating/annihilating dislocations at boundaries (K) and decreasing dislocations in the surrounding single crystal regions (claim 32).

Otherwise, the present invention makes a low dislocation density GaN single crystal substrate by growing a GaN crystal, maintaining facets and facet pits on a surface, making closed defect accumulating regions (H) following pit bottoms, accumulating/annihilating dislocations at boundaries (K) and cores (S) and decreasing dislocations in the surrounding single crystal regions (claim 32).

A practical method contains the steps of making pits composed of facets, growing a GaN crystal on a condition of facet growth, maintaining a surface covered with facet pits, keeping closed defect accumulating regions (H) at bottoms of the facet pits, assembling dislocations into the closed defect accumulating regions (H) and reducing dislocations in the surrounding single crystal parts (accompanying low dislocation single crystal regions (Z) and extra low dislocation single crystal regions (Y)) (claim 32).

This is the gist of the present invention. Formation of the facet pits is still insufficient. What is essential is the formation of the closed defect accumulating regions (H) following the bottoms of the pits. A closed defect accumulating region (H) consists of an inner part (core (S) and a surface (crystal boundary (K)) which is assemblies of defects (dislocations). The region is closed by the boundary (K). The closed state is an important attribute of the closed defect accumulating regions (H). The boundary (K) or both the boundary (K) and the core (S) have the function of reducing dislocation density of the other parts by annihilating and accumulating dislocations. The closed defect accumulating regions (H) are yielded at the bottoms of the pits in the present invention. The pits make the closed defect accumulating regions (H). Pits are indispensable. Without pits, no closed defect accumulating region (H) happens. The reverse is not necessarily true. There are some pits without carrying closed defect accumulating regions (H). Such a pit called here a vacant pit. The vacant pits are useless.

Strictly speaking, the "surrounding other portion" can be classified into two portions. One is an inner portion which has been made by the facet growth and exists just beneath the facet pits. The other is an outer portion which has been made by the C-plane growth and exists under the C-plane surface out of the facet pits. The former inner portion accompanies the closed defect accumulating regions (H). The inner portion is a single crystal with low dislocation density. The inner portion has lower electric resistivity. Then, the inner portion covered with the pits is here named an "accompanying low dislocation single crystal region (Z)". The latter outer portion is an extra region outside of Z and H. The outer portion is a single crystal with low dislocation density. The outer portion has higher electric resistivity. Thus, the outer portion is here named an "extra low dislocation single crystal region (Y)".

The most important region is the closed defect accumulating regions (H). The closed defect accumulating regions (H) play a useful role of converting the accompanying low dislocation single crystal regions (Z) and the extra low dislocation single crystal regions (Y) into single crystals of low dislocation density. The closed defect accumulating regions (H) consist of a boundary (K) and a core (S) (H=K+S). The boundary (K) and the core (S) deprive Z and Y of dislocations. The boundary (K) and the core (S) annihilate a part of the dislocations and store another part of the dislocations in them.

The boundary (K) and the core (S) do not release the once-arrested dislocations. Thus, the closed defect accumulating regions (H) are the most significant, fundamental matter in the present invention.

Why are the facet pits necessary? What is the function of the pits? The next problem is the function of the pits. The pits have two functions. One function is to hold a closed defect accumulating region (H) below the bottom. The closed defect accumulating region (H) follows the pit. The pit bottom leads the closed defect accumulating region (H). The pit makes the closed defect accumulating region (H). Without pit, no closed defect accumulating region (H) would occur. The pit gives life to the closed defect accumulating region (H). The pits are indispensable for the existence of the closed defect accumulating regions (H). However, the reverse is not always true. It is possible for a pit to have no closed defect accumulating region (H). The pit without the closed defect accumulating region (H) is called a "vacant pit" here. The vacant pit is useless. The vacant pit cannot hold the once-arrested dislocations but releases the dislocations, because the vacant pit has no closed defect accumulating region (H) below.

Aforementioned ⑥ (Japanese Patent Laying Open No.2001-102307) made facets and facet pits. The pits of ⑥, however, lack closed defect accumulating regions (H). The pits are vacant pits without closed defect accumulating region (H). The vacant pits have no annihilation/accumulation function. The vacant pits cannot arrest dislocations permanently. The vacant pits allow generation of planar defect assemblies or linear defect assemblies and hazy dislocation diffusion.

On the contrary, the present invention allocates closed defect accumulating regions (H) for all the facet pits. The pits carrying the closed defect accumulating regions (H) are called substantial pits. The present invention makes the substantial pits, induces the closed defect accumulating regions (H) by the substantial pits, and annihilates/accumulates dislocations in the closed defect accumulating regions (H).

The pits have another significant function of attracting and sweeping dislocations from the surrounding regions into the bottom closed defect accumulating regions (H). Without slanting planes of the facets, dislocations would extend upward and would not be converged to the pit bottoms. Thus, a pit has a role of maintaining a closed defect accumulating region (H) and another role of gathering and guiding dislocations to the closed defect accumulating region (H).

The rest problem is how to make closed defect accumulating regions (H) at predetermined positions. The key for the problem is a seed. Seed-implantation is an answer for the problem. Seeds are implanted at desired positions on an undersubstrate at an initial step. The seeds implanted on an undersubstrate bear pits and closed defect accumulating regions (H). Thus, the positions of the pits and the closed defect accumulating regions (H) can be exactly determined by the seeds. The most significant idea of the present invention is the implantation of the seeds. Geometrically, regular, periodic seed implantation enables GaN growth to arrange closed defect accumulating regions (H) regularly, periodically on a growing GaN surface.

The closed defect accumulating regions (H) in a finished GaN wafer may not be utilized as an important part of a device chip because of concentrated defects. The rest portions (the accompanying low dislocation single crystal regions (Z) and the extra low dislocation single crystal regions (Y)) are available for important parts (for example, an emission stripe of an LD). If the closed defect accumulating regions (H) dispersed at random on a GaN wafer, the design of device chips on the GaN wafer would be very difficult for avoiding the random-distributing closed defect accumulating regions (H).

The seed implantation enables the present invention to predetermine the positions of the accompanying low dislocation single crystal regions (Z) and the extra low dislocation single crystal regions (Y) by making the closed defect accumulating regions (H) at seed implanted positions. Spatial controllability originates from the seed implantation. The present invention features high controllability of the accompanying low dislocation single crystal regions (Z) and the extra low dislocation single crystal regions (Y).

The closed defect accumulating regions (H) is the most significant concept in the present invention. The closed defect accumulating regions (H) require preliminary detailed description. The closed defect accumulating regions (H) do not take a single definite structure but take a variety of crystal structures, that is, polycrystalline ones or single crystalline ones of different orientations. Any closed defect accumulating regions (H) have a function of decreasing dislocations. The present invention relies upon the excellent function of the closed defect accumulating regions (H).

[1. Polycrystalline Closed Defect Accumulating Regions (H) (Claim 33)]

A closed defect accumulating region (H) is a polycrystal which contains variously-oriented GaN grains. In this case, only the closed defect accumulating regions (H) are polycrystalline. Other portions; the accompanying low dislocation single crystal regions (Z) and the extra low dislocation single crystal regions (Y); are all single crystals. The boundary (K) is a poly/single interface.

[2. Single Crystal Closed Defect Accumulating Regions (H) (Claim 34)]

A closed defect accumulating region (H) is one or more than one single crystal which has a definite orientation different from the orientation of the surrounding single crystal portions Z and Y. When a GaN film is grown on average along the c-axis, the surrounding accompanying low dislocation single crystal regions (Z) and extra low dislocation single crystal regions (Y) have a (0001) surface. The closed defect accumulating region (H) has different a-axis, b-axis, d-axis and c-axis.

[3. <0001> Common Single Crystal Closed Defect Accumulating Regions (H) (Claim 35)]

A closed defect accumulating region (H) is a single crystal having only a <0001> axis common with the surrounding single crystal regions. When a GaN grows in a c-axis direction, the surrounding single crystal parts (accompanying low dislocation single crystal regions (Z) and the extra low dislocation single crystal regions (Y)) are single crystals having C-planes (0001) parallel with the surfaces. The closed defect accumulating regions (H) have a c-axis parallel to the c-axis of the other parts Z and Y. The closed defect accumulating regions (H) rotate by a certain angle around the c-axis. The closed defect accumulating region (H) has unique a-,b- and d-axes different from the other single crystal parts Z and Y. Rotation of the closed defect accumulating regions (H) around a c-axis in the reverse direction by the same angle can equalize the closed defect accumulating regions (H) to the other regions in orientation.

[4. Reverse Polarity Single Crystal Closed Defect Accumulating Regions (H) (Claims 36 and 37)]

A closed defect accumulating region (H) is a single crystal having a <0001> axis antiparallel to the <0001> axis of the surrounding single crystal regions. The polarity is reversed in the closed defect accumulating regions (H). The closed defect accumulating region (H) can be equalized by rotating the c-axis around a horizontal axis at 180°. A GaN crystal has a polarity due to the lack of inversion symmetry. A (0001) plane surface is a surface having Ga atoms. A (0001) plane surface is a surface having N atoms allover. When a single crystal having a reversed <0001> axis, a boundary is born between the inner single crystal and the surrounding region. In this case, the closed defect accumulating region (H) can be either a single crystal having a reversed <0001> axis or a polycrystal of grains having a reversed <0001> axis.

[5. Closed Defect Accumulating Regions (H) Shielded by Planar Defects (Claim 39)]

A closed defect accumulating region (H) consists of one or more than one crystal grain which is enclosed and shielded by planar defects from the surrounding single crystal regions Z and Y.

[6. Closed Defect Accumulating Regions (H) Shielded by Linear Defects (Claim 39)]

A closed defect accumulating region (H) consists of one or more than one crystal grain which is enclosed and shielded by linear defects from the surrounding single crystal regions Z and Y.

[7. Same Oriented Closed Defect Accumulating Regions (H) Shielded by Planar Defects (Claim 40)]

A closed defect accumulating region (H) consists of one or more than one crystal grain which has the same orientation as the surrounding single crystal regions Z and Y and is enclosed and shielded by planar defects from the surrounding single crystal regions Z and Y.

[8. Same Oriented Closed Defect Accumulating Regions (H) Shielded by Linear Defects (Claim 40)]

A closed defect accumulating region (H) consists of one or more than one crystal grain which has the same orientation as the surrounding single crystal regions Z and Y and is enclosed and shielded by linear defects from the surrounding single crystal regions Z and Y.

[9. Slightly Slanting Closed Defect Accumulating Regions (H) (Claim 38)]

Some of the closed defect accumulating regions (H) are single crystals having an orientation nearly equal but slightly inclining to the orientation of the neighboring single crystal portions Z and Y.

The above are the variations of the orientation of the closed defect accumulating regions (H). Following the description of the orientation, crystallographical defects of the closed defect accumulating regions (H) are described. Closed defect accumulating regions (H) contain, in particular, high density of defects. The closed defect accumulating regions (H) are sometimes polycrystals and sometimes single crystals. Surrounding portions are single crystals. If a closed defect accumulating region (H) is a polycrystal, it is a matter of course that a boundary (K) is formed between the closed defect accumulating region (H) and the surrounding portions. Even if a closed defect accumulating region (H) is a single crystal, many defects are induced around the single crystal closed defect accumulating region (H). Dislocations are conveyed by the facets to the closed defect accumulating regions (H). Linear defect assemblies or planar defect assemblies are made around the closed defect accumulating regions (H). Thus, a single crystal closed defect accumulating region (H) is encapsulated by planar defects assemblies.

[10. Closed Defect Accumulating Regions (H) Encapsulated by Planar Defect Assemblies (Claims 39 and 40)]

A single crystal closed defect accumulating region (H) contains defects and is encapsulated by planar defects assemblies. The planar defects assemblies shield the closed defect accumulating regions (H) from the surrounding single crystal portions.

[11. Closed Defect Accumulating Regions (H) Encapsulated by Linear Defect Assemblies (Claims 39 and 40)]

A single crystal closed defect accumulating region (H) contains defects and is encapsulated by linear defects assemblies. The linear defects assemblies shield the closed defect accumulating regions (H) from the surrounding single crystal portions.

[12. Closed Defect Accumulating Regions (H) Containing Linear Defect Assemblies or Planar Defect Assemblies (Claim 41)]

A single crystal closed defect accumulating region (H) contains plenty of crystalline defects. The defects are mainly linear defect assemblies or planar defect assemblies.

Variations of closed defect accumulating regions (H) have been described. Next problem is the orientations of the crystal growth. An ordinary crystal growth direction is the c-axis direction (claim 42). Since a GaN crystal is grown on a foreign material substrate, a three-fold rotation symmetric substrate of a foreign material enables a c-axis growing GaN crystal to equalize the symmetry with the substrate symmetry. If a GaN single crystal can be utilized as a substrate, non-c-axis GaN growth will be possible. But, no large GaN single crystal substrate is available at present. Then, the present invention is applied mainly to the GaN c-axis growth.

The c-axis facet growth which maintains facets makes facet pits of reverse dodecagonal cones or reverse hexagonal cones (claim 43). Hexagonally symmetric GaN has six nearly-equivalent slanting planes around the c-axis. Commutating h, k and m of (hkmn) plane produces six nearly equivalent planes. The equivalent six planes (facets) form a hexagonal cone pit. FIG. 1 shows a hexagonal conical pit born by he facet growth on a top surface (C-plane).

An average growing direction is the c-axis direction. But on the facets, GaN grows inward as indicated by inward arrows 9. If two sets of equivalent six slanting planes (facets) cooperate, a reverse dodecagonal conical pit appears.

Most of the facets appearing on the surface can be designated by $\{kk\text{-}2kn\}$ planes (k, n; integer) or $\{k\text{-}k0n\}$ planes (k, n; integer) (claim 44). One set of six planes meets with each other at 60 degrees. The other set of six planes meets with each other at 60 degrees. One set differs from the other set by 30 degrees. Twelve planes form a dodecagon having a thirty degree outer crossing angle, if two sets have an equivalent power. When one set is influential, a hexagonal pit is formed.

$\{11\text{-}22\}$ and $\{1\text{-}101\}$ are the most prevailing facets appearing on the surface (claim 45). Sometimes hexagonal reverse cone pits of $\{11\text{-}22\}$ or $\{1\text{-}101\}$ appear. Sometimes reverse dodecagonal cone pits of $\{11\text{-}22\}$ and $\{1\text{-}101\}$ are formed.

The facet pits are sometimes double-stepped pits which are constructed by a first reverse hexagon or dodecagon and a second reverse hexagon or dodecagon which incline at different angles to the vertical direction (claim 43). For example, $\{111\text{-}22\}$ planes and $\{11\text{-}21\}$ planes which have different slanting angles are contained in a facet pit. Otherwise, $\{1\text{-}101\}$ planes and $\{1\text{-}102\}$ planes which have different slanting angles coexist in a facet pit. Steeper facets which have smaller n (c-index) build a higher bigger pit and milder slanting facets which have bigger n (c-index) construct a lower smaller pits. The upper bigger facets are followed by the accompanying low dislocation single crystal regions (Z). The lower smaller facets are accompanied by the closed defect accumulating regions (H).

The relation between the closed defect accumulating regions (H) and the facets is described here. The inventors found a definite relation between the Miller indices of the facets and the closed defect accumulating regions (H). The closed defect accumulating regions (H) follow the bottoms of the facet pits. The tops of the closed defect accumulating regions (H) have planes of different indices from the indices of the upper facets (claim 46). As mentioned earlier, almost all of the facets in the pits have Miller indices of $\{1\text{-}22\}$ or $\{1\text{-}101\}$.

However, the tops of the closed defect accumulating regions (H) which are identical to the pit bottoms have inclinations slightly smaller, shallower than the facets (claim 47). FIG. 5($b$) (3) shows double-inclination pits. A smaller inclination means a bigger n (c-axis index). Namely for example, $\{11\text{-}24\}$, $\{11\text{-}25\}$, $\{11\text{-}26\}$, $\{1\text{-}102\}$ or $\{1\text{-}104\}$ planes appear on the bottom of the pits (claim 47). When the pit bottoms are buried with gallium nitride, the bottoms are included into the closed defect accumulating regions (H). An interface between the closed defect accumulating regions (H) has slanting planes of slanting angles smaller than the higher facets. A reverse polarity closed defect accumulating region (H) which has a <0001> axis reverse to the <0001> axis of the other single crystal regions (Z) and (Y) grows with a smaller inclination facets (claim 48). In this case of the reverse polarity closed defect accumulating region (H), the smaller inclination facets are composed of $\{111\text{-}2\text{-}4\}$, $\{11\text{-}2\text{-}5\}$, $\{11\text{-}2\text{-}6\}$, $\{1\text{-}10\text{-}2\}$, $\{1\text{-}10\text{-}3\}$, and $\{1\text{-}10\text{-}4\}$ (claim 49). The smaller inclination facets are buried and affiliated into the closed defect accumulating region (H) with the proceeding growth. Then, the closed defect accumulating region (H) has planes of a larger fourth index n. The boundary (K) of the closed defect accumulating region (H) at the bottom of the facet pit has a top edge which coincides with a border between the pit facets and the smaller inclination facets. The coincidence frequently appears for the reverse polarity closed defect accumulating regions (H) which have a <0001> axis antiparallel to the <0001> axis of the neighboring single crystal regions (claim 50). It is an important discovery that inclinations of lower parts of the pit facets are milder than the pit facets.

The closed defect accumulating region (H) following the facet pit exists as a dot (claim 51). The dotted H means that the closed defect accumulating region (H) is assembled neither into a line nor into a donut but into an isolated dot. For example, black spots at the centers of the concentric circles in FIG. 7 indicate the closed defect accumulating regions (H). The closed defect accumulating region (H) is converged into a small dot. The converged, dotted closed defect accumulating regions (H) give the present invention an advantage of reducing the probability of occurrence of collision of cleavage planes with the closed defect accumulating regions (H) when a GaN wafer is cleaved.

The converged closed defect accumulating regions (H) facilitate the cleavage of the GaN wafer of the present invention and allow this invention to make the best use of the cleavage planes for slicing individual devices and for forming resonators of laser diodes.

Facet growth should maintain the diameter of the closed defect accumulating regions (H) following the pit bottoms within a range from 1 $\mu$m to 200 $\mu$m (claim 52).

When the facet pit have a smaller diameter, a smaller diameter is preferable for the closed defect accumulating region (H) following the pit.

When the facet pit have a larger diameter, a larger diameter is preferable for the closed defect accumulating region (H) following the pit. Practically, at the lowest limit, a 1 $\mu$m diameter closed defect accumulating region (H) has an effect for suppressing dislocations. At the highest limit, economical consideration allows 200 $\mu$m diameter closed defect accumulating regions (H).

A horizontal sectional shape of the closed defect accumulating regions (H) following the facet pits is sometimes amorphous (claim 53). Energetical instability due to the defects distorts the closed defect accumulating regions (H).

A horizontal sectional shape of the closed defect accumulating regions (H) is sometimes circular (claim 53). Circular sectioned closed defect accumulating regions (H) frequently appear in the case of a polycrystal H containing many grains or a single crystal H of a large diameter.

Another horizontal sectional shape of the closed defect accumulating regions (H) is sometimes polygonal (claim 53). Polygonal sectioned closed defect accumulating regions (H) frequently appear in the case of a polycrystal H containing few grains or a single crystal H of a small diameter.

When an average growing direction is a c-axis direction, polycrystal regions are formed at bottoms of facet pits on a growing surface. The polycrystal regions are columns extending in parallel to the c-axis (claim 32).

The polycrystal region (a closed defect accumulating region (H)) has a dynamics of gathering dislocations centripetally extending in horizontal directions from the surrounding single crystal portions (Z+Y), annihilating a part of the gathered dislocations, accumulating the other part of the gathered dislocations into a boundary (K) between the closed defect accumulating region (H) and the surrounding single crystal portions (Z+Y), and reducing the dislocations of the surrounding single crystal portions (Z+Y) effectively (claim 32).

The power of converging the dislocations to the closed defect accumulating regions (H) originates from the inclining facets of sweeping the dislocations to the center of the facet pits in the centripetal directions in parallel with the C-plane. Namely, the dislocations run in the horizontal direction parallel with the surface (C-plane). Convergence of dislocations into the closed defect accumulating regions (H) reduces thread dislocations in the single crystal regions (Z) and (Y) (claim 32). For example, facets grow inward along centripetal arrows and dislocations similarly extend inward along the centripetal arrows in FIG. 1 and FIG. 2. In FIG. 2, centripetally moving dislocations collide a facet boundary 8 of a hexagonal pit, turn in the boundary 8, proceed along the boundary 8, and converge to a central manifold point D.

The function was described in our preceding application ⑥ (Japanese Patent Laying Open No.2001-102307). But, the preceding application had no closed defect accumulating regions (H) below the manifold point D. The dislocations were again released from the manifold point D and formed wide planar defects 10 broadly following the boundaries 8, as shown in FIG. 1(b). The reduction of dislocations was insufficient in ⑥.

FIGS. 3(1) and (2) show the facet pit proposed by our preceding invention ⑥. The pit bottom has no closed defect accumulating region (H). The pit bottom is open. Number of dislocations which are gathered to the pit bottom is small. Dislocation density is low at the bottom of the pit. Dislocations once converged to the pit bottom will be released outward again, since the bottom is not closed but open.

In the present invention, the closed defect accumulating region (H) at the bottom of the facet pit absorbs the dislocations (FIG. 4). A part of the absorbed dislocations vanishes and another part of the dislocations is stored in the closed defect accumulating region (H) which consists of the core (S) and the boundary (K). The dislocation vanishing/storing part is the boundary (K) or the core (S). In a case, only the boundary K is the dislocation vanishing/storing part. In another case, the core (S) is the dislocation vanishing/storing part. In another case, both the core (S) and the boundary (K) are the dislocation vanishing/storing part. In any cases, the closed defect accumulating region (H) is entirely encapsulated and sealed by the boundary (K). In an ideal case, once a dislocation is absorbed in the closed defect accumulating region (H), the same dislocation never emerges from the closed defect accumulating region (H) to outer regions. Thus, the closed defect accumulating region (H) realizes a permanent reduction of dislocations in the outer single crystal regions (Y) and (Z). FIG. 3 and FIG. 4 clearly contrast the present invention with our preceding ⑥.

Detail techniques for applying the present invention for making GaN substrates are described. A substrate of a foreign material is employed as a starting substrate (undersubstrate). Thus, a three-fold rotationally symmetric plane should be assigned to a surface orientation of the undersubstrate. GaN films should be grown along the c-axis on the three-fold rotation symmetric substrate.

GaN crystals are grown by a facet growth which forms facets and pits built by the facets on a surface and grows GaN without burying the facet pits. Besides the facet growth, the present invention forms the facet pits at the points in a predetermined regular pattern, makes the closed defect accumulating regions (H) following the regularly aligning facet pit bottoms and maintains the facet pits and the closed defect accumulating regions (H) throughout the crystal growth (claim 54).

Figure 7:
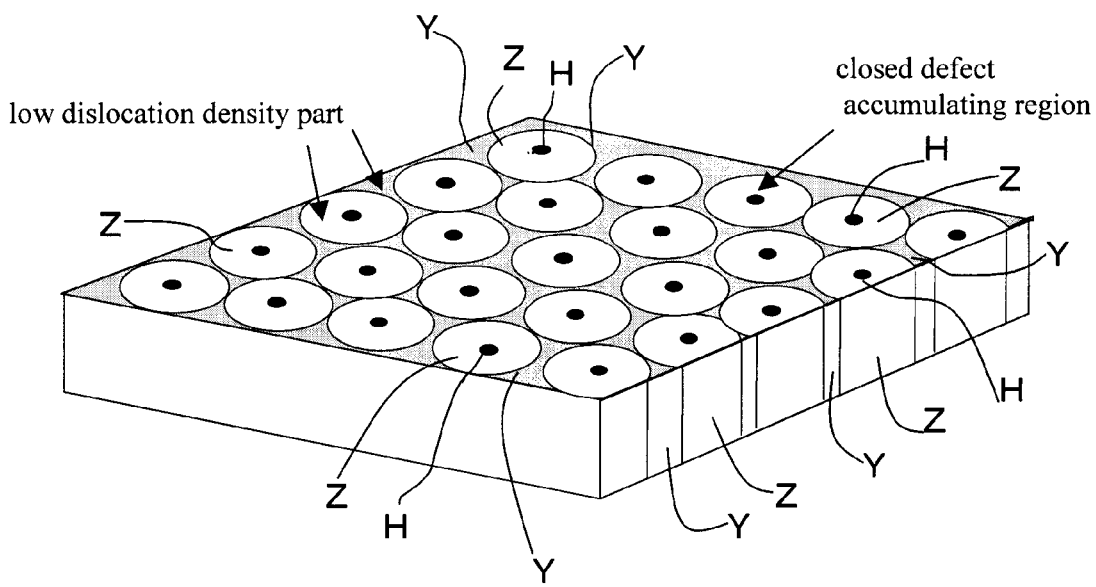
FIG. 7 is a perspective CL (cathode luminescence) view of a single crystal GaN substrate made by implanting seeds upon an undersubstrate in a hexagonal symmetric pattern of FIG. 6, growing a thick GaN crystal on the condition of facet growing, forming facets and facet pits at the position of the seeds, producing closed defect accumulating regions (H) following the bottoms of the pits, forming accompanying low dislocation single crystal regions (Z) surrounding the closed defect accumulating regions (H) just under the facets, forming extra low dislocation single crystal regions (Y) under C-plane growing tops, and eliminating the facets and the undersubstrate by mechanical processing.
Figure 8:
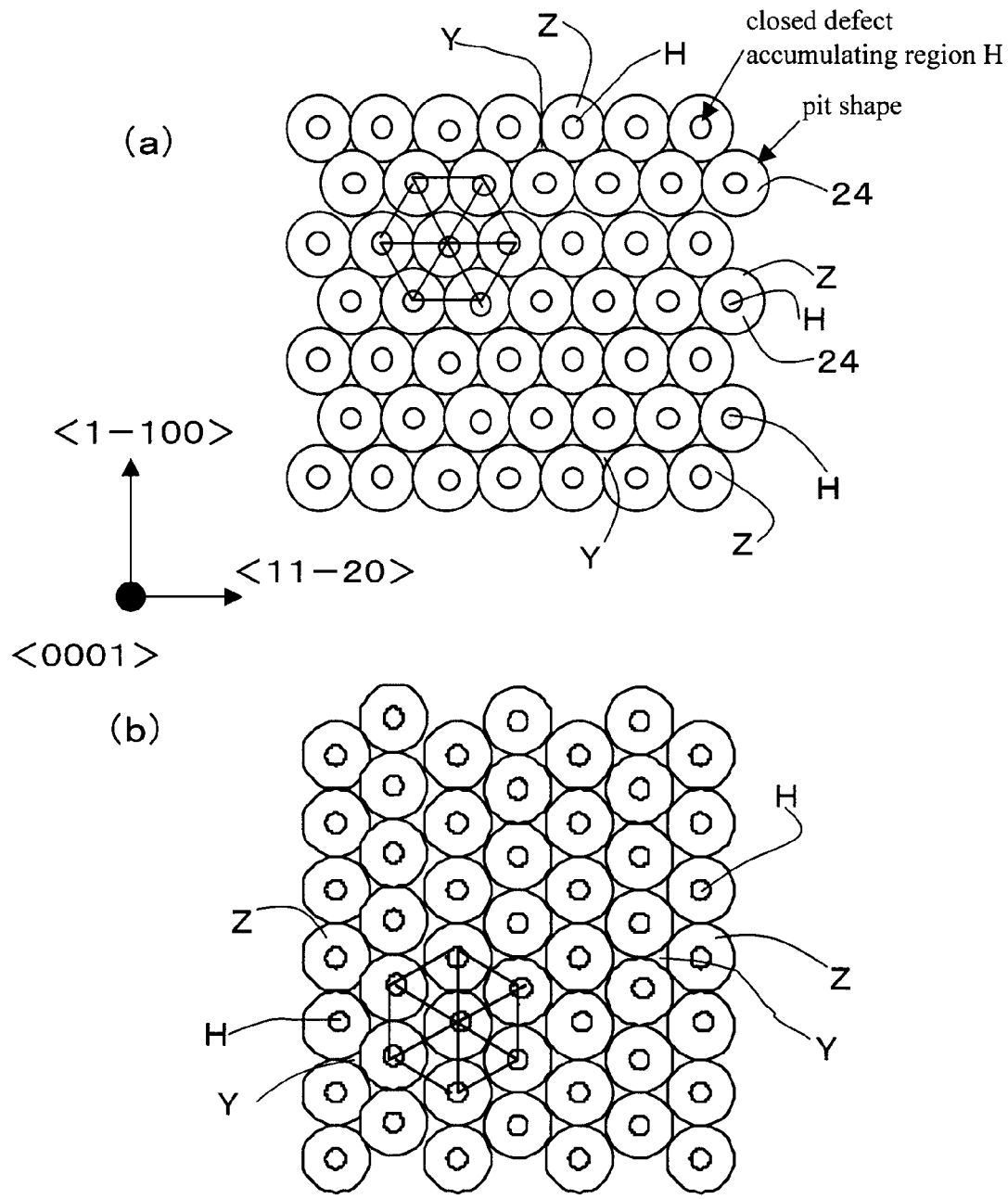
FIG. 8(a) is a plan CL (cathode luminescence) view of a single crystal GaN substrate composed of fundamental units having H, Z and Y aligning in the six-fold rotation symmetry pattern with the shortest pitch direction parallel to a <11-20> direction.
FIG. 8(b) is a plan CL (cathode luminescence) view of a single crystal GaN substrate composed of fundamental units having H, Z and Y aligning in the six-fold rotation symmetry pattern with the shortest pitch direction parallel to a <1-100> direction.

It is important for the present invention to array the facet pits and the closed defect accumulating regions (H) in a periodic pattern by keeping a rule. FIG. 6(b), FIG. 7 and FIGS. 8(a) and (b) show periodical arrangements of the closed defect accumulating regions (H). The whole surface should be covered with repetitions of a basic unit without extra margins. The number of probable patterns is restricted by the symmetry of the patterns. Geometric consideration clarifies the variance of allowable patterns.

Figure 9:
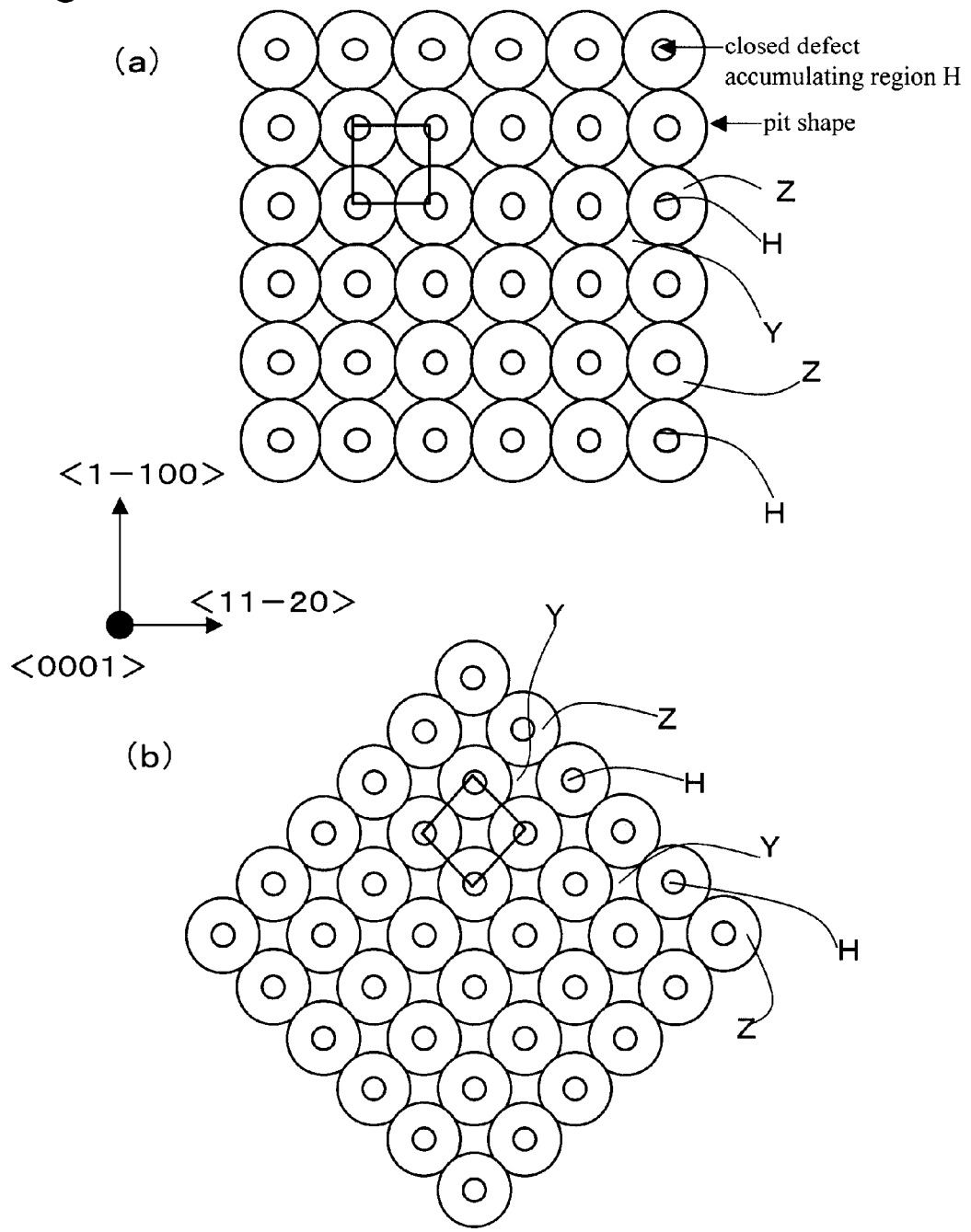
FIG. 9(a) is a plan CL (cathode luminescence) view of a single crystal GaN substrate composed of fundamental units having H, Z and Y aligning in the four-fold rotation symmetry pattern with the shortest pitch direction parallel to a <1-100> direction or a <11-20> direction.
FIG. 9(b) is a plan CL (cathode luminescence) view of a single crystal GaN substrate composed of fundamental units having H, Z and Y aligning in the four-fold rotation symmetry pattern with an orthogonal lines parallel to a <1-100> direction or a <11-20> direction.
Figure 10:
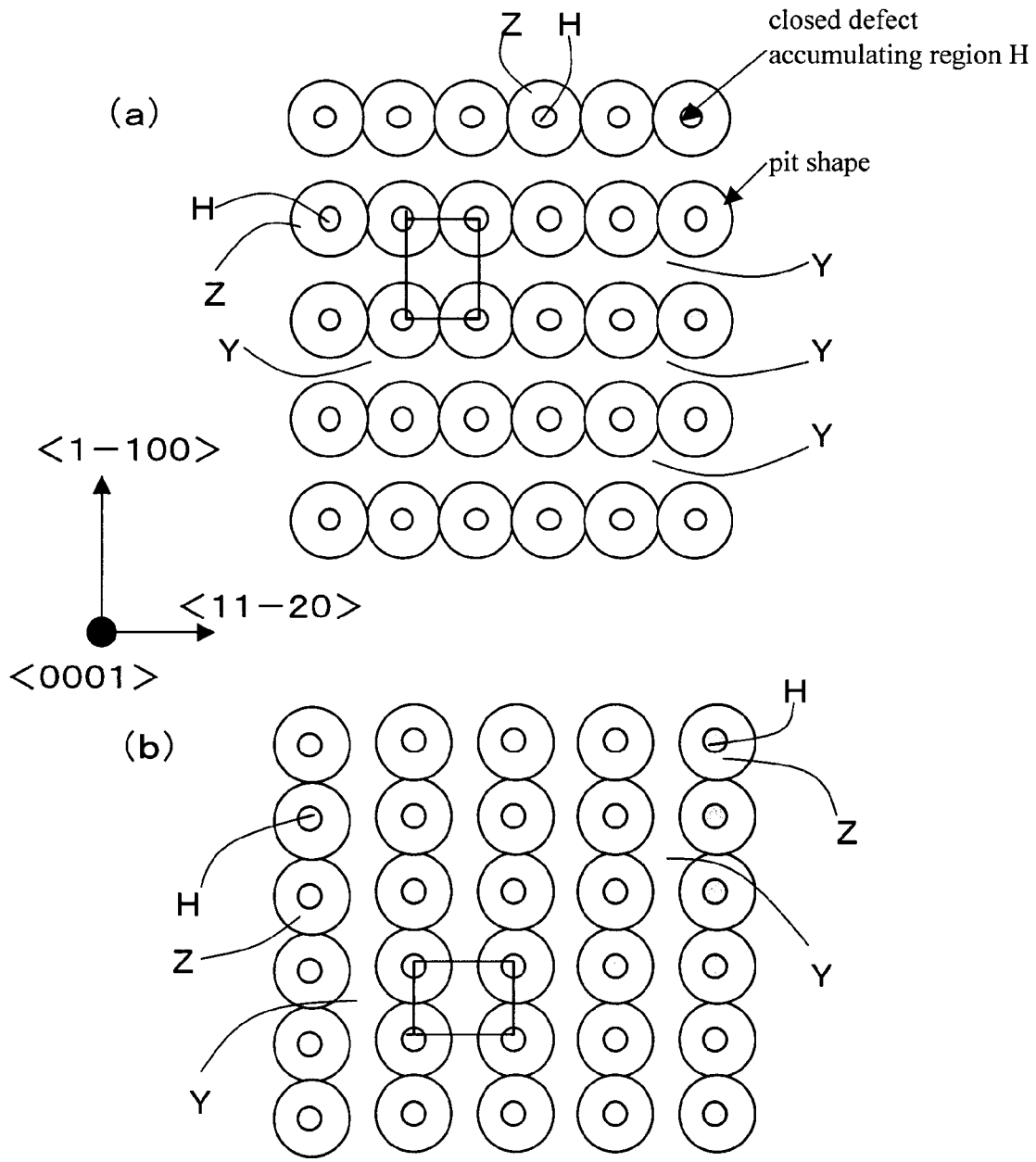
FIG. 10(a) is a plan CL (cathode luminescence) view of a single crystal GaN substrate composed of fundamental units having H, Z and Y aligning in the two-fold rotation symmetry pattern with the shortest pitch direction parallel to a <11-20> direction.
FIG. 10(b) is a plan CL (cathode luminescence) view of a single crystal GaN substrate composed of fundamental units having H, Z and Y aligning in the two-fold rotation symmetry pattern with the shortest pitch direction parallel to a <1-100> direction.

Two-dimensionally periodic, regular arrangements of similar pits and closed defect accumulating regions (H) without margins are realized only by three kinds of symmetry groups; six-fold rotation symmetry, four-fold rotation symmetry, and two-hold rotation symmetry. The six-fold rotation symmetric pattern arranges plenty of equilateral triangles without margin for converging the corners of six neighboring triangles at a point (FIGS. 6(a),(b), FIGS. 8(a), (b)). The four-fold rotation symmetric pattern arranges plenty of squares without margin for converging the corners of four neighboring squares at a point (FIG. 7, FIGS. 9(a), (b)). The two-fold rotation symmetric pattern arranges plenty of rectangles without margin for converging the corners of four neighboring rectangles at a point (FIGS. 10(a), (b)).

[1. Six-Fold Rotation Symmetry Pattern (FIGS. 8(a), (b), Claim 55]

FIGS. 8(a) and (b) show a 6-fold rotation symmetry pattern of H, Y and Z. Facet pits are hexagonal or dodecagonal polygons which are briefly denoted by rounds in the FIGS. 8(a) and 8(b). The pits are arranged in the most closest packed patterns in which neighboring pits are in contact with each other at six points. Every set of three centers of the neighboring three pits forms an equilateral triangle. A length of the unit equilateral triangle is called a pitch "p" here. The pitch "p" is a period of repetition of pits in the closest packed pattern. Six equilateral triangles form an equilateral hexagon. This pattern is named a two-dimensional hexagonal closest packed pattern. In the pattern, the pit diameter d is nearly equal to the pitch p (d=p). In FIG. 8(a), the pitch direction is parallel to a <11-20> direction of a GaN crystal. In FIG. 8(b), the pitch direction is parallel to a <1-100> direction of the GaN crystal.

In FIG. 8(a) and FIG. 8(b), smaller, inner rounds of concentric circles are the closed defect accumulating regions (H). Larger outer rounds denote facet pits on the surface. The larger outer rounds indicate areas of the accompanying low dislocation single crystal regions (Z) at the same time. The pits coincide with Z in the plan views. Narrow triangles remaining among three neighboring pits are the extra low dislocation single crystal regions (Y). These triangle areas are extra parts. Thus, Y is defined by an adjective "extra". The closest packed pattern means that the rate of the accompanying low dislocation single crystal regions (Z) to the whole area takes a maximum value. Similarly, the closed defect accumulating regions (H) take a maximum area. The extra low dislocation single crystal regions (Y) take a minimum area to the contrary. C-plane growing regions (the extra low dislocation single crystal regions (Y)) have a tendency of obtaining high electric resistivity. The six-fold rotation symmetry pattern is preferable for producing conductive GaN substrates, since the six-fold symmetry pattern can reduce the ratio of the extra low dislocation single crystal regions (Y).

[2. Four-Fold Rotation Symmetry Pattern (FIGS. 9(a), (b), Claim 56]

FIGS. 9(a) and (b) show a 4-fold rotation symmetry pattern of H, Y and Z. Facet pits are hexagonal or dodecagonal polygons which are briefly denoted by rounds in the FIGS. 9(a) and 9(b). The pits are arranged in medium close packed patterns in which neighboring pits are in contact with each other at four points. Every set of four centers of the neighboring four pits forms a square. A length of the unit square is called a pitch "p" here. The pitch "p" is a period of repetition of pits in the medium close packed pattern. Four neighboring pits form a square. In the pattern, the pit diameter d is nearly equal to the pitch p (d=p). In FIG. 9(a), the pitch direction is parallel to a <11-20> direction and a <1-100> direction of the GaN crystal. In FIG. 9(b), the pitch direction inclines at 45 degrees to the <1-100> direction and to the <1-100> direction of the GaN crystal. The pitch direction cannot be represented by a low plane index.

In FIG. 9(a) and FIG. 9(b), smaller, inner rounds of concentric circles are the closed defect accumulating regions (H). Larger outer rounds denote facet pits on the surface. The larger outer rounds indicate areas of the accompanying low dislocation single crystal regions (Z) at the same time. The pits coincide with Z in the plan views. Asterisk regions remaining among four neighboring pits are the extra low dislocation single crystal regions (Y). These asterisks are extra parts. Thus, Y is defined by an adjective "extra". The medium packed pattern means that the rate of the accompanying low dislocation single crystal regions (Z) to the whole area takes a medium value. The closed defect accumulating regions (H) take a medium area. The extra low dislocation single crystal regions (Y) take a medium area. C-plane growing regions (the extra low dislocation single crystal regions (Y)) have a tendency of showing high electric resistivity. The four-fold symmetric substrate is favorable for making square chip devices. Effective regions for chip substrates are the accompanying low dislocation single crystal regions (Z) and the extra low dislocation single crystal regions (Y). The wide, parallel single crystal regions (Z and Y) endow the four-fold symmetric GaN substrates with extra margins, simplified cleavage and high freedom of design. Equalizing the device pitch to the pit pitch enables makers to produce all the devices on the same condition and to divide a device-made GaN wafer into individual device chips by the simplified cleavage.

[3. Two-Fold Rotation Symmetry Pattern (FIGS. 10(a), (b), Claim 57]

FIGS. 10(a) and (b) show a 2-fold rotation symmetry pattern of H, Y and Z. Facet pits are hexagonal or dodecagonal polygons which are briefly denoted by rounds in the FIGS. 10(a) and 10(b). The pits are arranged in half-close packed patterns in which neighboring pits are in contact with each other at two points. A basic shape is a rectangle. Every set of four centers of the neighboring four pits forms a rectangle. The rectangle introduces anisotropy for the pattern. A length of the shorter side of a unit rectangle is called a pitch "p" here. The shorter pitch "p" is defined as a period of repetition of pits along the shorter sides in the half-close packed pattern. A longer pitch "q" is defined as a period of repetition of pits along longer sides in the pattern. In the pattern, the pit diameter d is nearly equal to the pitch p (d=p). In FIG. 10(a), the shorter pitch direction is parallel to a <11-20> direction of the GaN crystal. In FIG. 10(b), the shorter pitch direction is parallel to a <1-100> direction of the GaN crystal.

In FIG. 10(a) and FIG. 10(b), smaller, inner rounds of concentric circles are the closed defect accumulating regions (H). Larger outer rounds denote facet pits on the surface. The larger outer rounds indicate areas of the accompanying low dislocation single crystal regions (Z) at the same time. The pits coincide with Z in the plan views. Corrugated tape regions remaining between a series of contacting pits and another series of contacting pits are the extra low dislocation single crystal regions (Y). Effective regions for chip substrates are the accompanying low dislocation single crystal regions (Z) and the extra low dislocation single crystal regions (Y). The wide, parallel single crystal regions (Z and Y) endow the two-fold symmetric GaN substrates with extra margins, simplified cleavage and high freedom of design. Equalizing the device pitch to the shorter pit pitch p enables makers to produce all the devices on the same condition and to divide a device-made GaN wafer into individual device chips by the simplified cleavage.

This invention allocates plenty of pits built by facets having the closed defect accumulating regions (H) in a regular pattern on a surface of a growing GaN crystal. An optimum range of the minimum of the distances between neighboring pits is 50 $\mu$m to 2000 $\mu$m (claim 58).

A desirable size of pits of a GaN substrate depends upon the size of devices which are made on the substrate. A pit pitch smaller than the device size degrades the GaN wafer as a substrate for making the devices. The minimum size of the devices which will be made on the GaN wafer is 50 $\mu$m. Thus, the size of pits should be larger than 50 $\mu$m in diameter. Then, the minimum of the pit pitch is 50 $\mu$m.

The upper limit of the pit pitch is 2000 $\mu$m. A wider pit pitch is more convenient for making devices on only the accompanying low dislocation single crystal regions (Z) or the extra low dislocation single crystal regions (Y). However, the depths of the pits increase in proportion to the pit diameter. The pits are later eliminated by grinding and polishing. The grinding depth should be larger than the pit depth. A bigger pit diameter requires a thicker margin of grinding. Too thick grinding margin is undesirable. Economical reason restricts the maximum of the pit pitch to 2000 $\mu$m. Then, the optimum range of the pit pitch is between 50 $\mu$m and 2000 $\mu$m.

[Formation of Closed Defect Accumulating Regions (H)]

The closed defect accumulating region (H) is the most significant concept in the present invention. The method of producing the closed defect accumulating regions (H) is now described. FIGS. 5(a) and (b) show steps of growing a pit. FIG. 6(a) shows a plan view of a substrate having a seed pattern. FIG. 6(b) shows a plan view of a GaN crystal having a pit pattern similar to the seed pattern.

Crystal growth of the present invention uses an undersubstrate 21. Of course, a GaN single crystal plate can be an undersubstrate. But, it is still very difficult to produce a large GaN single crystal. It is more practical to make use of foreign material undersubstrates. At first, a plurality of seeds 23 are allocated at the predetermined spots which are assigned to the closed defect accumulating regions (H) on the undersubstrate 21 (FIG. 5(a)(1), FIG. 5(b)(1), FIG. 6(a)).

The seeds 23 should be arranged in a geometrically-regular pattern on the starting substrate (undersubstrate) 21. FIG. 6(a) denotes a plan view of an example of the seed pattern of the present invention. The seeded undersubstrate 21 shows a seed pattern having six-fold rotation symmetry which allocates seeds 23 at corner points of identical equilateral triangles which cover the surface of the substrate without extra space. Extra portions of the undersubstrate 21 are exposed. A GaN crystal 22 is grown on the undersubstrate 21 with the seeds 23. GaN growth has selectivity for the undersubstrate 21 and the seeds 23. The undersubstrate 21 facilitates GaN growth thereon. The seeds 23 suppress GaN growth. The GaN growing speed on the seeds 23 is slower than the growing speed on the undersubstrate 21. The difference of the difficulty of growing GaN enables the seeded undersubstrate 21 to produce facets and facet pits following the seeds 23. It is a quite sophisticated method. FIG. 5(a), (2) and FIG. 5(b), (2) show the substrate 21, the seed 23 and the GaN film 22 selectively growing upon the substrate 21. The top of the GaN film 22 is a flat plane 27 (C-plane). Since GaN is not easily deposited upon the seed 23, a gap remains among six or twelve slanting, facing facets 26 and 26 on the seed 23. Then, a pit 24 is produced just upon the seed 23. The pit 24 consists of the six or twelve facets 26. The facets have low Miller indices. A significant fact is that the pit 24 is formed just above the seed 23. The pit formation is exactly controlled by designing the seed pattern.

When the GaN film grows further from FIG. 5(a)(2) or FIG. 5(b)(2), the six or twelve facing facets 26 meet, collide and form a polygonal pit 24 on the seed 23. The whole of the seed is covered with a rugged GaN film. Then, the polygonal pit 24 is formed on the seed 23. The GaN film grows further upward. The pit 24 should not be buried but be maintained. The new mode of growth of maintaining facets is called "facet growth" here. The normal, ordinary mode of growth of maintaining smooth flat C-plane surface is called "C-plane growth" in contrast to the novel facet growth. The facet growth realized by raising the growth speed, enhancing the HCl partial pressure, raising the NH$_3$ partial pressure or lowering the growth temperature. The facets 26 are maintained by the facet growth. As the growth proceeds, the facets and the facet pits move upward, keeping the same shapes. A bottom 29 of the pit 24 corresponds to the seed 23. FIG. 5(a)(3) and FIG. 5(b)(3) indicate an intermediate state of the facet growth.

A crystal 25 growing from the bottom 29 of the pit 24 is entirely different from the surrounding crystal 22. The crystal 25 is closed. The bottom-following crystal 25 originates from the seed 23. Thus, the closed crystal 25 growing between the pit bottom 29 and the seed 23 is named a "closed defect accumulating region (H)". An interface 30 between the closed defect accumulating region (H) and the surrounding crystal 22 is named a "grain boundary (K)". An inner part is called a "core (S)". The pit bottom 29, the closed defect accumulating region (H) and the seed 23 align in series in the vertical direction. Namely, a pit bottom 29 is formed just above a seed 23 and a closed defect accumulating region (H) is formed between the bottom 29 and the seed 23 (claim 32).

Other crystal parts just under the facets 26 are accompanying low dislocation single crystal regions (Z). Further extra parts just below the flat top C-plane 27 are extra low dislocation single crystal regions (Y). The pit bottom takes two different shapes as shown in FIGS. 5(a) and (b). FIG. 5(a) shows a simpler facet pit in which the pit bottom has the same facets as the upper part of the pit. This is a single-step facet pit. FIG. 5(b) shows a more complex facet pit in which the pit bottom has less steeper facets different from the upper part of the pit (claim 47). This is a two-step facet pit. The lower, less steeper facets have higher c-axis index n. If an upper, steeper facet is a (11-22) plane, the lower, less steeper facet is a (11-24) plane.

[Wide Variations of Seeds]

The formation of the closed defect accumulating regions (H) is the most significant contrivance in the present invention. Seeds prepared on a starting substrate (undersubstrate) determine the properties of the closed defect accumulating regions (H), since the seeds initiate the formation of the closed defect accumulating regions (H). The seeds 23 which produce the closed defect accumulating regions (H) can be made either directly on the undersubstrate or indirectly on the undersubstrate by covering the undersubstrate with a thin GaN buffer layer and making the seeds on the GaN buffer layer.

The seeds should be allocated periodically in a regular pattern for making regularly aligning closed defect accumulating regions (H). Periodic patterns having six-fold rotation symmetry, four-fold rotation symmetry and two-fold rotation symmetry have been described enough.

Shapes of the seeds are films, particles and partial substrate surfaces. The films and particles have a function of reducing GaN growth and making pits. In the case of a film seed, both amorphous films and polycrystal films are available (claim 59).

[Seeding Method 1 (Seed=Film; Film Seed Method)]

Film seeds are formed at spots at which a closed defect accumulating region (H) should be allocated. A film having a two dimensional extension can be freely patterned into arbitrary shapes and distributions on an undersubstrate (claim 60). Seed patterning is done by photolithography, selective mask evaporation, or stencil printing. The positioning accuracy of the closed defect accumulating regions (H) is enhanced by precise patterning of seeds.

A shape of an individual seed can be a circle or a polygon (claim 60). The polygon seed means a triangle seed, a square seed, a hexagon seed, an octagon seed and so on. A sectional shape of a closed defect accumulating region (H) depends upon the shape of the seed. A desirable diameter of the amorphous or polycrystalline film seeds patterned into circles or polygons ranges from 1 $\mu$m to 300 $\mu$m (claim 61). The size of the closed defect accumulating region (H) is contingent on the size of the seeds. An optimum diameter of the closed defect accumulating region (H) is 1 $\mu$m to 300 $\mu$m. Experiments show the fact that the diameter of the closed defect accumulating region (H) is slightly smaller than the diameter of the seed.

[Materials of Film Seeds]

An attribute required for the seeds is to have a GaN growing speed slower than GaN itself Polycrystal films and amorphous films can be the seeds for making the closed defect accumulating regions (H). Metallic films, ceramic films and oxide films are available for the seed.

Promising seed candidates, in particular, are;

α. silicon dioxide ($SiO_2$) film (claim 62) (polycrystalline or amorphous)

β. silicon nitride ($Si_3N_4$) film (claim 62) (polycrystalline or amorphous)

γ. platinum (Pt) film (claim 62) (polycrystalline)

δ. tungsten (W) film (claim 62) (polycrystalline)

[Seeding Method 2 (Seed=Particles: Particle Seed Method)]

Seeds are not necessarily restricted to thin films. Regularly dispersed particles can be the seeds which induce the formation of the closed defect accumulating regions (H). For example, a set of seeds is made of GaN polycrystal particles arrayed in a regular pattern on an undersubstrate (claim 63). Similarly, another set of seeds is made of GaN single crystal particles arrayed in a regular pattern on an undersubstrate (claim 63). The dispersed GaN particles make GaN polycrystal parts with crystal orientations different from the neighboring GaN single crystal parts.

It sounds strange that the GaN particles act as seeds for delaying GaN growth and form facet pits. The GaN particles have random orientations different from growing GaN, which suppresses the GaN growth in the definite orientation. Besides GaN particles, poly- and single crystal particles of foreign materials are candidates of the seeds. GaN particles are the best candidate of the seeds, because the GaN particles do not induce contamination by impurity diffusion.

Particles have a three dimensional structure unlike films. However, the particles have the function of the seed for producing the closed defect accumulating regions (H). Individual particles made of metals, ceramics or other oxides can be randomly placed on a starting, foreign material substrate (undersubstrate). Particle seeds are suitable for preparing random seed patterns.

[Seeding Method 3 (Seed=Partially Masked Foreign Material Substrate Negative Mask Method)]

Superficial parts of a foreign material undersubstrate can be the seeds for producing the closed defect accumulating regions (H). An undersubstrate made of a foreign material has weaker function of making GaN layers than a GaN crystal. Difference of growing speeds on the undersubstrate and a GaN mask enables GaN growth to maintain the facet growth and to produce the closed defect accumulating regions (H) upon exposed parts of the undersubstrate. This is a sophisticated seeding method.

The seeds can be made by exposing periodically partial surfaces of a foreign material undersubstrate from an overcoating GaN thin film (claim 63). The partial undersubstrate surfaces emerging from the GaN films act as seeds for preparing the closed defect accumulating regions (H). A negative GaN film mask is formed by piling a GaN thin film (as a GaN buffer layer) on a foreign material undersubstrate, etching away parts of the GaN film at the spots on which the closed defect accumulating regions (H) should be made, exposing the partial surfaces of the undersubstrate via mask holes, and growing a GaN crystal on the masked undersubstrate. The exposed undersubstrate parts produce pits by delaying the GaN growth thereupon and act as seeds for making the closed defect accumulating regions (H) (claim 64).

This negative mask method makes use of the difference of the growing speeds between the on-GaN growth and the on-non-GaN growth. The GaN buffer layer of the mask facilitates the GaN growth. The exposed undersubstrate in the holes of the mask suppresses the GaN growth, which makes the facet pits and the closed defect accumulating regions (H). The GaN negative mask can be made by photolithography like the aforementioned positive mask. But, the positive-, negative-parts are reciprocal to the positive mask method and this negative mask method. A sapphire substrate, a spinel substrate, a silicon carbide substrate and gallium arsenide (GaAs) substrate are promising candidates for the undersubstrate.

[Seeding Method 4 (Seed=Partially-Formed Mask on GaN Film: On-GaN Dotted Film Method)]

Seeds are produced by growing a GaN buffer layer upon an undersubstrate, piling a foreign material polycrystal or amorphous film mask on an undersubstrate, eliminating selectively unnecessary parts of the foreign material mask by photolithography and utilizing remaining film parts on the GaN buffer layer as seeds for initiating the closed defect accumulating regions (H) (claim 65). The DIS (defect inducing seed) mask of the on-GaN dotted film method takes a seed/GaN/undersubstrate structure. The seeds enable the facet growth to originate facet pits and closed defect accumulating regions (H) in series from the seeds.

[Seeding Method 5 (Seed=Partially-Formed Mask on Undersubstrate: On-Substrate Dotted Film Method)]

Seeds are produced by piling a foreign material polycrystal or amorphous film mask on an undersubstrate, eliminating selectively unnecessary parts of the foreign material mask by photolithography, and utilizing remaining film parts as seeds for initiating the closed defect accumulating regions (H) (claim 65). The DIS mask of the on-substrate dotted film method takes a seed/undersubstrate structure.

[Function of Seeds (FIG. 5)]

This invention implants seeds on an undersubstrate. The seed implanted substrate is divided into seeded parts and non-seeded parts. The non-seeded parts of the undersubstrate have a strong tendency of inducing crystallization of GaN heteroepitaxially. The seeded parts have a tendency of suppressing GaN growth. The seeds delay the GaN growth. When GaN epitaxial layers grow on neighboring non-seeded parts higher than a seed height, the layers override on the seeds and make GaN pits on the seeds. GaN films grown on the seeds make pits due to the delay of growth by the seed. The GaN grown on the seeds are simply designated by "an on-seed GaN crystal" or "on-seed crystal". The on-seed GaN crystal has wide a scope of variations for the sake of the difference of growth condition. The on-seed GaN crystals are sometimes polycrystal (A).

Sometimes on-seed GaN crystals are single crystal. Even if the GaN is identified as a single crystal, there are still variations of GaN single crystals with different orientations. An on-seed crystal (B) is a single crystal having a different, unique orientation which is antiparallel to the orientation of neighboring regions grown on the non-seeded parts. Another on-seed crystal (C) is a single crystal having a unique orientation of a common <0001> axis but a different orientation rotating around the <0001> axis from that of neighboring regions grown on the non-seeded parts. A further on-seed crystal (D) is a single crystal having a unique orientation slightly slanting from that of neighboring regions grown on the non-seeded parts. The on-seed crystals are the closed defect accumulating regions (H). Thus, the closed defect accumulating regions (H) have the same variations as the on-seed crystals.

[Collaboration of the ELO Mask and the Defect Inducing Seed (DIS) Mask 1 (Simultaneous)]

The dislocation density can be further reduced by collaboration of the ELO mask and the DIS mask of the present invention, since both masks have the function of reducing dislocations. The epitaxial lateral overgrowth (ELO) method had been contrived for making a low dislocation density GaN thin film on a sapphire substrate as mentioned before. The ELO method is a sophisticated method for lowering dislocations in a GaN film on an undersubstrate at an early stage of the growth by forming the ELO mask with regularly distributing small windows on the undersubstrate, growing epitaxially tiny isolated GaN films in the vertical direction on the exposed undersubstrate within the windows, turning growing directions of the GaN films from vertical to horizontal for overriding on the mask, guiding the GaN films to collide along bisectors between neighboring windows and reducing dislocations by the turn and the collision. Improved ELO methods on a GaAs substrate have been fully described in aforecited ⑥ Japanese Patent Application No.9-298300 and ② Japanese Patent Application No.10-9008. Since GaN films override upon the mask and extend in lateral direction on the mask, the method was called a "lateral" "overgrowth".

Many small windows are perforated in a regular pattern on an ELO mask. The ELO mask has a wider shielding area and a narrower open area. The rate of the shielding area is more than 50% at which the DIS mask is entirely different. A prevalent ELO pattern is a hexagonally symmetric pattern aligning many small equilateral triangles in six 60 degree rotating directions without margin and perforating small windows at corner points of the triangles. The DIS mask should not be confused with the ELO mask.

The ELO mask is clearly discernible from the DIS mask. One distinction is a difference of sizes. Another distinction is a ratio of the shielding area to the open area. The ELO mask has small windows (open area) and a small period of spacing. A window diameter and a spacing are several microns ($\mu$m). The shielding parts are wide and the open parts are narrow. The ELO mask is a negative type mask. The rate of the shielding area to the whole area is more than 50% (shielding rate>50%).

The DIS mask has wide seeds (shielding parts) of a 1 $\mu$m to 300 $\mu$m diameter and a large period of spacing of 50 $\mu$m to 2000 $\mu$m. A seed diameter and a spacing are far larger than the window size and spacing of the ELO mask. The shielding parts are narrow and the open parts are wide. The DIS mask is a positive type mask. The rate of the shielding area to the whole area is less than 50% (shielding rate<50%).

The functions are also different. The ELO mask has a function of killing dislocations at an early step of the growth. The DIS mask has a purpose of making closed defect accumulating regions (H).

The DIS mask has wider blank (exposed) parts. A complex DIS/ELO mask would be more effective than a single DIS mask or a single ELO mask. Thus, a complex DIS/ELO mask is fabricated. The DIS/ELO mask is produced by forming ELO masks only on the blank parts of the DIS mask (claim 66). An undersubstrate is covered with two different masks (DIS-shield-parts and ELO). For example, in FIG. 6($a$) the DIS mask is allotted to an undersubstrate with seeds at hexagonally symmetric spots, leaving continual wide blank parts 19. ELO masks are formed on the blank parts 19. The materials of the ELO mask and the DIS mask can be identical and be made of SiO$_2$, SiN, or metal. When both masks are made of the same materials, the masks can be formed at a stroke by evaporation, photolithography, or printing.

The functions of the individual masks in a complex mask are different. An ELO mask with tiny windows has a function of reducing dislocations at an early stage of growth by decreasing inner stress via isolated window-in growth and by changing twice the direction of extension of dislocations from vertical to horizontal and from horizontal to vertical. A defect inducing seed mask (DIS) positively makes facet pits and closed defect accumulating regions (H) at predetermined positions. During a middle stage and a final stage of the growth, the closed defect accumulating regions (H) absorb, arrest, annihilate and accumulate the dislocations which have been once decreased by the action of the ELO mask at the early stage. Dislocation density is greatly reduced in the accompanying low dislocation single crystal regions (Z) and the extra low dislocation single crystal regions (Y).

[Collaboration of ELO Mask and Defect Inducing Seed (DIS) Mask 2 (Sequential)]

Figure 6:
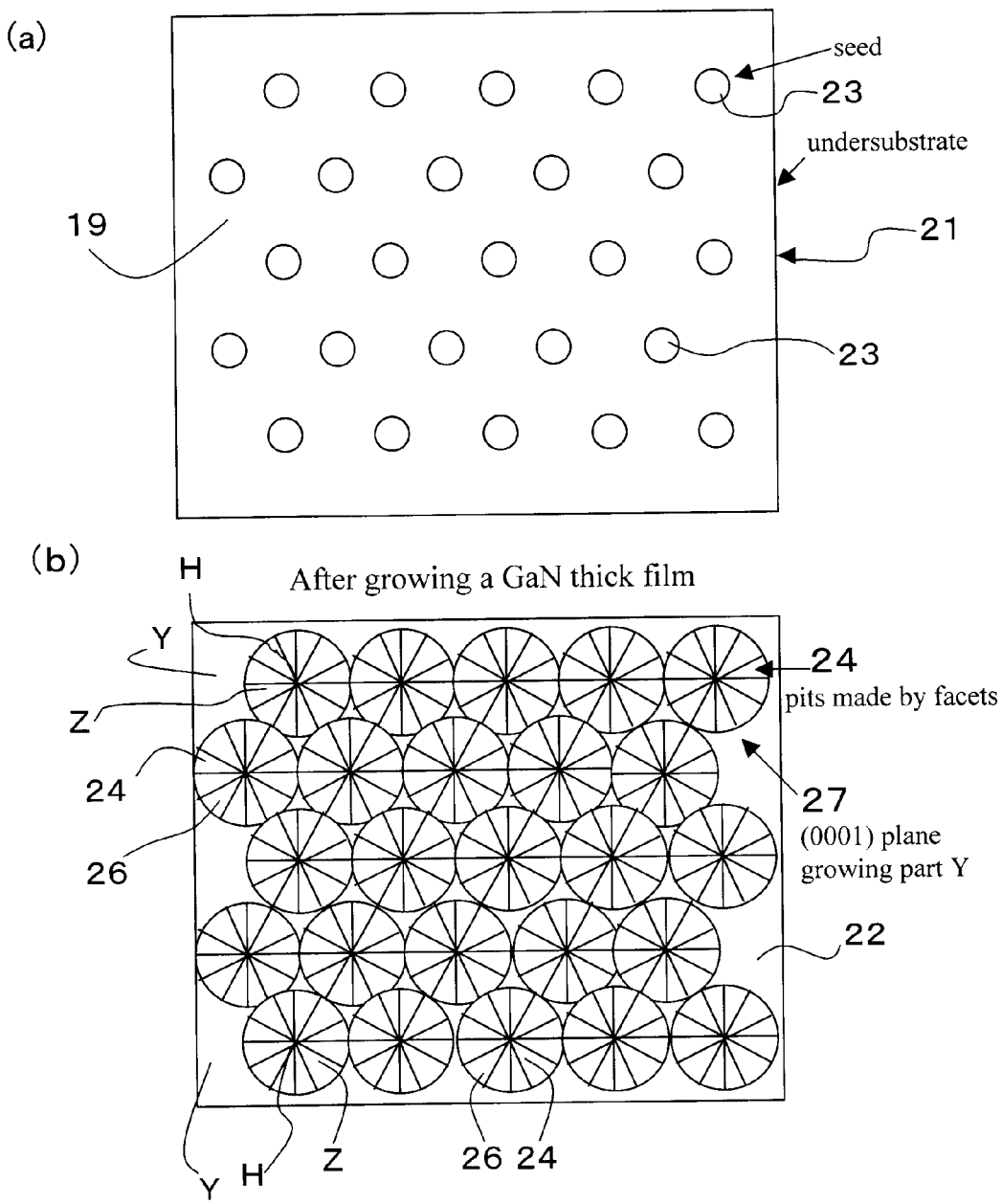
FIG. 6(a) is a plan view of seeds implanted upon an undersubstrate regularly and periodically at corner points of series of equivalent triangles aligning in a six-fold rotation symmetry pattern having equivalent 60 degree rotation directions.
FIG. 6(b) is a plan view of a GaN crystal grown with a (0001) surface on the seed-implanted undersubstrate. Dodecagonal pits built by facets appear just upon the seeds in the same six-fold rotation symmetry pattern. Centers of the pits are closed defect accumulating regions (H) on the seeds. Accompanying low dislocation single crystal regions (Z) are grown under the facets surrounding the closed defect accumulating regions (H). Extra low dislocation single crystal regions (Y) are formed under C-plane growing tops.

The former simultaneous collaboration of the epitaxial lateral overgrowth (ELO) mask and the defect inducing seed (DIS) mask which allocates the ELO mask to the vacant portion 19 on the undersubstrate without seeds as shown in FIG. 6($a$) has advantages of using a single mask unified the ELO mask with the DIS mask and of growing a GaN crystal at a stroke. However, the simultaneous collaboration method has a drawback of inducing different growing conditions to the seed regions and the non-seed (ELO) region. When the different condition is unfavorable, the simultaneous combined use of the ELO mask and the DIS mask should be avoided. A GaN crystal should be made by sequential double step growth of preparing an ELO mask on an undersubstrate, growing a GaN thin buffer layer on the ELO-masked undersubstrate, piling a defect inducing seed (DIS) mask on the GaN buffer layer, and growing another GaN film on the DIS-masked GaN buffer layer (claim 67). This is a sequential collaboration of the ELO method and the present invention method.

The above-mentioned ELO method forms an ELO mask on an undersubstrate or on a GaN buffer layer prepared on an undersubstrate. The ELO mask is made by piling an SiO$_2$ film or an SiN film (100 nm to 200 nm thickness) on an undersubstrate or a buffer layer and etching away (round, polygonal or striped) parts at corner points of equilateral triangles (of a side of several microns) aligning periodically in a hexagonal symmetric pattern layer. A GaN buffer layer of a thickness of 80 nm to 130 nm at a low temperature in vapor phase. The buffer layer conciliates lattice misfit by alleviating inner stress. A thin GaN layer is epitaxially grown on the GaN buffer layer at a high temperature. The ELO reduces dislocation density in the GaN epi-layer.

For sequential collaboration of ELO/DIS, seeds are implanted upon the GaN epi-layer piled on the ELO-masked undersubstrate. The seeds can be films or particles. Since the seed size and spacing are far larger than that of the ELO mask, the seeds in the DIS mask can be clearly discriminated from the ELO windows and shielding portions. When GaN is epitaxially grown on the ELO/DIS masked undersubstrate (or buffer layer), the seeds produce facet pits thereabove and the pits produce closed defect accumulating regions (H) thereunder. Accompanying low dislocation single crystal regions (Z) are produced under the facets around the closed defect accumulating regions (H). Extra low dislocation single crystal regions (Y) are made under flat top C-planes among the pits. Sequential collaboration of the ELO mask which reduces dislocations and the DIS mask which makes closed defect accumulating regions (H) for annihilating and accumulating dislocations can make further low dislocation density GaN crystals.

[Control of Positions of Facet Pits]

When a GaN crystal is grown on a seed-implanted undersubstrate (or a seed-implanted GaN buffer layer grown on an undersubstrate) by a facet growth method, a pit originates from every seed one to one. A seed makes a pit. The positions of pits coincide with the positions of the seeds. The positions of pits are controlled by seed implantation. This is the gist of the present invention. Comparison of FIG. 6(a) with FIG. 6(b) clarifies exact correspondence between the implanted seed positions and the pit positions.

The present invention implants seeds at predetermined positions on an undersubstrate, grows a GaN crystal and produces pits on the growing GaN crystal exclusively at the positions of the implanted seeds.

In the concrete, the present invention piles an amorphous film or polycrystalline film on an undersubstrate, patterns the film into discretely and periodically distributing film seeds, grows a GaN film and produces pits on the growing GaN film exclusively at the positions of the implanted film seeds. When a GaN crystal is grown on the undersubstrate patterned with amorphous or polycrystalline film seeds, growing conditions are different between seed parts and exposed undersubstrate parts. A pit is formed at the seed as a bottom, since GaN growth is delayed at the seed parts.

The seeds are films or particles made of metals, oxides or nitrides. The seeds can be prepared by a set of an undersubstrate and a GaN buffer layer patterned on the undersubstrate, which has been described already. Suitable amorphous film seeds are made of SiO$_2$ films and SiN films. Besides film seeds, particles are a good candidate for seeds. Particles can play a role of seeds. A particle seed method arranges particles at predetermined spots of a regular pattern on an undersubstrate or on a GaN buffer layer on an undersubstrate, grows a GaN crystal on the particle-arranged undersubstrate or GaN buffer layer, makes facet pits at the particles as seeds on the growing GaN crystal. The positions of the pits can be predetermined by the seed particles.

Metallic fine particles and oxide fine particles can be seed particles. GaN polycrystal particles and GaN single crystal particles are also employed as seed particles. Pits are formed just above seeds by arranging particles periodically and regularly on an undersubstrate, growing a GaN crystal on the particle-allotted undersubstrate and making facet pits. A closed defect accumulating region (H) accompanies a pit bottom. An accompanying low dislocation single crystal region (Z) is produced just below a facet. An extra low dislocation single crystal region (Y) follows the top C-plane outside of the pits. Seed particles can give a GaN crystal three different regions H, Y and Z as clearly as the film seeds.

[Production of a Flat GaN Substrate]

The preceding GaN growth methods have relied upon the C-plane growth without exception. The C-plane growth enables a GaN growing film to maintain a flat smooth surface without facets. The C-plane grown GaN crystal has a flat, smooth surface, which is an advantage. But, the C-plane grown GaN suffers from high density of dislocations, which is a serious drawback of the C-plane growth. The above-mentioned ELO (epitaxial lateral overgrowth) also grows a GaN film by maintaining a flat, smooth C-plane surface. Then, ELO-made GaN crystals have a flat, smooth C-plane surface.

The preceding Japanese Patent Laying Open No.2001-102307 (⑥) of the same inventors has proposed the concept of "facet growth" for the first time. The previous facet growth was a very novel and useful method for reducing dislocations in a GaN crystal. The previous facet growth lacked the concept of a closed defect accumulating region (H). Besides the facet growth, the present invention proposes creation of "closed defect accumulating regions" (H) by implanting seeds. The concept of the closed defect accumulating region (H) is novel. The "implantation of the seeds" is also new. The implantation of the seeds causes the closed defect accumulating regions (H). The positions and size of the closed defect accumulating regions (H) are determined by the positions and sizes of the seeds. The closed defect accumulating regions (H) can be controlled by the seed implantation. The present invention employs the facet growth which grows a GaN crystal on a rugged surface with many facet pits. GaN crystals produced by the method of the present invention have a rugged top surface with plenty of facet pits and a bottom surface of a foreign material undersubstrate.

Thus, the GaN crystals made by the present invention must be mechanically processed and polished. Mechanical processing and polishing give a smooth, flat top surface to the GaN wafer. The mechanical processing includes slicing process, grinding process, or lapping process (claims 69). The undersubstrate adhering to the bottom of the GaN crystal should be eliminated by etching, polishing or mechanical grinding. The undersubstrate-separated bottom should be further polished. Thus, the GaN wafer has smooth, flat top and bottom surfaces. LED devices and LD devices can be fabricated upon the finished GaN wafers.

This invention produces a flat, smooth GaN substrate by growing a GaN by facet growth, making closed defect accumulating regions (H), maintaining closed defect accumulating regions (H), making the best use of cores (S) and boundaries (K) of the closed defect accumulating regions (H) as dislocation annihilating/accumulating regions, reducing dislocations in surrounding accompanying low dislocation single crystal regions (Z) and extra low dislocation single crystal regions (Y), processing the grown GaN crystals mechanically for eliminating the facets, eliminating the undersubstrate from the bottom and polishing the surfaces of the GaN crystals into flat, smooth surfaces (claim 69).

This invention produces a flat, smooth GaN substrate by growing a GaN crystal by facet growth, forming pits composed of facets on a surface of the growing GaN crystal, making closed defect accumulating regions (H) following bottoms of the pits, maintaining closed defect accumulating regions (H), making the best use of cores (S) and boundaries (K) of the closed defect accumulating regions (H) as dislocation annihilating/accumulating regions, reducing dislocations in surrounding accompanying low dislocation single crystal regions (Z) and extra low dislocation single crystal regions (Y), processing the grown GaN crystals mechanically for eliminating the facets, eliminating the undersubstrate from the bottom and polishing the surfaces of the GaN crystals into flat, smooth surfaces (claim 69).

The mechanical processing is one, two or three of slicing process, grinding process and lapping process (claim 69).

The undersubstrate of the present invention is a single crystal substrate of gallium nitride (GaN), sapphire ($\alpha$-$Al_2O_3$), silicon carbide (SiC), spinel, gallium arsenide (GaAs) or silicon (Si) (claim 68).

By the above-mentioned method, a plurality of GaN wafers can be obtained. The method is growing a thick low dislocation GaN crystal on an undersubstrate and slicing the thick GaN crystal into a plurality of low dislocation GaN wafers (claim 70).

Further, a GaN substrate which has been produced by the present invention method and already has closed defect accumulating regions (H), low dislocation single crystal regions (Y), (Z), can be used as a seed and another thick GaN crystal is piled on the seed GaN undersubstrate. It is a new important discovery to a closed defect accumulating region (H) is correspondingly grown on a closed defect accumulating region (H) of the undersubstrate and an accompanying low dislocation single crystal region (Z) or an extra low dislocation single crystal region (Y) is broadly correspondingly grown on low dislocation single crystal regions (Y) and (Z). In other words, a pit bottom composed of facets is formed above the closed defect accumulating region (H) of the GaN undersubstrate and another closed defect accumulating region (H) is produced between the pit bottom and the closed defect accumulating region (H) of the undersubstrate. And slanting facets composing a pit and horizontal facets (C-planes) are formed above the single crystal regions (Y) and (Z) and another single crystal regions (Y) and (Z) are produced between the facet having horizontal surfaces and (Y), (Z) of the undersubstrate. Then, a low dislocation thick GaN ingot similar to the ingots of Embodiment 1 to 5 can be obtained by using the GaN undersubstrate of Embodiment 6 as a seed. A plurality of GaN wafers can be produced by slicing the GaN ingot (claims 71 and 72).

[Gallium Nitride Crystal Substrate]

A gallium nitride crystal substrate made by the teaching of the present invention is described. The substrate has experienced etching, mechanical processing and polishing. The GaN substrate is a smooth, flat wafer without an undersubstrate. The GaN substrate is transparent for human eyesight like glass. FIG. 7 shows an image of the GaN substrate crystal observed by the cathode luminescence (CL) method.

Concentric circles regularly align crosswise and lengthwise. The central smaller circles are the closed defect accumulating regions (H) which derive from the bottoms of the pits. The closed defect accumulating region (H) includes a core (S) and a grain boundary (K) encapsulating the core (S). A set of the boundary (K) and the core (S) or the single boundary (K) acts as a dislocation-annihilating/accumulating place. The seeds produce facet pits. The pit bottoms make the closed defect accumulating regions (H).

The seeds have been regularly arranged lengthwise and crosswise in a definite pattern on the undersubstrate. The closed defect accumulating regions (H) are also regularly arranged lengthwise and crosswise in the same definite pattern as the seeds.

The flat, smooth GaN substrate of FIG. 7 has neither pits nor seeds, because the GaN substrate has been etched, ground and polished. Closed defect accumulating regions (H) exist in the substrate. A blank round concentrically encircling the closed defect accumulating region (H) is an accompanying low dislocation single crystal region (Z) which has grown as slanting facets. The pits and facets have been eliminated by mechanical grinding. Loci or vestiges of the facets growing upward are the accompanying low dislocation single crystal regions (Z).

The accompanying low dislocation single crystal regions (Z) are circles (exactly speaking, dodecagons or hexagons). Almost all of the accompanying low dislocation single crystal regions (Z) have a common diameter. The neighboring accompanying low dislocation single crystal regions (Z) are in contact with each other. Extra portions held among the neighboring accompanying low dislocation single crystal regions (Z) are extra low dislocation single crystal regions (Y) which have grown with a C-plane top surface. The CL image can clearly discern the accompanying low dislocation single crystal regions (Z) from the extra low dislocation single crystal regions (Y) by the difference of brightness.

A gallium nitride (GaN) substrate of the present invention is a substrate having a closed defect accumulating region (H) and single crystal regions (Y and Z) enclosing the closed defect accumulating region (H) (claim 1).

It is a fundamental unit composed of H+Y+Z. When a GaN substrate having M units is divided into M small equivalent chips, a divided GaN chip contains only a single fundamental unit of H+Y+Z. Otherwise, when a vast pit is formed on a single GaN substrate, the GaN substrate contains only a single fundamental unit of H+Y+Z.

Alternatively, another gallium nitride (GaN) substrate of the present invention is a substrate having a plurality of fundamental units composed of a closed defect accumulating region (H) and single crystal regions (Y and Z) enclosing the closed defect accumulating region (H) (claim 2). The above description gives two basic gallium nitride substrates of the present invention.

[Variations of the Closed Defect Accumulating Regions (H)]

As already described till now, the closed defect accumulating regions (H) have variations. A closed defect accumulating region (H) is a polycrystal. A polycrystal includes a plurality of grains having various orientations different from that of the surrounding single crystal portions. Another closed defect accumulating region (H) is a single crystal having an orientation different from the surrounding single crystal portions. Single crystal closed defect accumulating regions (H) have further versions. One is a single crystal having a common <0001> axis but unique a-, b- and d-axes different from the surrounding single crystal portions. Another closed defect accumulating region (H) is a single crystal having a reverse <0001> axis antiparallel to the <0001> axis of the surrounding single crystal portions. A further closed defect accumulating region (H) is a single crystal having an orientation slightly different from the surrounding single crystal portions.

A. Polycrystalline Closed Defect Accumulating Region (H) (claim 3)

A closed defect accumulating region (H) is a polycrystal. Surrounding portions (Z and Y) are low dislocation density single crystals.

B. Single Crystal Closed Defect Accumulating Region (H) Having Different Orientation Another closed defect accumulating region (H) is more than one single crystal having an orientation slightly different from the surrounding portions (claim 4). The surrounding portions (Z and Y) are low dislocation density single crystals.

A further closed defect accumulating region (H) is more than one single crystal having a <0001> axis common to but three axes different from that of the surrounding portions (claim 5).

A further closed defect accumulating region (H) sometimes consists of more than one crystal grain having a <0001> axis which is antiparallel to a <0001> axis of the neighboring single crystal regions Z and Y.

In this case, (0001) Ga planes and (000-1) N planes are reverse outside or inside of the closed defect accumulating regions (H). The interface (K) is a grain boundary. Since the GaN crystal lacks inversion symmetry, the (0001) plane is not identical to the (000-1) plane.

Another closed defect accumulating region (H) sometimes consists of more than one crystal grain having orientations slightly slanting to the orientation of the neighboring single crystal regions Z and Y (claim 8).

A closed defect accumulating region (H) is sometimes separated by planar defect assemblies from the neighboring single crystal regions Z and Y (claim 9).

Another closed defect accumulating region (H) is separated by linear defect assemblies from the neighboring single crystal regions Z and Y (claim 9).

(Case C; H has the Same Crystal Orientations as Z and Y)

A closed defect accumulating region (H) has the same crystal orientations as the neighboring accompanying low dislocation single crystal regions (Z) and extra low dislocation single crystal regions (Y). And, the closed defect accumulating region (H) is separated by planar defect assemblies (claim 9).

Another closed defect accumulating region (H) has the same crystal orientations as the neighboring accompanying low dislocation single crystal regions (Z) and extra low dislocation single crystal regions (Y). But the closed defect accumulating region (H) is separated by linear defect assemblies (claim 9).

[Inner Structure of Closed Defect Accumulating Region (H)]

Closed defect accumulating regions (H) contain crystalline defects (dislocations, planar defect assemblies, liner defect assemblies). A closed defect accumulating region (H) has a boundary K and a core S. Sometimes the boundary (K) consists of linear defect assemblies or planar defect assemblies. The core (S) is sometimes accumulation of dislocations, linear defect assemblies or planar defect assemblies.

A closed defect accumulating region (H) containing many defects is separated by planar defect assemblies at an interface (K) from the neighboring single crystal regions (Y) and (Z) (claim 9).

Another closed defect accumulating region (H) containing many defects is separated by linear defect assemblies at an interface (K) from the neighboring single crystal regions (Y) and (Z) (claim 9).

Most of defects included in a core (S) of a closed defect accumulating region (H) are linear defect assemblies or planar defect assemblies (claim 10).

[Formation of Closed Defect Accumulating Region (H)]

Seeds marked or implanted on a substrate decide positions of closed defect accumulating regions (H). The closed defect accumulating regions (H) grow from the seeds in the vertical direction. The positions and the sizes of the closed defect accumulating regions (H) can be easily controlled by the implanted seeds. A small seed makes a small H. A big seed produces a big H. The diameter of the closed defect accumulating regions (H) ranges from 1 $\mu$m to 200 $\mu$m (claim 11). The diameter of the seeds determines the diameter of the closed defect accumulating regions (H).

The positions of Hs can be freely determined by the population of the seeds. Sometimes plenty of isolated closed defect accumulating regions (H) are populated on a substrate (dot-like Hs). The shape of the closed defect accumulating regions (H) is determined by the shape of the seeds to some extent. The dotted closed defect accumulating regions (H) have various shapes.

The shape of a closed defect accumulating region (H) is amorphous on the surface (claim 13).

The shape of another closed defect accumulating region (H) is circular on the surface (claim 13)

The shape of another closed defect accumulating region (H) is polygonal on the surface (claim 13).

Shapes of closed defect accumulating regions (H) depend upon shapes, seeds, crystal growth condition, and growth controlling condition.

[Population of Dislocation Density]

Dislocation density is not uniform in the GaN crystal substrate produced by the teaching of the present invention. The dislocation density is measured at various spots in the grown GaN crystal. An average of the dislocation density is less than $5\times10^6$ cm$^{-2}$ in the accompanying low dislocation single crystal regions (Z) and the extra low dislocation single crystal regions (Y) (claim 15).

The change of the dislocation density is examined more in detail.

Higher dislocation density of $1\times10^7$ cm$^2$ to $3\times10^7$ cm$^{--2}$ is observed in the single crystal regions (Z) and (Y) at narrow parts which are quite close to the closed defect accumulating regions (H) (claim 14). Extremely low dislocation density of $5\times10^4$ cm$^{-2}$ is also observed in the single crystal regions (Z) and (Y) at the parts distanced far from the closed defect accumulating regions (H).

Average dislocation density gradually decreases in the regions (Z) and (Y) in proportion to the distance from the closed defect accumulating regions (H) (claim 15). The fact means that the captivity of the dislocations by the closed defect accumulating regions (H) is not perfect. Some dislocations leak and escape from the closed defect accumulating regions (H) toward the accompanying low dislocation single crystal regions (Z).

Transmission electron microscope (TEM) observation, cathode luminescence (CL) measurement and etch pit density (EPD) measurement enable us to estimate the dislocation density.

[Orientation of GaN Substrate Crystal]

The effect of reducing the dislocation density depends upon the orientation of the GaN crystal. The dislocation reduction of the present invention is most effective to a GaN crystal having an average <0001> growing direction (c-axis growth). Dislocations are most conspicuously deduced when an average of the growing surfaces is a (0001) plane and the crystal is sliced to a C-plane crystal having a (0001) surface (claim 16). The final surface of the sliced GaN substrate crystal is a C-plane (0001).

[Direction of Dislocations]

The present invention makes a single crystal gallium nitride crystal by maintaining facets and facet pits on the surface and growing GaN along the c-axis. The bottoms of the facet pits are followed by the closed defect accumulating regions (H). The facets grow in the directions perpendicular to the facets. Dislocations on a facet are divided by half and pushed in the horizontal directions to two side boundaries of the facet. Horizontal arrows 98 and 99 in FIG. 4(1) show the directions of the extensions of dislocations on the facets. The dislocations on the boundaries are gathered along the boundaries to the center of the pit. Namely, the dislocations on the facets are swept toward the centers of the facet pits. Thus, the facet pits have a centripetal function acting upon the dislocations. The centripetal function gathers the dislocations to the bottom of the pits. The gathered dislocations form the closed defect accumulating regions (H) accompanying the pit bottoms. Almost all of the dislocations in the accompanying low dislocation single crystal regions (Z) are centripetally and horizontally directed in parallel with the C-plane toward the closed defect accumulating regions (H) (claim 20).

[Direction of Closed Defect Accumulating Region (H)]

In the case of the average c-axis growth, the closed defect accumulating regions (H) extend along the c-axis which is perpendicular to the C-plane (claim 21). The closed defect accumulating regions (H) span the thickness of the GaN crystal. The closed defect accumulating regions (H) extend in parallel with the average direction of the growth. When the flat tops of the GaN grown substrate are (0001) planes (C-planes), the closed defect accumulating regions (H) extend in the direction vertical to the surface.

The GaN crystals grown by the present invention have rugged surfaces, since many facets and pits are positively produced for reducing dislocations. The rugged surfaces require mechanical grinding and polishing for making flat, smooth GaN single crystal substrate wafers. In the case of the c-axis average growing direction, flat GaN wafers of a (0001) surface are obtained. When the closed defect accumulating regions (H) are polycrystals and orientations of (H) are reversed by 180° in the c-axis from the surrounding (Z) (Y), obtained GaN wafers have (000-1) surfaces (N surface) of (H) and (0001) surfaces (Ga surface) of (Y)(Z) (claims 17 and 18). In this case, after grinding, the (000-1) surface is a little lower than the surroundings, since the nitrogen surface is easier to be ground than the gallium surface (claim 19).

[Patterns of Closed Defect Accumulating Regions (H)]

Periodically distributing patterns of closed defect accumulating regions (H) are again described more in detail.

A GaN crystal of the present invention contains one fundamental unit or a plurality of fundamental units (claim 22). In the plural case, the GaN crystal favorably contains regularly aligning repetitions of fundamental units. A single fundamental unit consists of a closed defect accumulating region (H) extending in a direction vertical to the surface, an accompanying low dislocation single crystal region (Z) enclosing the closed defect accumulating region (H) and an extra low dislocation single crystal region (Y) lying around the accompanying low dislocation single crystal region (Z).

There are four allowable symmetric patterns in two dimensions.

α. six-fold rotation symmetry pattern (FIG. 8)
β. four-fold rotation symmetry pattern (FIG. 9)
γ. two-fold rotation symmetry pattern (FIG. 10)
δ. three-fold rotation symmetry pattern Seeds patterns α, β and γ have been repeatedly described. All the allowable patterns including δ are clarified here.

[α. Six-Fold Rotation Symmetry Pattern (FIG. 8, Claims 23 and 24)]

Fundamental units consisting of a closed defect accumulating region (H), an accompanying low dislocation single crystal region (Z) and an extra low dislocation single crystal region (Y) are allocated at six-fold rotation symmetric spots, that is, at corner points of many equivalent equilateral triangles aligning hexagonally without extra margin. The alignment is a closest packed arrangement in two dimensions (claim 23). Pits are not circles but dodecagons. But the following description deems the pit as a circle for simplicity. Neighboring pits are in outer contact to each other.

The pattern orientation can be determined by equalizing the direction of a side of the equilateral triangle or the direction of pitch p to a <1-100> direction of GaN as shown in FIG. 8(b)(claim 24). The diameter of a pit is denoted by "d". Pitch of the seeds is denoted by "p". A "pitch direction" is defined as a direction parallel with a side of the fundamental triangle. The pattern gives p=d for the pit diameter d and pitch p. M-planes {1-100} are cleavage planes. The cleavage direction is a <11-20> direction.

The orientation of the seed pattern can be determined, for example, by equalizing the pitch direction "p" to a <11-20> direction of GaN (claim 24, FIG. 8(a)). Pitch p is equal to the pit diameter d (p=d). The spacing h between parallel neighboring arrays of the closed defect accumulating regions (H) is short ($3^{1/2}d/2$), when a grown, finished GaN wafer is cleaved along a <11-20> direction (namely, along a (1-100) plane). In an array, a spacing between neighboring closed defect accumulating regions (H) is h=p. A period q perpendicular to the cleavage line is long (q=$3^{1/2}d$).

Sectional areas of H, Z and Y are compared. A ratio of Z to Y is solely determined by the pit pattern. But, anther ratio between Z and H which are concentric with each other is not determined by the pattern. A radius ratio of Z to H is denoted by ξ (ξ>1).

Z:H=$\xi^2$−1:1

Y:(H+Z)=$2 \times 3^{1/2}$−π:π=1:10

The pattern minimizes the area of the extra low dislocation single crystal regions (Y) (about 9%). The extra low dislocation single crystal regions (Y) made by the C-plane growth have low electric conductivity. The pattern having the least ratio of Y is suitable for making conductive GaN substrates.

[β. Four-Fold Rotation Symmetry Pattern (FIG. 9, Claims 25 and 26)]

Fundamental units consisting of a closed defect accumulating region (H), an accompanying low dislocation single crystal region (Z) and an extra low dislocation single crystal region (Y) are allocated at four-fold rotation symmetric spots, that is, at corner points of many squares aligning lengthwise and crosswise without extra margin (claim 25).

The pattern orientation can be determined by equalizing the direction of a side of the square to a <1-100> direction of GaN as shown in FIG. 9(a) (claim 26). The pattern gives p=d for the pit diameter d and pitch p. M-planes {1-100} are cleavage planes. The cleavage direction is a <11-20> direction. When the GaN crystal is cleaved in a <11-20> direction, a spacing h between serially neighboring closed defect accumulating regions (H) is smaller (h=d). Another spacing q between parallel neighboring closed defect accumulating regions (H) is also smaller (q=d).

Alternatively, the pattern orientation can be otherwise determined by inclining the direction of a side of the square at 45 degrees to a <1-100> direction of GaN as shown in FIG. 9(b) (claim 26). The pattern gives p=d for the pit diameter d and pitch p. M-planes {1-100} are cleavage planes. The cleavage direction is a <11-20> direction. When the GaN crystal is cleaved in a <11-20> direction, a spacing h between serially neighboring closed defect accumulating regions (H) is longer (h=$2^{1/2}d$). Another spacing q between parallel neighboring closed defect accumulating regions (H) is also small (q=$2^{1/2}d$).

Sectional areas of H, Z and Y are compared.

$Z:H = \xi^2 - 1 : 1$ $Y:(H+Z) = 4 - \pi : \pi = 1 : 3.66$

Here, $\xi$ is a rate of a radius of Z to a radius of H. The extra low dislocation single crystal regions (Y) are wider than the former pattern. The spacing between the neighboring closed defect accumulating regions (H) is also increased. The four-fold rotational symmetric pattern is optimum for producing square-shaped devices.

[γ. Two-Fold Rotation Symmetry Pattern (FIG. 10, Claims 27 and 28)]

Fundamental units having a closed defect accumulating region (H), an accompanying low dislocation single crystal region (Z) and an extra low dislocation single crystal region (Y) are allocated at corners of basic rectangles which are disposed in a two-fold rotation symmetry pattern on an undersubstrate without extra space (claim 27). $\zeta$ denotes a ratio of the longer side to the shorter side of the basic rectangles ($\zeta > 1$).

The pattern orientation can be specified by the direction of the shorter or longer side of the basic rectangles. An orientation of the pattern can be determined by equalizing a direction of a shorter side to a <11-20> direction of GaN (claim 28; FIG. 10(a)). A shorter pitch p is equal to the pit diameter (p=d). A longer pitch is $\zeta$d. When a GaN of the pattern is cleaved along a <11-20> direction, a serial pitch h of the serially aligning closed defect accumulating regions (H) is shorter (h=d) and a parallel pitch q of the parallel aligning H is longer (q=$\zeta$d).

Another orientation of the pattern can be determined by equalizing a direction of a shorter side to a <1-100> direction of GaN (claim 28; FIG. 10(b)). A shorter pitch p is equal to the pit diameter (p=d). A longer pitch is $\zeta$d. When a GaN of the pattern is cleaved along a <11-20> direction, a serial pitch h of the serially aligning closed defect accumulating regions (H) is longer (h=$\zeta$d) and a parallel pitch q of the parallel aligning H is shorter (q=d). Comparison of sectional areas of H, Z and Y are as follows, $Z:H = \xi^2 - 1 : 1$ ($\xi$ is the ratio of the Z radius to the H radius.)

$Y:(H+Z) = 4\zeta - \pi : \pi = 1 + 4.66(\zeta - 1) : 3.66$

An area of the extra low dislocation single crystal regions (Y) is wide. The spacing between neighboring closed defect accumulating regions (H) is widened. This pattern is suitable for making square chip or rectangular chip devices.

[δ. Three-Fold Rotation Symmetry Pattern]

Fundamental units consisting of a closed defect accumulating region (H), an accompanying low dislocation single crystal region (Z) and an extra low dislocation single crystal region (Y) are allocated at three-fold rotation symmetric spots, that is, at corner points of many equivalent equilateral hexagons aligning trigonally without extra margin. The pattern is not shown in a figure.

A pitch direction p is defined as a direction parallel to a side of the basic hexagon. An orientation of the three-fold pattern can be determined by equalizing the pitch direction "p" to a <1-100> direction of GaN. Another orientation of the three-fold pattern can be determined by equalizing the pitch direction "p" to a <11-20> direction of GaN.

Sectional areas of H, Z and Y are compared. A ratio of Z to Y is solely determined by the pit pattern. But, another ratio between Z and H which are concentric with each other is not determined by the pattern. A radius ratio of Z to H is denoted by $\xi$ ($\xi > 1$).

$Z:H = \xi^2 3^1 : 1$ $Y:(H+Z) = 3 \times 3^{1/2} - \pi : \pi = 1 : 1.5$

The pattern maximizes the area of the extra low dislocation single crystal regions (Y) (about 40%) which is about forth times as wide as the hexagonal pattern a. Wide extra low dislocation single crystal regions (Y) gives high freedom of allocating chip areas on a GaN wafer.

[Pitch of Closed Defect Accumulating Regions (H)]

A pitch which is a distance between central points of neighboring Hs is 50 p m to 2000 μm (claim 29). The range originates from a restriction of making pits.

[Penetration of Closed Defect Accumulating Regions (H) into a GaN Substrate]

A GaN crystal made by the present invention has closed defect accumulating regions (H) extending long along a c-axis. Closed defect accumulating regions (H) penetrate a GaN substrate along the c-axis (claim 30).

A GaN crystal made by growing in a c-axis direction has closed defect accumulating regions (H) extending long along the c-axis. The closed defect accumulating regions (H) penetrate a GaN substrate in the direction of thickness from the top to the bottom.

Laser diode devices can be made on a GaN single crystal substrate prepared by the present invention. Since the GaN single crystal substrate has low dislocation density and high conductivity, long lifetime and high quality laser diodes are obtained.

The present invention can be carried out by employing any one of an HVPE method, a CVD method, an MOC method and a sublimation method.

DETAILED DESCRIPTION OF THE PREFERRED EMBODIMENTS

[Embodiment 1 (Sapphire Undersubstrate, FIG. 11)]

FIG. 11 shows steps of making a GaN substrate. A starting undersubstrate is a sapphire C-plane wafer 51. FIG. 11(1) denotes the sapphire undersubstrate 51. Sapphire has trigonal symmetry. GaN has hexagonal symmetry. Almost all the InGaN-LEDs sold on the market employ C-plane sapphire as a substrate. A substrate is different from an undersubstrate, here. Don't confuse a substrate with an undersubstrate.

A 2 μm thick GaN epi-layer 52 is preliminarily made on the sapphire undersubstrate 51 by an MOCVD method. Samples have a GaN C-plane surface.

A 100 nm thick $SiO_2$ film is formed upon the GaN epi-layer 52 for distributing many seeds regularly and making a seed pattern on the epi-layer 52. The seed pattern 53 is a hexagonal pattern having many round dots 53 placed at corner points of equivalent equilateral triangles having a <11-20> side aligning in two dimensional directions without extra margin on the epi-layer. Seeds of $SiO_2$ in the predetermined pattern are formed by etching other parts of round dots allotted on the corner points of the basic triangles by photolithography. Remaining round dots are seeds 53. The seed pattern is called a DIS mask. The (DIS) seed pattern is hexagonal symmetry in accordance with hexagonal symmetry of GaN.

Four different hexagonal symmetric seed patterns A, B, C and D with different diameters and pitches are made on the GaN layer. Diameters and pitches of the patterns are as follows. The pitch is a unit size of symmetry operation. Here, the pitch is a length of a side of basic equilateral triangles.

| Pattern A | dot diameter | 50 μm; | pitch | 400 μm |
| Pattern B | dot diameter | 200 μm; | pitch | 400 μm |
| Pattern C | dot diameter | 2 μm; | pitch | 20 μm |
| Pattern D | dot diameter | 300 μm; | pitch | 2000 μm |

Specimens having seed patterns A, B, C and D are named Samples A, B, C and D respectively.

(1) Growth of Sample A and Sample B

GaN crystals are grown on Sample A of Pattern A and on Sample B of Pattern B by an HVPE method. A vertically tall hot-wall furnace contains a Ga-boat filled with metal Ga at an upper point and a susceptor at a lower spot for sustaining samples. The sample is put upon the susceptor. GaN crystals are grown on the same condition on Sample A and Sample B.

The Ga-melt in the Ga-boat is supplied with hydrogen ($H_2$) gas and hydrochloride (HCl) gas through a top gas inlet. The susceptor is supplied with hydrogen ($H_2$) gas and ammonia ($NH_3$) gas through another top gas inlet. Hydrogen ($H_2$) gas is a carrier gas.

In the furnace at atmospheric pressure, the Ga-boat is heated above 800° C. and the sapphire undersubstrate is heated and maintained at 1050° C. Molten Ga and HCl gas synthesizes gallium chloride (GaCl). Falling downward toward the sapphire undersubstrate, GaCl reacts with ammonia ($NH_3$) gas and synthesizes gallium nitride (GaN). GaN is piled upon the GaN epi-layer 52 and the seed 53.

(Epitaxial Growth Condition)

| | |
|---|---|
| Growing temperature | 1050° C. |
| $NH_3$ partial pressure | 0.3 atm (30 kPa) |
| HCl partial pressure | $2.0 \times 10^{-2}$ atm (2 kPa) |
| Growth time | 10 hours |
| Layer thickness | 1200 µm |

The epitaxial growth makes Sample A having a 1200 µm thick GaN epi-layer on Pattern A and Sample B having a 1200 µm thick GaN epi-layer on Pattern B. FIG. 11(4) shows sections of the samples.

[Observation of Sample A (SEM, TEM, CL)]

Samples A and B are examined by SEM (scanning electron microscope), TEM (transmission electron microscope) and CL (cathode luminescence). Sample A reveals reverse dodecagonal cone pits built by facets 56 prevalently distributing on the surface. The SEM confirms periodical, regular alignment of the pits on Sample A.

The alignment rule of the pits is equal to the rule of the seed pattern. The positions of the pit centers 59 exactly coincide with the initial positions of the seeds 53. There is a bottom (center) of a pit just above every seed. Pit centers align at corner points of many equilateral triangles repeatedly allotted on the sample. A side of the triangle is 400 µm. Namely, the pattern has a 400 µm pitch.

The diameter of a pit appearing on Sample A is about 400 µm. The diameter is equal to the pitch (d=p). The fact means that pits conically grow on the seeds and the pits are in contact with neighboring ones.

The observation means that the pits have grown on the ($SiO_2$) seeds 53 which were formed upon the corner points of basic equilateral triangles covering the undersubstrate without margin and aligning in hexagonal symmetry. FIG. 11(4) shows a reverse-conical pit, a closed defect accumulating region (H) 55 following a pit bottom 59 and a interface 60 enclosing the closed defect accumulating region (H) 55. Flat top parts 57 are formed between neighboring pits. C-plane grown flat tops 57 are asteroidal parts remaining among the pits.

Relations between grown GaN crystal parts and pits are described for promoting the understanding of the present invention. There are parts grown on seeded parts and other parts grown on non-seed parts. The parts grown on the seeded parts are closed defect accumulating regions (H) 55 and pit bottoms 59. The seed ($SiO_2$) retards GaN growth. The parts above the seeds grow at the slowest speed. The delay makes pits. Pits collect dislocations. Then, a closed defect accumulating region (H) is born at the seed following the pit bottom. While GaN grows, the closed defect accumulating region (H) extends upward, following the pit bottom. A pit bottom 59, a closed defect accumulating region (H) and a seed form a central unit vertically extending. A seed-guiding set of a pit, a closed defect accumulating region (H) and a seed is significant in the present invention.

Other regions grown under facets 56 are accompanying low dislocation single crystal regions (Z) 54. The regions are single crystals of low dislocation density. An accompanying low dislocation single crystal region (Z) concentrically encloses a closed defect accumulating region (H). A seed periphery, an accompanying low dislocation single crystal region (Z) and a facet form a tubular set of vertically stretching. Flat top parts 57 remain among pits. Regions grown under the flat top parts 57 are extra low dislocation single crystal regions (Y) 58. The regions are also single crystals with low dislocation density. A non-seeded part, an extra low dislocation single crystal region (Y) and a flat top form an extra set of vertically extending.

Electron microscope observations reveal that extra top parts 57 among dodecagonal pits are all mirror-flat (0001) planes. Facets in pits are assemblies of {11-22} planes and {1-101} planes. There are another sets of facets of milder slopes at the bottoms 59 of the pits.

Sample A is cleaved in a cleavage plane {1-100}. Sections of the pits appearing on the cleaved section are observed by the SEM and the CL.

The SEM and the CL observations confirm that unique parts discernible from other parts extend from the pit bottoms in a vertical direction. Vertically-extending parts (closed defect accumulating regions (H)) are 40 µmφ round dots. The closed defect accumulating regions (H) have a darker contrast than other parts in an CL image. Observation of cleaved sections shows the unique part (closed defect accumulating region (H)) extending in a vertical direction.

A columnar region just under a pit bottom is analyzed by the CL and the TEM. The under-bottom region is enclosed by a dark linear interface 60. The analysis reveals that the state of dislocations in the under-bottom region is entirely different from other parts. The under-bottom region is full of dislocations. Dislocation density is $10^8$ cm$^{-2}$ to $10^9$ cm$^{-2}$ in the under-bottom region. The dark linear boundary 60 which will be identified as a grain boundary (K) turns out to be an assembly of dislocations.

It is confirmed that the part 55 (core (S)) enclosed by the interface 60 (grain boundary (K)) is an assembly of crystal defects. This vertically extending part having three dimensional structure includes plenty of crystal defects and is enclosed by a clearly-observed interface (boundary (K)). Thus, the inner part is called a core (S). A sum of the core (S) and the boundary (K) is a closed defect accumulating region (H) (H=S+K). The closed defect accumulating region (H) has far more dislocations than other parts Z and Y. It is important to discriminate the closed defect accumulating region (H) from other parts Y and Z.

The closed defect accumulating region (H) is produced on the seed 53 in FIG. 11 (3). Thus, the positions of the closed defect accumulating regions (H) can be controlled by allocating the seeds at predetermined spots on a starting substrate. The present invention is endowed with a promising prospect and a wide utility by the controllability of the closed defect accumulating regions (H).

Attention is paid to other parts outside of the closed defect accumulating regions (H) which consists of an inner core (S) and a boundary (K). The dislocation density is very low outside of the boundary (K). The dislocation density drastically varies at the boundary (K). Outer parts quite close to the boundary (K) have medium high dislocation density of $10^6$ cm$^{-2}$ to $10$ cm$^{-2}$. The dislocation density rapidly decreases in proportion to the distance between H and a measuring spot. External parts outside of the boundary (K) have far lower dislocation density (e.g., $10^4$ cm$^{-2}$ to $10^5$ cm$^2$) than the closed defect accumulating region (H). An average of the dislocation density is less than $5\times10^6$ cm$^{-2}$ in the outer single crystal regions (Z) and (Y). The dislocation density decreases in the outer single crystal regions (Z) and (Y) in proportion to the distance from the center 59 of the pits.

There is a small number of dislocations in the accompanying low dislocation single crystal regions (Z). Threading dislocations run in horizontal directions in parallel with C-plane. The dislocations centripetally converge to the closed defect accumulating region (H). The dislocation density in the accompanying low dislocation single crystal regions (Z) decreases along the direction of growth from the bottom to the top, since the dislocations are absorbed by the closed defect accumulating region (H).

The facts suggest that dislocations out of the closed defect accumulating region (H) are swept by the facets to the center of the pit and are accumulated at the interface. Thus, the dislocation density is low outside of the interface and high at the interface. Some of the gathered dislocations go into the core (S) and are arrested in the core (S).

Outer part of the closed defect accumulating regions (H) is divided into two different regions. One region 54 is made and qualified to low dislocation by a passage of facets 56. This region accompanies a closed defect accumulating region (H). The region 54 is an accompanying low dislocation single crystal region (Z).

The other region 58 is made by C-plane growth. This is a single crystal with low dislocation density. Although facets did not pass the region 58, the region is converted into low dislocation density by the influence of facets.

A plane cannot be fully covered with a set of equivalent circles or equivalent dodecagons without margin. Some portions remain uncovered with pits. The remainder is extra low dislocation single crystal regions (Y).

The whole surface (T) of the GaN crystal made by the present invention is a sum of closed defect accumulating regions (H), accompanying low dislocation single crystal regions (Z) and extra low dislocation single crystal regions (Y).

T=H+Z+Y.
H=S+K.

Definitions of significant parts promote the understanding of the structure of a GaN crystal of the present invention.

Attention is paid to a relation between the closed defect accumulating region (H) and the facets 56. Majority facets constructing pits are {11-22} planes and {1-101} planes. Sometimes milder slanting facets appear at bottoms 59 of pits (FIG. 5(b)(3)). What are the shallower, milder facets?

Analysis shows that the milder slanting facets are tops of a closed defect accumulating region (H). The milder facets are parts of a boundary (K). In Sample A, the milder facets lead the closed defect accumulating region (H).

The milder slanting lower facets 59 join lower end of the upper facets 56. The milder slanting lower facets 59 continue to the grain boundary (K) extending the c-axis direction at the periphery. The milder slanting lower facets 59 join the core extending in the c-axis direction at the center. The core (S) and the boundary (K) form a closed defect accumulating region (H). The core (S) has high dislocation density. {11-22} facets and {1-101} facets gather dislocations to the pit center bottom. The converged dislocations are partly annihilated and partly accumulated in the closed defect accumulating regions (H). Once accumulated dislocations cannot escape from the closed defect accumulating regions (H). Surrounding regions deprived of dislocations become accompanying low dislocation single crystal regions (Z) and extra low dislocation single crystal regions (Y).

Facet growth of the present invention makes facet pits at seeds on a GaN surface, produces closed defect accumulating regions (H) following pit bottoms, converges defects into the boundaries (K) or into the boundaries (K) and the core (S), and reduces dislocations in the surrounding regions around the closed defect accumulating regions (H).

[Observation of Sample B (SEM, TEM, CL)]

Sample B is examined by the SEM, TEM and CL. The result is similar to Sample A. But, closed defect accumulating regions (H) have about an 180 μm diameter which is far larger than Sample A (40 μmφ). The closed defect accumulating region (H) of Sample B is more than four times in diameter and 20 times in area as large as Sample A. The closed defect accumulating region (H) is columnar in three-dimensional shape but amorphous in two-dimensional shape.

Closed defect accumulating regions (H) of Sample B are examined. The closed defect accumulating region (H) turns out to be one or more than one single crystal grain of a slightly slanting orientation to the surrounding single crystals. A closed defect accumulating region (H) of Sample B includes dislocations, planar defects and slightly slanting grains.

[Processing of Sample A and Sample B]

GaN substrates of Sample A and Sample B should be mechanically processed. The bottom sapphire undersubstrate is ground away by mechanical grinding. The facetted rugged top surface is flattened by mechanical grinding. As-ground GaN wafers are further polished into flat, smooth transparent GaN substrates. 1 inchφ (2.5 cmφ) GaN substrate wafers are obtained. The wafers are transparent for human eyesight like a glass plate. FIG. 11(5) shows a section of a CL (cathode luminescence) image of a GaN finished wafer. Closed defect accumulating regions (H) extend in the direction of thickness in the wafer and penetrate the wafer from the top to the bottom. The closed defect accumulating region (H) 55 regularly align with a certain pitch in two dimensional directions. The closed defect accumulating regions (H) are enclosed by the grain boundaries (K) 60. Accompanying low dislocation single crystal regions (Z) 54 encircle the closed defect accumulating regions (H) 55. Middle regions 58 between the neighboring closed defect accumulating regions (H) 55 are extra low dislocation single crystal regions (Y) 58.

Samples A and B are a GaN substrate having C-plane surfaces. The wafer is flat and transparent. An optical microscope cannot discern inner structures. CL images show a history of growth by the variations of contrasts. A CL picture irradiated with 360 nm wavelength light which is nearly equal to the band gap of GaN indicates inner structures of the wafer. The CL picture shows that closed defect accumulating regions (H) align with a 400 μm pitch which is the same pitch as seeds 53.

In the CL picture, closed defect accumulating regions (H) take dark contrast in many cases. But, closed defect accumulating regions (H) take bright contrast in the CL image in some cases. The closed defect accumulating regions (H) can be determined as a dark contrast or a bright contrast in the CL image.

The CL image shows a closed defect accumulating region (H) made by the facets 56 as a dodecagonal bright contrast part.

The extra low dislocation single crystal regions (Y) under the flat tops are dark contrast parts in a CL picture. The region Y is formed by the C-plane growth. Namely, H is mainly dark and sometimes bright, Z is bright and Y is dark in the CL picture. The CL facilely discerns the closed defect accumulating regions (H), the accompanying low dislocation single crystal regions (Z) and the extra low dislocation single crystal regions (Y).

Extending along a c-axis, the closed defect accumulating regions (H) are perpendicular to the GaN substrate and penetrate the GaN substrate. Sometimes, surfaces of the (H)s are found a little hollow. It was found that Sample A had hollows of 0.3 $\mu$m depth at the (H)s. This seems to be caused from a little difference of a grinding speed in (H)s from other parts.

Since the finished GaN substrate wafer is flat and smooth, the measurement of threading dislocation density is easy. Dislocations can be observed by the CL, the etch pit measurement, and the TEM. The observation on a CL picture is the easiest.

In the CL image, thread dislocations appear as dark points. Samples A and B show convergence of thread dislocations in the cores (S) and linear aggregation of dislocations on the boundaries (K) of the closed defect accumulating regions (H). The linear aggregation on the boundary (K) corresponds to a planar defect in a three dimensional space. The closed defect accumulating regions (H) are discernible by dark closed encircling boundaries (K) in the CL image.

The closed defect accumulating regions (H) are 40 $\mu$m$\phi$ dots (seed is 50 $\mu$m$\phi$) in Sample A. The shapes are rectangular or amorphous. The closed defect accumulating regions (H) are 180 $\mu$m$\phi$ dots (seed is 200 $\mu$m$\phi$) in Sample B. The shapes are circularly amorphous. Only difference between Sample A and Sample B is diameters of the closed defect accumulating regions (H). The observation confirms that the sizes of the closed defect accumulating regions (H) are predetermined by sizes of seeds. A bigger seed creates a bigger closed defect accumulating region (H). A smaller closed defect accumulating region (H) originates from a smaller seed.

Both in Sample A and Sample B, closed defect accumulating regions (H) have high dislocation density. Outside of H, dislocation density rapidly decreases in proportion to the distance from the boundary (K). In some cases, dislocations suddenly reduces outside of the boundary (K). Average dislocation density is less than $5 \times 10^6$ cm$^{-2}$ in the accompanying low dislocation single crystal regions (Z) and the extra low dislocation single crystal regions (Y). Dislocations centripetally run in parallel to the C-plane in the accompanying low dislocation single crystal regions (Z) and the extra low dislocation single crystal regions (Y). Dislocations are gathered, absorbed, annihilated and arrested in K and H. Thus, the dislocations are reduced in the surrounding regions Z and Y.

Sample A and Sample B are heated and etched in a KOH solution. In Sample B, there are parts which are subject to be etched in the closed defect accumulating regions (H). The accompanying low dislocation single crystal regions (Z) and the extra low dislocation single crystal regions (Y) have high resistance against etching. The closed defect accumulating regions (H) have etchable parts and unetchable parts. (0001) Ga planes which have only Ga atoms exposed on the surface are unetchable. (000-1)N planes which have only N atoms exposed on the surface are etchable. The fact indicates that the accompanying low dislocation single crystal regions (Z) and the extra low dislocation single crystal regions (Y) have stronger (0001)Ga planes on the surface. On the contrary, the closed defect accumulating regions (H) have partly (0001) Ga surfaces and partly (000-1)N surfaces. The fact indicates that a part of the closed defect accumulating regions (H) has a reverse polarity <000-1> and the other part has a normal polarity <0001> common with the surrounding (Y) and (Z) in Sample B.

Further, observations on Sample A reveal that most of closed defect accumulating region (H) surfaces become hollow by the KOH solution etching. And analyses by TEM observations showed that most of the closed defect accumulating regions (H) of Sample A are single crystals having the reversed orientation of 180 to a <0001> direction of the surrounding single crystal parts (Z), (Y). In other words, surfaces of the surrounding single crystal parts (Z), (Y) are unetchable Ga planes (0001) and surfaces of (H) are etchable N planes (000-1) in Sample A. More detailed analyses clarified that many closed defect accumulating regions (H) in Sample A have a plurality of crystal particles of the reversed orientation to <0001>.

From the results, the inventors supposed that as growing the crystal of Sample A, shallower facets of pits in Sample A corresponding to the closed defect accumulating regions (H) have plane indices of {11-2-4}, {11-2-5}, {11-2-6}, {1-10-2}, {1-10-3}, and {1-10-4}.

Sample A GaN substrate (50 $\mu$m$\phi$ seeds) and Sample B GaN substrate (200 $\mu$m$\phi$ seeds) have a common property except the size of the closed defect accumulating regions (H). Sample A (50 $\mu$m$\phi$ seeds) has about 40 $\mu$m$\phi$ closed defect accumulating regions (H). Sample B (200 $\mu$m$\phi$ seeds) has about 180 $\mu$m$\phi$ closed defect accumulating regions (H). More effective exploitation requires narrower closed defect accumulating regions (H), wider accompanying low dislocation single crystal regions (Z) and wider extra low dislocation single crystal regions (Y).

Smaller seeds produce smaller closed defect accumulating regions (H). But, an excess small seed cannot make a closed defect accumulating region (H). Without the formation of the closed defect accumulating regions (H), dislocation density cannot be reduced in the single crystal portions (Z, Y). Thus, a seed should have a diameter larger than a definite lower limit. The lower limit should be determined for seeding.

[Growth of Sample C (Sapphire Substrate, 2 $\mu$m$\phi$ seeds, 20 $\mu$m Pitch)]

Sample C employs a hexagonal symmetric seed pattern of FIG. 8(a) arranging many equilateral triangles of a 20 $\mu$m side and allotting 2 $\mu$m$\phi$ seeds (SiO$_2$) on corners of the equilateral triangles. Sample C is prepared by implanting SiO$_2$ seeds on a sapphire substrate. Sample C shows small seeds and small pitch repetitions for clarifying the lowest limit of seeds and pitch. Like Samples A and B, Sample C is grown by an HVPE method by the same facet growth condition. But, the 2 $\mu$m$\phi$ (SiO$_2$) seeds are buried by GaN at an early stage. No closed defect accumulating region (H) is produced from the seed. Facet pits are made. The facet pits are vacant pits without closed defect accumulating regions (H). The seeds cannot determine the positions of facet pits. Positions of pits are uncontrollable.

Then, an MOCVD method is employed instead of the HVPE method. The MOCVD has a slower growing speed than the HVPE method. A slow growth speed will enable facet pits to rise from the (SiO$_2$) seeds.

The MOCVD employs Ga-containing metallorganic materials as a Ga-source instead of Ga-metal. Material gases are trimethylgallium (TMG;(CH$_3$)$_3$Ga), ammonia (NH$_3$) and hydrogen (H$_2$) in the MOCVD.

A GaN crystal is made by setting a seed-implanted sapphire undersubstrate of Sample C on a susceptor in a cold-wall furnace, heating the undersubstrate at 1030° C., supplying the material gases in a rate of TMG:NH$_3$=1:2000 at atmospheric pressure, and growing a GaN film on the seeded sapphire undersubstrate. The growing speed is 4 μm/h. The growing time is 30 hours. The thickness of the produced GaN film is about 120 μm.

The MOCVD enables the seeds to induce facet pits and the facet pits to make closed defect accumulating regions (H).

Sample C has small seeds of a 2 μm diameter which induces a 1 μmφ closed defect accumulating region (H) accompanying a pit bottom. In Sample C, the seeds can determine sizes and positions of the closed defect accumulating regions (H).

An accompanying low dislocation single crystal region (Z) grows under the facets 56. A small facet pit makes a small round accompanying low dislocation single crystal region (Z). TEM examination confirmed that a part Z is a single crystal with low dislocation density. The flat tops 57 (C-plane) produced extra low dislocation single crystal regions (Y). TEM confirmed that a part Y is a single crystal with low dislocation density. Sample C has a feature of very small closed defect accumulating regions (H). Although the HVPE method is impossible, the MOCVD method can achieve the purpose of making a single crystal with low dislocation density through making regularly distributed closed defect accumulating regions (H) in accordance with the distribution of seeds.

[Growth of Sample D (300 μmφ seeds, 2000 μm Pitch)]

Sample D employs a hexagonal symmetric seed pattern of FIG. 8(a) arranging large equilateral triangles of a 2000 μm side and allotting big 300 μmφ seeds (SiO$_2$) on corners of the equilateral triangles. Sample D is an example having the largest seeds and widest pitch Sample D is made by the HVPE method like Samples A and B. The conditions of the HVPE are,

| | |
|---|---|
| Growing temperature | 1030° C. |
| NH$_3$ partial pressure | 0.3 atm (30 kPa) |
| HCl partial pressure | 2.5 × 10$^{-2}$ atm (2.5 kPa) |
| Growing time | 30 hours. |

The growth gives Sample D a 4.3 mm thick GaN crystal on the sapphire undersubstrate. Sample D reveals many dodecagonal reverse-cone pits. Closed defect accumulating regions (H) are regularly distributed in coincidence with the positions of the (SiO$_2$) seeds 53 implanted on the sapphire undersubstrate.

Some pits are distorted. Extra small pits which do not correspond with the seeds appear. Sample D shows weak controllability of seed positions.

Almost all of the closed defect accumulating regions (H) align at the predetermined positions spaced by a 2000 μm pitch in the same pattern as the initial seed pattern. The regularly aligning pits have about a 2000 μm diameter which is nearly equal to the pitch. Some pits on the seeds are 2000 μmφ diameter regular dodecagonal cones. Other pits on the seeds are 200 μmφ small pits with distorted shapes. Dislocation density is high in the closed defect accumulating regions (H).

Some closed defect accumulating regions (H) are distorted. But, almost all of the closed defect accumulating regions (H) are arranged at predetermined seeded spots in Sample D. Accompanying low dislocation single crystal regions (Z) and extra low dislocation single crystal regions (Y) made around the closed defect accumulating regions (H) at the regular seeded spots have low dislocation density of less than 5×10$^6$ cm$^{-2}$ Small number of closed defect accumulating regions (H) appear at unseeded spots. Narrow portions surrounding the unseeded closed defect accumulating regions (H) are not of low dislocation density.

Experiments of Samples A, B, C and D clarify optimum ranges of parameters;

Diameter of closed defect accumulating regions (H)=1 μm~200 μm

Diameter of seeds=2 μm~300 μm

Pitch of closed defect accumulating regions (H)=20 μm~2000 μm.

The above values of the parameters enable the present invention to make a low dislocation density GaN single crystal.

[Embodiment 2 (GaAs, Si, Sapphire Substrate; Pattern A, H(=A+ELO);FIG. 12)]

Embodiment 2 prepared three kinds of foreign material undersubstrates.

α. (111) GaAs undersubstrate

β. C-plane (0001) sapphire undersubstrate

γ. (111)Si undersubstrate

Silicon (Si) has the diamond structure of cubic symmetry group. Gallium arsenide (GaAs) has the zinc blende structure of cubic symmetry group. GaN has hexagonal symmetry. In cubic symmetry crystals, only a (111) plane has three-fold rotation symmetry. Thus, a (111) plane is employed for Si and GaAs. Sapphire has trigonal symmetry which lacks three-fold rotation symmetry. Thought the c-axis does not have three-fold rotation symmetry, a (0001) C-plane sapphire can be utilized as an undersubstrate of GaN growth.

FIGS. 12(1), (2) and (3) show steps of the GaN growth. Unlike Samples A to D, Embodiment 2 (Samples E–H) implants seeds 53 directly on the foreign material undersubstrates without an intermediate buffer layer. Hexagonally symmetric seed patterns are made by coating the undersubstrates with a masking film of a 0.1 μm thick SiO$_2$ layer and etching away extra portions except the corner points of equilateral triangles regularly arranged on the seed masks.

Embodiment 2 give Sample E–G Pattern A (50 μmφ seed, 400 μm pitch) and Sample H Pattern H (Pattern A+ELO mask).

(Pattern A)

Pattern A is the same as Embodiment 1. Many equilateral triangles of a 400 μm side are aligned without margin. 50 μmφ round seeds are put on the corners of the equilateral triangles (FIG. 6(a)). An extra part 19 except the seeds 23 is fully exposed without covering (Pattern H)

Pattern H is a complex pattern hybridized Pattern A with an ELO mask pattern. Pattern A has a wide extra part 19 as shown in FIG. 6(a). An ELO mask pattern is formed on the extra part 19. The ELO mask is a mask which is utilized in the ELO (epitaxial lateral overgrowth) which has been described as known technology. The ELO mask has many small (1~2 μmφ) windows perforated in a shielding film. Unlike the DIS mask, the ELO mask has a wider shielding part and narrower exposed parts (windows). For example, the ELO mask arranges many tiny equilateral triangles of a 4 μm side without margin and perforates 2 μmφ round windows at the corner points of the equilateral triangles. The basic triangle of a 4 μm side of the ELO mask is arranged in parallel with the fundamental triangle of a 400 μm side of Pattern A of the DIS mask.

In FIG. 12, the windows of the ELO mask are omitted, since the windows are too small to depict. The ELO mask part is formed on the extra part between neighboring seeds 53 on the undersubstrate 51.

The fundamental direction of Pattern A is defined as the direction of a side of a fundamental triangle. In the case of the GaAs (111) undersubstrate, a <1-10> GaAs direction is taken as the fundamental direction. In the case of the sapphire (0001) undersubstrate, a <1-100> sapphire direction is taken as the fundamental direction. In the case of the Si (111) undersubstrate, a <1-10> Si direction is taken as the fundamental direction. Embodiment 2 makes four samples E, F, G and H which are defined as follows.

Sample E: Pattern A (50 μmϕ seeds, 400 μm pitch) directly implanted on a (111) GaAs undersubstrate Sample F: Pattern A (50 μmϕ seeds, 400 μm pitch) directly implanted on a (0001) sapphire undersubstrate Sample G: Pattern A (50 μmϕ seeds, 400 μm pitch) directly implanted on a (111) silicon (Si) undersubstrate Sample H: Pattern H (Pattern A+ELO mask) directly implanted on a (111) GaAs undersubstrate FIG. 12(1) shows a seed implanted undersubstrate. What is different from Embodiment 1 is to form seed patterns directly on the undersubstrates without a GaN buffer. Embodiment 2 makes GaN layers on the undersubstrates of Samples E~H by the HVPE apparatus which has a furnace, a Ga-boat at an upper height in the furnace and a susceptor at a lower height in the furnace. Supply of $H_2$ gas and HCl gas to the Ga-melt synthesizes GaCl. Falling in the furnace, GaCl reacts with supplied ammonia gas and makes GaN on the undersubstrate. Two step growth of piling a thin buffer layer and an epi-layer produces a thick GaN crystal.

(1. Growth of a GaN Buffer Layer)

A buffer layer is often piled on an undersubstrate at a low temperature for enhancing the crystallographic property of over-coating layers. But, the buffer layer is not indispensable. A GaN buffer layer is grown on a gallium arsenide (GaAs) undersubstrate, a sapphire ($Al_2O_3$) undersubstrate or a silicon (Si) undersubstrate by the HVPE (hydride vapor phase epitaxy) method under the following condition;

| | |
|---|---|
| Ammonia ($NH_3$) partial pressure | 0.2 atm (20 kPa) |
| Hydrochloric acid (HCl) partial pressure | $2 \times 10^{-3}$ atm (200 Pa) |
| Growth temperature | 490° C. |
| Growth time | 15 minutes |
| Buffer layer thickness | 50 nm |

(2. Growth of a GaN Epitaxial Layer)

A GaN epitaxial layer is grown upon the low-temperature grown buffer layer by the HVPE method under the condition:

| | |
|---|---|
| Ammonia ($NH_3$) partial pressure | 0.2 atm (20 kPa) |
| Hydrochloric acid (HCl) partial pressure | $2.5 \times 10^{-2}$ atm (2500 Pa) |
| Growth temperature | 1010° C. |
| Growth time | 11 hours (660 minutes) |
| Epi-layer thickness | about 1300 μm (1.3 mm) |

Samples E, F, G and H having the low-temperature grown GaN buffer layer and the high-temperature grown GaN epi-layer are obtained. Samples E–H are all transparent substrates with a thickness of 1.3 mm. Appearance of the samples is similar to Embodiment 1. The cathode luminescence (CL) can discriminate the closed defect accumulating regions (H), the accompanying low dislocation single crystal regions (Z) and the extra low dislocation single crystal regions (Y). Since the samples have rugged surfaces carrying plenty of facet pits, the facets, the pits on the samples can be also observed by an optical microscope.

FIG. 12(2) shows the sections of the as-grown samples. All four samples have many pits consisting of slanting facets 56 on the surface. Bottoms 59 of the pits coincide with seeds ($SiO_2$) 53 which have been initially implanted on the undersubstrate as a DIS mask. 400 μm diameter pits align in the closest packed mode (Pattern A) in contact with six surrounding pits. The pit 400 μm diameter is equal to the spatial period (pitch) of 400 μm of the seeds 53. The pits are dodecagonal. It is confirmed that smaller facets having smaller inclination angles exist at center bottoms of the pits.

Closed defect accumulating regions (H) follow the seed 53. Tops of the closed defect accumulating regions (H) are the bottoms 59 of the pits. The slanting facets 56 are followed by the accompanying low dislocation single crystal regions (Z) 54. The extra low dislocation single crystal regions (Y) 58 have C-plane flats 57 at the tops. Both the accompanying low dislocation single crystal regions (Z) 54 and the extra low dislocation single crystal regions (Y) 58 are low-dislocation single crystals.

(Grinding)

The as-grown samples have rugged surfaces including plenty of pits and bottoms having the undersubstrates. Samples E, F, G and H are ground. The bottoms are ground for removing the foreign material undersubstrates 51. The GaAs, silicon or sapphire undersubstrate and the seeds are eliminated from the samples by the back grinding. The top surfaces are also ground for removing the facets and the pits and producing a flat top surface. Flat GaN wafers are made by polishing both surfaces. FIG. 12(3) shows a sectional view of the polished flat wafer. The wafers are transparent C-plane GaN single crystals having a (0001) plane as a surface. The regular structure containing the closed defect accumulating regions (H), the accompanying low dislocation single crystal regions (Z) and the extra low dislocation single crystal regions (Y) appears in the CL (cathode luminescence) image. It is observed that many closed defect accumulating regions (H) 55 align at the points in a six-fold rotation (hexagonally) symmetric pattern on the surface. Centers of all the closed defect accumulating regions (H) exactly coincide with the seeds 53 which have been implanted at the earliest stage. Horizontal sectional shapes of the closed defect accumulating regions (H) are not circular but amorphous. An average of diameters of the closed defect accumulating regions (H) is about 40 μm. The size (40 μm) of H corresponds to the seed size (50 μm diameter, 400 μm pitch). It is a reasonable result that the closed defect accumulating regions (H) grow directly just upon the hexagonally symmetric $SiO_2$ seeds. Namely, the closed defect accumulating regions (H) 55 transcribe the seeds 53.

High dislocation density is observed within the closed defect accumulating regions (H). Outside of H, dislocations decrease in proportion to the distance from the closed defect accumulating regions (H). Sufficient low dislocation density which is less than $5 \times 10^6$ cm$^{-2}$ prevails in the outer accompanying low dislocation single crystal regions (Z) and the extra low dislocation single crystal regions (Y). Average dislocation densities of Z and Y of Samples E~H are,

| | |
|---|---|
| Sample E (GaAs undersubstrate); | $2 \times 10^6$ cm$^{-2}$ |
| Sample F (sapphire undersubstrate); | $1 \times 10^6$ cm$^{-2}$ |
| Sample G (Si undersubstrate); | $3 \times 10^6$ cm$^{-2}$ |
| Sample H (GaAs undersubstrate); | $9 \times 10^5$ cm$^{-2}$. |

All the samples are favored with low dislocation density. Reduction of dislocations depends upon undersubstrates. The sapphire undersubstrate (F) has the strongest power for dislocation reduction among Sample E(GaAs), Sample F (sapphire) and Sample G (Si). The silicon undersubstrate has the weakest power of the dislocation reduction.

The most conspicuous dislocation reduction is obtained in Sample H which jointly uses the ELO mask. The use of the ELO mask exhibits an extra power of reducing dislocations. Comparison of Sample H with Sample E shows the dislocation reduction power of the closed defect accumulating regions (H) would be nearly equal to that of the ELO method. The ELO method annihilates dislocations by the sequential turn and the mutual collision as mentioned before. The closed defect accumulating regions (H) reduce dislocations by attracting, arresting and accumulating dislocations therewithin.

The state of the closed defect accumulating regions (H) in the samples E~H is similar to Embodiment 1 (Samples A~D). Facet pits originate from the seeds 53. Dislocations are swept to the bottoms of the facet pits. The dislocations gathered to the bottoms of the pits form the closed defect accumulating regions (H) following the seeds. Since the dislocations are constricted to the narrow closed defect accumulating regions (H), low dislocation density is realized in the accompanying low dislocation single crystal regions (Z) and the extra low dislocation single crystal regions (Y).

(Miracle of Sample E)

For Sample E (GaAs undersubstrate; Pattern A), two specimens are produced. Miraculously, the two specimens (named "Sample E1 and Sample E2") exhibit different crystal growth modes. One specimen (Sample E1) has clearly-discernible three kinds of regions, the closed defect accumulating regions (H), the accompanying low dislocation single crystal regions (Z) and the extra low dislocation single crystal regions (Y) like Embodiments 1 and 2. The other specimen (Sample E2) has pits just above the seeds at the same six-fold rotational symmetry spots. However, the closed defect accumulating regions (H) do not exist between the pit bottoms and the seeds. The preceding embodiments have a set of a pit, a closed defect accumulating region (H) and a seed. Three vertical parts (pit, H and seed) in series form a set in every embodiment described till now. The closed defect accumulating regions (H) are congenial to the pits and seeds. Unexpectedly, Sample E2 lacks the intermediate closed defect accumulating regions (H). The CL observation reveals the extinction of the closed defect accumulating regions (H) between the seeds and the pit bottoms. It is unreasonable that an identical method (Sample E) makes two different specimens (E1 and E2).

(Sample E2 Lacking Closed Defect Accumulating Regions (H))

H-less Sample E2 is examined in detail. The pit bottoms 59 have no closed defect accumulating regions (H). Dislocations which should be gathered and compressed within the closed defect accumulating regions (H) bluntly disperse and diffuse to wide regions below the pits in H-less Sample E2. An average of the dislocations is $6 \times 10^6$ cm$^2$ The average dislocation density of Sample E2 is higher than the dislocation density of the accompanying low dislocation single crystal regions (Z) and the extra low dislocation single crystal regions (Y) of other preceding samples. Groups of dislocations originate linearly from some pit bottoms 59 in Sample E2. Planar defects accompany the linear defects. The planar defects meet at 60 degrees with each other along vertical extensions of the pit bottoms as shown in FIG. 1(b). The linear defects are crossing lines of the planar defects. Some of the planar defects diffuse over 100 µm wide from the pit bottoms. Perhaps once converged dislocations to narrow regions below the pits are released out.

Sample E2 is devoid of the closed defect accumulating regions (H) which can absorb and accumulate plenty defects. Thus, dislocations diffuse bluntly. Planar defects appear at the bottoms of the pits. The pits are produced at points just above the seeds. The pits transcribe the seeds. But the pits are vacant. The vacant pits are useless for gathering, absorbing and storing dislocations. Thus, Sample E2 is not a low-dislocation crystal.

Production of low-dislocation GaN single crystals requires a first condition that the pits are made just above the implanted seeds with fidelity and a second condition that the closed defect accumulating regions (H) are made just below the pit bottoms. Two conditions are essential for reducing the dislocations. H-less pit occurrence transcribing the seeds is still insufficient. The closed defect accumulating regions (H) are significant and essential for making low-dislocation GaN crystals.

[Embodiment 3 (Kinds of Masks)]

A plurality of GaAs wafers having a (111) As surface are prepared as undersubstrates for examining the dislocation dependence upon materials of the mask. Different masks are made by coating the (111) As GaAs wafers with different materials.

(I) A 0.15 µm thick Si$_3$N$_4$ (silicon nitride) film is directly formed on the (111) GaAs wafer.

(J) A 0.2 µm thick Pt (platinum) film is directly formed on the (111) GaAs wafer.

(K) A 0.2 µm thick W (tungsten) film is directly formed on the (111) GaAs wafer.

(L) A 0.1 µm thick SiO$_2$ (silicon dioxide) film is directly formed on the (111) GaAs wafer.

(M) A 0.1 µm thick SiO$_2$ (silicon dioxide) film is directly formed on the (111) GaAs wafer.

Seed patterns are tailored by painting a resist on the film-coated GaAs wafers I~M and etching parts of the films from the film/GaAs selectively by photolithography. The SiN film (I), the Pt film (J) and the W film (K) are allocated with the seed pattern A (FIG. 6(a)) having six-fold rotation symmetry. Pattern A puts round 50 µmφ dots at corner points of 400 µm side equilateral triangles repeatedly arranged in 60 degree rotating three directions. The seed orientation is determined by harmonizing the GaAs<1-10> direction with one of the sides of the equilateral triangles.

An SiO$_2$ film (L) is allotted to Pattern L of four-fold rotation symmetry. Pattern L lays round 50 µmφ dots at corner points of 400 µm side squares repeatedly arranged lengthwise and crosswise. The orientation of Pattern L is determined by harmonizing one side of the square with the GaAs <1-10> direction.

Another SiO$_2$ film (M) is allotted to Pattern M of two-fold rotation symmetry. Pattern M lays round 50 µmφ dots at corner points of 400 µm×600 µm side rectangles repeatedly arranged lengthwise and crosswise. The orientation of Pattern M is determined by harmonizing the shorter side of the rectangle with the GaAs <1-10> direction.

Four kinds of films (Si$_3$N$_4$, Pt, W, SiO$_2$) are examined by an X-ray diffraction method. The Si$_3$N$_4$ film (I) turned out amorphous. The Pt film (J) turned out polycrystalline. The W film (K) turned out polycrystalline. The $SiO_2$ films (L,M) turned out amorphous. Combinations of the film/wafer (GaAs) are named I~M.

Sample I; a GaAs undersubstrate implanted with $Si_3N_4$ film seeds of Pattern A Sample J; a GaAs undersubstrate implanted with Pt film seeds of Pattern A Sample K; a GaAs undersubstrate implanted with W film seeds of Pattern A Sample L; a GaAs undersubstrate implanted with $SiO_2$ film seeds of Pattern L Sample M; a GaAs undersubstrate implanted with $SiO_2$ film seeds of Pattern M GaN layers are epitaxially grown on the sample undersubstrates (I~M) by the HVPE (Hydride Vapor Phase Epitaxy) method. The HVPE apparatus of Embodiment 3 is the same as Embodiment 1 and 2. The HVPE apparatus includes a hot-wall furnace, heaters winding around the furnace, gas supplying tubes, a gas exhaling tube, a vacuum pump, a Ga-boat installed at a higher point in the furnace and a susceptor installed at a lower point in the furnace. A sample substrate is put on the susceptor. The susceptor and the Ga-boat are heated. A mixture of hydrogen gas ($H_2$) and hydrochloric acid (HCl) gas is inhaled to the Ga-boat for synthesizing gallium chloride (GaCl). Another mixture of hydrogen gas and ammonia gas ($NH_3$) is supplied to the substrate for synthesizing GaN by the reaction of $NH_3$ with GaCl. Synthesized GaN piles upon the undersubstrate.

First, a GaN buffer layer is grown at a lower temperature. Second, GaN epi-layers are grown at a higher temperature. (Growth Condition of GaN Buffer Layer; Samples I~M; HVPE Method)

| | |
|---|---|
| Growth temperature | 490° C. |
| $NH_3$ partial pressure | 0.2 atm (20 kPa) |
| HCl partial pressure | $2 \times 10^{-3}$ atm (200 Pa) |
| Growth time | 20 minutes |
| Film thickness | 60 nm |

(Growth Condition of GaN Epitaxial Layers; Samples I~M; HVPE Method)

| | |
|---|---|
| Growth temperature | 1030° C. |
| $NH_3$ partial pressure | 0.25 atm (25 kPa) |
| HCl partial pressure | $2.5 \times 10^{-2}$ atm (2.5 kPa) |
| Growth time | 13 hours |
| Average film thickness | 1800 $\mu$m (1.8 mm) |

Samples I~M which grow a 1.8 mm thick GaN layers on the undersubstrate have many pits on the surface. Samples I, J and K have a similar rugged surface which contains many dodecagonal facet pits align in a hexagonally symmetric pattern (FIG. 6(b)). The positions of the dodecagonal facet pits coincide with the positions of the implanted seeds. The pitch is about 400 $\mu$m. An average diameter of the pits is about 400 $\mu$m. Neighboring pits are in contact at six points. Samples I, J and K achieve a two-dimensional closest packed arrangement of pits.

Similarly to Samples I, J and K, many dodecagonal cones of facet pits appear on the surface of Samples L and M. The repetition pattern of Sample L is different. Facet pits in Sample L align in a four-fold rotation symmetry pattern allotting pits at corner points of many 400 $\mu$m wide squares in contact with aligning crosswise and lengthwise. Facet pits in Sample M align in a two-fold rotation symmetry pattern allotting pits at corner points of many 400 $\mu$m×600 $\mu$m wide rectangles in contact with aligning crosswise and lengthwise. The positions of the pits coincide with the positions of the seeds in Samples L and M.

Sample M has wide gaps between neighboring shorter side parallel pit arrays. The wide gaps are occupied mainly by extra low dislocation single crystal regions (Y). In the extra low dislocation single crystal regions (Y), vacant pits without corresponding to seeds are found somewhere. The majority of pits corresponds to seeds.

Bottoms of pits are observed. Milder slanting tiny facets (of bigger n) are confirmed at the bottoms of the pits in Samples I, J, K, L and M. But, rugged parts are found at the pit bottoms in Sample J.

Samples I~M are mechanically processed. The GaAs undersubstrates are eliminated by mechanical grinding. The faceted top surface is ground into a flat surface. As-cut GaN substrate wafers are further polished into flat, smooth wafers. 2 inch$\phi$ GaN substrate wafers are obtained.

Samples I, J and K are C-plane GaN substrates. The substrates are flat and transparent. A CL picture shows regular alignment of closed defect accumulating regions (H) which penetrate the substrate in the vertical direction. The closed defect accumulating regions (H) are regularly arranged in hexagonal symmetry in Samples I, J and K. Shapes of the closed defect accumulating regions (H) are rectangular or amorphous in Samples I, K, L and M. Diameters of (H) are about 40 $\mu$m. But, Sample J shows closed defect accumulating regions (H) of a diameter of 50 $\mu$m to 80 $\mu$m. The shapes of (H) are circular or circularly amorphous.

In any samples, dislocation density is low outside of the closed defect accumulating regions (H). Dislocation density outside reduces in proportion to the distance from the closed defect accumulating regions (H). In some cases, dislocation density rapidly falls just outside of the boundary (K).

Averages of dislocation density of the accompanying low dislocation single crystal regions (Z) and the extra low dislocation single crystal regions (Y) are less than $5 \times 10^6$ $cm^{-2}$ for all Samples I~M.

| | |
|---|---|
| Sample I: | $1 \times 10^6$ $cm^{-2}$ |
| Sample J: | $4 \times 10^6$ $cm^{-2}$ |
| Sample K: | $2 \times 10^6$ $cm^{-2}$ |
| Sample L: | $2 \times 10^6$ $cm^{-2}$ |
| Sample M: | $4 \times 10^6$ $cm^{-2}$ |

Samples I, K, L and M are similar to Sample A with regard to the state of the closed defect accumulating regions (H). A pit composed of facets originates from the round seed. A closed defect accumulating region (H) is produced under the pit bottom. Dislocations are accumulated in the closed defect accumulating region (H).

Samples are observed by taking CL pictures of the sample wafers. Sample J (Pt-seeds) reveals a strange fact. The closed defect accumulating regions (H) are polycrystals. Analysis based upon the CL images and the TEM pictures reveals manifold variations of the closed defect accumulating regions (H).

Pt-seed Sample J shows polycrystalline closed defect accumulating regions (H). Some other samples show single crystal closed defect accumulating regions (H). Monocrystalline (=single crystal) closed defect accumulating regions (H) have still some versions. Some of the monocrystalline closed defect accumulating regions (H) have crystal orientations (a-, b-, d-, c-axis) different from the orientations (a-, b-, d-, c-axis) of the surrounding (Z) and (Y).

Some of the monocrystalline closed defect accumulating regions (H) have a c-axis (<0001>) common with and a-, b-, d-axes different from the surrounding (Z) and (Y). The closed defect accumulating regions (H) depend upon samples.

Sample J (Pt-seed) having polycrystalline closed defect accumulating regions (H) decreases dislocations by the same functions as other samples of forming facet pits above the round seeds, producing closed defect accumulating regions (H) below the facet pits, and gathering dislocations into the closed defect accumulating regions (H).

Polycrystalline closed defect accumulating regions (H) conspicuously appearing also in Pt-seeded Sample J are found in Samples A and E. The Inventors considered the reason why the polycrystalline closed defect accumulating regions (H) occur. At an early stage of growth, polycrystalline GaN films are made on the Pt seeds. Polycrystalline GaN grows upward at a speed nearly equal to the growing speed at the surrounding Z and Y. Thus, shallower facets would not be formed on the polycrystalline GaN films on the seeds. Then, the closed defect accumulating regions (H) would remain polycrystalline.

Sample L has the closed defect accumulating regions (H) at four-fold rotation symmetric spots which are corner points of repeated 400 μm wide squares corresponding to the pattern (Pattern L) of the SiO$_2$ seeds.

Sample M has the closed defect accumulating regions (H) at two-fold rotation symmetric spots which are corner points of repeated 400 μm×600 μm wide rectangles corresponding to the pattern (Pattern M) of the SiO$_2$ seeds. The direction of the shorter pitch is parallel to <11-20> of a GaN crystal in Sample M. Samples L and M allow the pits and the closed defect accumulating regions (H) to align regularly crosswise and lengthwise in an orthogonal pattern. When square devices or rectangular devices are fabricated upon a GaN substrate made from Samples L or M, all the device chips can have identical distributions of dislocations and crystalline properties. Alternatively, a shorter pitch direction <1-100> can be assigned to Samples L and M.

[Embodiment 4 (Seeds =GaN Fine Particles; FIG. 13)]

Particles are also candidates of seeds for making the closed defect accumulating region (H). GaN fine particles of a diameter between 10 μm and 50 μm are made by milling GaN single crystals or GaN polycrystals. A metal plate (stencil) having windows for guiding seed particles is prepared by perforating small windows at corner points of regularly repeating 500 μm side equilateral triangles. Particles cannot be positioned by photolithography unlike the mask films of the preceding embodiments. The metal plate (stencil) with tiny windows is utilized to position the particle seeds at predetermined spots with preciseness.

A C-plane sapphire substrate 61 is prepared as an undersubstrate (FIG. 13(1)). An about 3 μm GaN epi-layer 62 is grown upon the sapphire undersubstrate 61 by an HVPE method (FIG. 13(2)). Particle seeds are implanted on the epi-layer 62 by laying the stencil on the GaN epi-layer 62 on an orientation equalizing a side of a basic triangle to a <11-20> direction and sprinkling the stencil with GaN particles for guiding the particles into the windows and removing the stencil. Particles 63 are allocated at the hexagonally symmetric spots as seeds. FIG. 13(3) shows an epi-layer implanted with particle seeds 63.

Two kinds of samples N and O implanted via the stencil with single crystal GaN fine particles and polycrystal GaN fine particles are prepared.

Sample N: GaN/sapphire undersubstrate implanted with GaN single crystal particles Sample O: GaN/sapphire undersubstrate implanted with GaN polycrystal particles Thick GaN films are grown on the undersubstrates of Samples N and O by the same HVPE method as Embodiments 1, 2 and 3 The furnace has a Ga-boat at an upper spot and a susceptor at a lower spot. Samples are placed on the susceptor. The Ga-boat is heated at 800° C. HCl gas and H$_2$ gas are introduced into the furnace above the Ga-boat for making gallium chloride (GaCl). NH$_3$ gas and H$_2$ gas are introduced into the furnace above the heated susceptor for reacting with GaCl and synthesizing GaN. The synthesized GaN is piled upon the undersubstrates upon the susceptor.

(Epitaxial Growth Condition)

| Growth temperature | 1050° C. |
|---|---|
| NH$_3$ partial pressure | 0.3 atm (30 kPa) |
| HCl partial pressure | 2.5 × 10$^{-2}$ atm (2.5 kPa) |
| Growth time | 10 hours |
| Layer thickness | about 1400 μm |

The epitaxial growth makes thick GaN crystals (N, O) of an about 1400 μm thickness. Samples N and O have a similar appearance. Vertical sections are shown in FIG. 13(4). Dodecagonal reverse conical pits having twelve facets 66 align with two-dimensionally regular repetitions on the surface. The pits are the closest packed on the surface. 500 μmφ pits are in contact with each other. Flat tops 67 (C-plane) remain among the pits. Shallower, smaller facets (having larger n) are observed at pit bottoms 69. The pits consist of an upper, steeper, larger cone (smaller n) and a lower, shallower, smaller cone (larger n).

The facet pit bottom 69 is followed by a closed defect accumulating region (H) 65 which is enclosed and shielded by a grain boundary (K) 70. The parts under the facets outside of H are accompanying low dislocation single crystal regions (Z). The other parts under the flat tops 67 are extra low dislocation single crystal regions (Y) 68. The pit bottom 69, the closed defect accumulating region (H) 65 and a seed 63 align in series in a vertical direction. The facets 66 and the accompanying low dislocation single crystal region (Z) 64 align in the vertical direction. The flat top 67 and the extra low dislocation single crystal region (Y) 68 align in the vertical direction.

As-grown samples N and O have rugged surfaces with the undersubstrates. The sapphire undersubstrate 61 and the seeds (particles) 63 are eliminated by grinding the bottom surface. The facet pits are removed by grinding the top surface. Both surfaces are polished. Two inch φ flat, smooth GaN substrate wafers are obtained.

The GaN wafers are transparent for human eyesight. The CL image or TEM picture discriminates H, Z and Y. FIG. 13(5) denotes a CL image of a section of a flat, smooth GaN substrate wafer. The closed defect accumulating regions (H) are aligned at hexagonally-symmetric points (six-fold rotation symmetry) on the surface. The horizontal sections of H are amorphous. The diameters of the closed defect accumulating regions (H) are 10 μm to 70 μm. Big fluctuation of the diameters results from vast variations of the diameters of seed particles (10 μm to 50 μm).

There are high density dislocations within the closed defect accumulating regions (H). Dislocations are far fewer in the accompanying low dislocation single crystal regions (Z) and the extra low dislocation single crystal regions (Y). The dislocations reduce in Z and Y in proportion to the distance from the boundary (K). Sometimes a small separation from K reduces dislocations seriously. Averages of the dislocation density are less than $5 \times 10^6$ cm$^{-2}$ in the accompanying low dislocation single crystal regions (Z) and the extra low dislocation single crystal regions (Y) of both samples N and O.

Sample N: $1 \times 10^6$ cm$^{-2}$
Sample O: $2 \times 10^6$ cm$^{-2}$

The state of the closed defect accumulating regions (H) is similar to Sample A of Embodiment 1.

Embodiment 4 positions the fine particles by a metal plate having tiny windows. Dispersion of particle sizes and fluctuation of sprinkling lower the preciseness of seed positioning in comparison with Embodiments 1 and 2 which make use of photolithography. Embodiment 4 confirms applicability of fine particles as seeds of closed defect accumulating regions (H). No significant difference is found between GaN single crystal particles (Sample N) and GaN polycrystal particles (Sample O).

The GaN particles are chosen for the seed particles by Embodiment 4 for avoiding contamination. Fine particles made of foreign materials, other semiconductors, metals and insulators can be employed as the particle seeds. In any cases, bottom grinding eliminates the seed 63 with the undersubstrate 61, so that a finished flat, smooth substrate has the same inner structure as the case of the GaN particle seeds.

[Embodiment 5 (Seeds=Exposed Portions of Undersubstrate from Mask; FIG. 14)]

A sapphire substrate 71 having a C-plane surface is prepared as an undersubstrate (FIG. 14(1)). An about 2 $\mu$m thick GaN layer 72 is grown on the sapphire undersubstrate 71 by an MOCVD method.

A hexagonally-symmetric seed pattern built by aligning 400 $\mu$m side equilateral triangles having one side parallel with a <11-20> direction of GaN is assumed on the sapphire undersubstrate 71. 70 $\mu$m$\phi$ round windows 73 are perforated in the GaN layer 72 at all the corner points of the repeated equilateral triangles by etching. FIG. 14(3) denotes the GaN negative mask pattern. The GaN layer 72 has the round windows 73. The sapphire undersubstrate texture is exposed within the windows 73. The exposed sapphire 71 has a function of suppressing GaN growth in comparison with the GaN mask layer 72. The GaN film promotes the GaN growth. The exposed sapphire parts play a role of seeds for delaying piling of GaN films. Embodiment 5 makes use of the exposed undersubstrate parts 73 as seeds. The seeds are not films 72 but the exposed parts 73. The GaN film is a negative seed film. Embodiment 5 is immune from contamination by foreign materials, since the negative mask is made of GaN itself Another advantage of Embodiment 5 is precise positioning of seeds by photolithography. The negative GaN mask seed pattern 72 is also a six-rotationally symmetric pattern of a 400 $\mu$m pitch and a 70 $\mu$m seed diameter. The GaN pattern is named Pattern P. A sample with Pattern P is called Sample P.

Sample P: Sapphire undersubstrate having exposed parts of a foreign material substrate as seeds.

A thick GaN layer is grown on Pattern P by the HVPE (hydride vapor phase epitaxy) method. The detail condition is similar to Embodiments 1, 2, 3 and 4. The thick GaN layer of Embodiment 5 is made by installing a Ga boat at an upper spot and a susceptor at a lower spot in the furnace, positioning a substrate on the susceptor, heating the Ga-boat at a temperature more than 800° C., supplying hydrochloric acid (HCl) gas and hydrogen gas (H$_2$) toward the Ga-boat, synthesizing gallium chloride (GaCl), supplying ammonia to the heated susceptor for inducing a reaction of ammonia with GaCl, and piling a GaN layer on the susceptor.

(Epitaxial Growth Condition)

| | |
|---|---|
| Growth temperature | 1030° C. |
| NH$_3$ partial pressure | 0.25 atm (25 kPa) |
| HCl partial pressure | $2.0 \times 10^{-2}$ atm (2 kPa) |
| Growth time | 12 hours |
| Layer thickness | about 1500 $\mu$m |

Embodiment 5 makes a 1500 $\mu$m thick GaN layer by the above condition. FIG. 14(4) shows a section of the grown GaN layer on the substrate. Reverse dodecagonal pits consisting of facets 76 appear in a regular array on the surface. The pits are aligned in a most close packed pattern two-dimensionally. On the surface, dodecagonal pits of a 400 $\mu$m diameter are in an external contact with neighboring pits. Flat tops 77 having a C-plane surface are formed among neighboring pits on the surface. Other shallower facets having larger n (c-Miller index) are observed on some of the pit bottoms.

Vertically-extending closed defect accumulating regions (H) 75 follow bottoms 79 of the pits. The closed defect accumulating regions (H) 75 are enclosed by grain boundaries (K) 80. Accompanying low-dislocation single crystal regions (Z) 74 are produced just below the facets 76 around the columnar closed defect accumulating regions (H) 75. Extra low dislocation single crystal regions (Y) 78 follow the flat tops 77.

The pit bottom 79, the closed defect accompanying region (H), and the seed 73 align in series in the vertical direction. The facet 76, the accompanying low dislocation single crystal region (Z) 74 and the GaN spot 72 align in series in the vertical direction. The flat top 77, the extra low dislocation single crystal region (Y) 78 and the GaN spot 72 align in the vertical direction.

The surface of the as-grown GaN layer has a rugged surface with many pits. The rugged surface and the bottom sapphire substrate 71 are obstacles for a device-fabricating substrate. The sapphire substrate 71 and the GaN spots 72 are eliminated by grinding the bottom of the sample. Then, the rugged surface is eliminated by grinding the top of the sample. Both the surfaces are polished into smooth surfaces. A smooth GaN wafer of a two-inch diameter is obtained by grinding and polishing. FIG. 14(5) shows the flat GaN substrate wafer. The closed defect accumulating regions (H) 75, the accompanying low dislocation single crystal regions (Z) 74 and the extra low dislocation single crystal regions (Y) 78 appear in turn as YZHZYZHZYZHZ . . . =(YZHZ)$^n$ on a vertical section of the GaN wafer.

The wafers N and O are gallium nitride (GaN) substrates having a (0001) top surface (C-plane). The GaN wafers are uniformly transparent for eye sight. The CL (cathode luminescence) observation or the TEM (transmission electron microscope) observation enables us to discriminate the closed defect accumulating regions (H), the accompanying low dislocation single crystal regions (Z) and the extra low dislocation single crystal regions (Y) in the GaN substrate wafer. The closed defect accumulating regions (H) are regularly arranged in a pattern having six-folding rotation symmetry similar to the pattern of the seeds 73 on the surface. The horizontal sections of the closed defect accumulating regions (H) have many variations. An average of the diameters of the closed defect accumulating regions (H) is about 50 μm. The seeds 73 which are exposed sapphire portions not covered with the GaN mask 72 are fabricated by photolithography. The deviations of the diameters and the positions of the closed defect accumulating regions (H) are small, since the seeds (mask holes) are exactly prepared. Embodiment 5 excels in preciseness.

The closed defect accumulating regions (H) contain high density of the defects. The accompanying low dislocation single crystal regions (Z) and the extra low dislocation single crystal regions (Y) are nearly free from the defects. Dislocation density rapidly decreases in proportion to the distance from the closed defect accumulating regions (H) in the accompanying low dislocation single crystal regions (Z) and the extra low dislocation single crystal regions (Y). Average dislocation density is less than $1\times10^6$ cm$^{-2}$ in the accompanying low dislocation single crystal regions (Z) and the extra low dislocation single crystal regions (Y). The inner structure of the closed defect accumulating regions (H) is similar to Sample A of Embodiment 1.

Embodiment 5 confirms that the exposed regions of the GaN-masked undersubstrate are promising candidates for seeds of making the closed defect accumulating regions (H). The GaN-masked undersubstrate seeds have an advantage of being immune from the impurity contamination, because the seeds make use of GaN itself as a negative mask. The mask GaN film is eliminated when a thick GaN substrate is grown. The grown GaN crystal is uniform in the direction of the thickness.

[Embodiment 6 (GaN Undersubstrate; Pattern A; FIG. 15)]

Embodiment 6 prepared two kinds of samples. One is Sample Q using a GaN undersubstrate made by Pattern A of Embodiment 1 (50 μmφ seed, 400 μm pitch). FIG. 15(1) shows the GaN undersubstrate of Sample Q. GaN of Sample Q is prepared by removing a sapphire undersubstrate and grinding surfaces of a sapphire removed GaN wafer so as to realize epitaxial growth thereon. And the GaN undersubstrate already has closed defect accumulating regions (H), accompanying low dislocation single crystal regions (Z), and extra low dislocation single crystal regions (Y). This is the GaN undersubstrate without a mask of Sample Q.

The other is Sample R using a GaN undersubstrate with an SiO$_2$ mask. The GaN undersubstrate with mask is produced by preparing a sapphire undersubstrate, piling a 2 μm GaN epitaxial layer on the sapphire substrate by the MOCVD method, forming a 0.1 μm SiO$_2$ layer on the GaN epi-layer, and etching the SiO$_2$ layer by photolithography to make an SiO$_2$ mask on the GaN layer. The processing is the same one as Embodiment 1, and the SiO$_2$ mask is equal to Pattern A. This is the GaN undersubstrate with the SiO$_2$ mask (Pattern A) of Sample R.

Simultaneously, a GaN epitaxial layer is piled on the non-masked GaN undersubstrate (Sample Q) and on the masked GaN undersubstrate (Sample R). This state is shown in FIGS. 15(2) and 15(3). The GaN epi-layer is grown by the same HVPE method as other Embodiments. The undersubstrates are set in a furnace and the GaN epi-layer is synthesized and grown on the undersubstrates by the reaction of material gasses under the high temperature of 1030° C. Diameters of both substrates of Sample Q and Sample R are 30 mm. The epitaxial growing condition is described here.

(Epitaxial Growing Condition)

| | |
|---|---|
| Growth temperature | 1030° C. |
| NH$_3$ partial pressure | 0.25 atm (25 kPa) |
| HCl partial pressure | $2.0 \times 10^{-2}$ atm (2 kPa) |
| Growth time | 80 hours |
| Layer thickness | 10 mm |

In both Sample Q and R, thick GaN ingots of about 10 mm in thickness are obtained. These ingots are named Ingot Q (of Sample Q) and Ingot R (of Sample R). Both Ingots Q and R have similar surface condition. Pits composed of 400 μmφ facets are almost arranged in the most closest packed pattern corresponding to the mask pattern in two dimensions. Surprisingly, although Sample Q has no masked pattern and grows GaN on the non-masked GaN undersubstrate, the surface condition of Ingot Q is similar to that of Ingot R using the masked GaN undersubstrate.

Sections of Ingots Q and R sliced in a vertical direction are observed. The section of Ingot Q is illustrated in FIG. 15(3). In Ingot Q, closed defect accumulating regions (H) 85 grow on the closed defect accumulating regions (H) 55 of the GaN undersubstrate. And either accompanying low dislocation single crystal regions (Z) 84 or extra low dislocation single crystal regions (Y) 88 are found on the accompanying low dislocation single crystal regions (Z) 54 and the extra low dislocation single crystal regions (Y) 58, not always correspondingly. Of course, the closed defect accumulating regions (H) 85 are positioned at the bottoms 89 of facets 86.

These two kinds of Ingots are done by slicing to some slices of GaN substrates, and the substrates are polished. The slicing is employed by a wire saw. In the result, 9 slices of GaN substrates are obtained from each Ingot. Sliced GaN substrates of Ingot Q are shown in FIG. 15(4).

When 9 sliced GaN substrates of Ingot Q were observed, the last top two or three substrates had defects and obstacles, but initial six or seven substrates were good. The good GaN substrates have surfaces of C-plane (0001) and are flat and transparent. On the surface of the GaN substrate, the closed defect accumulating regions (H) are almost arranged regularly in a six-fold symmetric pattern and are amorphous. Diameters of (H) are about 50 μm. The number of dislocations is small outside of the closed defect accumulating regions (H) and decreases in proportion to the distance from (H). It was confirmed that dislocations radically decrease at boundaries (K) in some cases. The average dislocation density outside of the closed defect accumulating regions (H) is less than $5\times10^6$ cm$^{-1}$. The GaN substrates from Ingot Q of Embodiment 6 of the present invention are endurable to practical use. This method of Embodiment 6 is effective for high productivity of producing low dislocation GaN substrates.

What we claim is:

1. A method of growing a single crystal gallium nitride substrate comprising the steps of:
    making pits composed of facets with bottoms on a GaN growing surface;
    producing closed defect accumulating regions (H) at the bottoms of the facet pits;
    attracting, annihilating and accumulating dislocations in surrounding regions by the closed defect accumulating regions (H); and
    reducing the dislocations of the surrounding regions.

2. A method of growing a single crystal gallium nitride substrate comprising the steps of:

implanting seeds on an undersubstrate;

growing a GaN crystal on the undersubstrate in vapor phase on a condition of producing facet pits;

forming pits composed of facets on the growing GaN crystal above the implanted seeds;

making closed defect accumulating regions (H) following bottoms of the facet pits and consisting of cores (S) having converged dislocations and extending perpendicular to the undersubstrate and grain boundaries (K) enclosing the cores (S);

making accompanying low dislocation single crystal regions (Z) surrounding the closed defect accumulating regions (H) under the pit facets;

making extra low dislocation single crystal regions (Y) around the accompanying low dislocation single crystal regions (Z) under a C-plane growing surface outside of the facet pits;

utilizing solely the grain boundaries (K) or both the grain boundaries (K) and the cores (S) enclosed by the grain boundaries (K) as dislocation annihilation/accumulation regions;

gathering dislocations by the facet pits from the accompanying low dislocation single crystal regions (Z) and the extra low dislocation single crystal regions (Y) to the closed defect accumulating regions (H);

annihilating and accumulating the dislocations in the boundaries (K) or in the boundaries (K) and the cores (S) of the closed defect accumulating regions (H);

reducing dislocations in the accompanying low dislocation single crystal regions (Z) and the extra low dislocation single crystal regions (Y); and obtaining a low dislocation GaN crystal.

3. A method of growing a single crystal gallium nitride substrate according to claim 2, wherein the cores (S) of the closed defect accumulating regions (H) formed at the bottoms of the facets which rise during the growth are polycrystals and the surrounding accompanying low dislocation single crystal regions (Z) and the extra low dislocation single crystal regions (Y) are single crystals having the same basic orientation.

4. A method of growing a single crystal gallium nitride substrate according to claim 2, wherein the surrounding accompanying low dislocation single crystal regions (Z) and the extra low dislocation single crystal regions (Y) are single crystals having the same basic orientation and the cores (S) of the closed defect accumulating regions (H) are composed of one or more than one crystal grain which has an orientation different from the basic orientation of the surrounding accompanying low dislocation single crystal regions (Z) and the extra low dislocation single crystal regions (Y).

5. A method of growing a single crystal gallium nitride substrate according to claim 2, wherein the surrounding accompanying low dislocation single crystal regions (Z) and the extra low dislocation single crystal regions (Y) are single crystals having the same basic orientation and the cores (S) of the closed defect accumulating regions (H) are composed of one or more than one crystal grain which has the same <0001> axis as a <0001> axis of the basic orientation of the surrounding accompanying low dislocation single crystal regions (Z) and the extra low dislocation single crystal regions (Y).

6. A method of growing a single crystal gallium nitride substrate according to claim 2, wherein the surrounding accompanying low dislocation single crystal regions (Z) and the extra low dislocation single crystal regions (Y) are single crystals having the same basic orientation and the cores (S) of the closed defect accumulating regions (H) are a single crystal which has a <0001> axis antiparallel to a <0001> axis of the basic orientation of the surrounding accompanying low dislocation single crystal regions (Z) and the extra low dislocation single crystal regions (Y).

7. A method of growing a single crystal gallium nitride substrate according to claim 2, wherein the surrounding accompanying low dislocation single crystal regions (Z) and the extra low dislocation single crystal regions (Y) are single crystals having the same basic orientation and the cores (S) of the closed defect accumulating regions (H) are composed of one or more than one crystal grain which has a <0001> axis antiparallel to a <0001> axis of the basic orientation of the surrounding accompanying low dislocation single crystal regions (Z) and the extra low dislocation single crystal regions (Y).

8. A method of growing a single crystal gallium nitride substrate according to claim 2, wherein the accompanying low dislocation single crystal regions (Z) have the same basic orientation as the extra low dislocation single crystal regions (Y) and the cores (S) of the closed defect accumulating regions (H) are composed of one or more than one crystal grain having an orientation slightly slanting to the basic orientation of the accompanying low dislocation single crystal regions (Z) and the extra low dislocation single crystal regions (Y).

9. A method of growing a single crystal gallium nitride substrate according to claim 2, wherein the surrounding accompanying low dislocation single crystal regions (Z) and the extra low dislocation single crystal regions (Y) are single crystals having the same basic orientation, the cores (S) of the closed defect accumulating regions (H) are composed of one or more than one crystal grain and the grain boundaries (K) enclosing the cores (S) are planar defects or linear defect assemblies.

10. A method of growing a single crystal gallium nitride substrate according to claim 2, wherein the surrounding accompanying low dislocation single crystal regions (Z) and the extra low dislocation single crystal regions (Y) are single crystals having the same basic orientation, the cores (S) of the closed defect accumulating regions (H) are single crystals having the basic orientation same as the surrounding accompanying low dislocation single crystal regions (Z) and the extra low dislocation single crystal regions (Y) and the grain boundaries (K) enclosing the cores (S) are planar defects or linear defect assemblies.

11. A method of growing a single crystal gallium nitride substrate according to claim 9, wherein the cores (S) of the closed defect accumulating regions (H) contain linear defect assemblies or planar defects.

12. A method of growing a single crystal gallium nitride substrate according to claim 2, wherein an average growing direction in the accompanying low dislocation single crystal regions (Z) and the extra low dislocation single crystal regions (Y) is a c-axis direction.

13. A method of growing a single crystal gallium nitride substrate according to claim 2, wherein the facet pits are hexagonal reverse cones, dodecagonal reverse cones or two stepped hexagonal or dodecagonal reverse cones composed of two sets of facets with different slanting angles.

14. A method of growing a single crystal gallium nitride substrate according to claim 13, wherein plane indices of the facets building the pits are {kk-2kn} and {k-k0n} (k,n; integers).

15. A method of growing a single crystal gallium nitride substrate according to claim 14, wherein plane indices of the facets building the pits are {11-22} and {1-101}.

16. A method of growing a single crystal gallium nitride substrate according to claim 2, wherein the closed defect accumulating regions (H) following the facet pits grow, maintaining surfaces of plane indices different from the facets building the pits.

17. A method of growing a single crystal gallium nitride substrate according to claim 16, wherein the closed defect accumulating regions (H) following the facet pits maintain surfaces of plane indices different from the facets building the pits and of a smaller inclination than the facets building the pits.

18. A method of growing a single crystal gallium nitride substrate according to claim 2, wherein the closed defect accumulating regions (H) following the facet pits maintain surfaces of a smaller inclination than the pit facets and an orientation having a <0001> direction antiparallel to a <0001> direction of a basic orientation of the accompanying low dislocation single crystal regions (Z) and the extra low dislocation single crystal regions (Y).

19. A method of growing a single crystal gallium nitride substrate according to claim 2, wherein the closed defect accumulating regions (H) following the facet pits maintain surfaces of a smaller inclination than the pit facets and an orientation having a <0001> direction antiparallel to a <0001> direction of a basic orientation of the accompanying low dislocation single crystal regions (Z) and the extra low dislocation single crystal regions (Y) and the surfaces are {11-2-4}, {11-2-5}, {11-2-6}, {1-10-2}, {1-10-3} or {1-10-4}.

20. A method of growing a single crystal gallium nitride substrate according to claim 19, wherein the closed defect accumulating regions (H) following the facet pits maintain an orientation having a <0001> direction antiparallel to a <0001> direction of the basic orientation of the accompanying low dislocation single crystal regions (Z) and the extra low dislocation single crystal regions (Y) and interfaces which coincide at tops with borders between the pit facets and the smaller inclination surfaces.

21. A method of growing a single crystal gallium nitride substrate according to claim 2, wherein the closed defect accumulating regions (H) following the facet pits grow, maintaining discrete dot-converging shapes.

22. A method of growing a single crystal gallium nitride substrate according to claim 2, wherein the closed defect accumulating regions (H) following the facet pits grow, maintaining diameters of 1 μm to 200 μm.

23. A method of growing a single crystal gallium nitride substrate according to claim 2, wherein the closed defect accumulating regions (H) following the facet pits are amorphous, circular or polygonal in a horizontally sectional shape.

24. A method of growing a single crystal gallium nitride substrate according to claim 2, wherein a plurality of seeds are implanted periodically and regularly in a symmetric pattern on the undersubstrate for aligning the facet pits having a closed defect accumulating region (H) at the bottom periodically and regularly in a symmetric pattern on a surface of a growing crystal during the growth.

25. A method of growing a single crystal gallium nitride substrate according to claim 24, wherein the symmetric pattern is a six-fold rotation symmetry pattern which aligns equivalent equilateral triangles in hexagonal symmetry and the closed defect accumulating regions (H) are disposed at corner points of the equilateral triangles of the pattern.

26. A method of growing a single crystal gallium nitride substrate according to claim 24, wherein the symmetric pattern is a four-fold rotation symmetry pattern which aligns equivalent squares in four-fold symmetry and the closed defect accumulating regions (H) are disposed at corner points of the squares of the pattern.

27. A method of growing a single crystal gallium nitride substrate according to claim 24, wherein the symmetric pattern is a two-fold rotation symmetry pattern which aligns equivalent rectangles in two-fold symmetry and the closed defect accumulating regions (H) are disposed at corner points of the rectangles of the pattern.

28. A method of growing a single crystal gallium nitride substrate according to claim 24, wherein a pitch of the pits which is a center-to-center distance between neighboring pits ranges from 50 μm to 2000 μm.

29. A method of growing a single crystal gallium nitride substrate according to claim 2, wherein polycrystalline or amorphous films are disposed upon the undersubstrate as seeds of the closed defect accumulating regions (H).

30. A method of growing a single crystal gallium nitride substrate according to claim 29, wherein polycrystalline or amorphous films patterned into rounds, polygons or other definite shapes are disposed upon the undersubstrate as seeds of the closed defect accumulating regions (H).

31. A method of growing a single crystal gallium nitride substrate according to claim 30, wherein polycrystalline or amorphous films patterned into rounds or polygons of a diameter ranging from 1 μm to 300 μm are disposed upon the undersubstrate as seeds of the closed defect accumulating regions (H).

32. A method of growing a single crystal gallium nitride substrate according to claim 29, wherein silicon dioxide ($SiO_2$) films, silicon nitride ($Si_3N_4$) films, platinum (Pt) films or tungsten (W) films are disposed upon the undersubstrate as seeds of the closed defect accumulating regions (H).

33. A method of growing a single crystal gallium nitride substrate according to claim 2, wherein GaN polycrystal particles, GaN single crystal particles or foreign material particles except GaN are disposed upon the undersubstrate as seeds of the closed defect accumulating regions (H).

34. A method of growing a single crystal gallium nitride substrate according to claim 33, wherein surfaces of a single crystal or a polycrystal of a foreign material are utilized as seeds of the closed defect accumulating regions (H) by making a GaN epi-layer on an undersubstrate of the foreign material, etching partially the GaN epi-layer for exposing parts of the surface of the undersubstrate.

35. A method of growing a single crystal gallium nitride substrate according to claim 29, wherein surfaces of a polycrystal or an amorphous film of a foreign material are utilized as seeds of the closed defect accumulating regions (H) by optionally making a GaN epi-layer on an undersubstrate, covering an undersubstrate or the GaN epi-layer piled on the undersubstrate with the polycrystalline or amorphous film of the foreign material, etching partially the foreign material film for exposing parts of the surface of the undersubstrate or the GaN epi-layer and for shaping the rest of the foreign material films into a determined shape and alignment as seeds.

36. A method of growing a single crystal gallium nitride substrate according to claim 30, wherein dislocations are doubly reduced by disposing patterned polycrystal or amorphous films on an undersubstrate as seeds of making closed defect accumulating regions (H), providing exposed non-seed parts with ELO masks for inducing epitaxial lateral overgrowth, growing a GaN crystal on the undersubstrate having the patterned seeds pattern and the ELO mask on the non-seed parts, reducing dislocations at an early stage of growth by a function of the ELO mask and reducing dislocations at a middle and a final stages of the growth by a function of the closed defect accumulating regions (H) made by the seeds.

37. A method of growing a single crystal gallium nitride substrate according to claim 30, wherein dislocations are doubly reduced by providing an undersubstrate with an ELO mask, growing a low dislocation GaN film on the undersubstrate with the ELO mask, disposing patterned polycrystal or amorphous films on the GaN film as seeds of making closed defect accumulating regions (H), growing another thick GaN crystal on the undersubstrate having the patterned seeds pattern and the ELO mask on the non-seed parts, reducing dislocations at an early stage of growth by a function of the ELO mask and reducing dislocations at a middle and a final stages of the growth by a function of the closed defect accumulating regions (H) made by the seeds.

38. A method of growing a single crystal gallium nitride substrate according to claim 2, wherein the undersubstrate is made of GaN, sapphire, silicon carbide (SiC), spinel, gallium arsenide (GaAs) or Si.

39. A method of producing a single crystal gallium nitride substrate comprising the steps of:

implanting seeds on an undersubstrate;

growing a GaN crystal on the undersubstrate in vapor phase on a condition of producing facet pits;

forming pits composed of facets on the growing GaN crystal above the implanted seeds;

making closed defect accumulating regions (H) following bottoms of the facet pits and consisting of cores (S) having converged dislocations and extending perpendicular to the undersubstrate and grain boundaries (K) enclosing the cores (S);

making accompanying low dislocation single crystal regions (Z) surrounding the closed defect accumulating regions (H) under the pit facets;

making extra low dislocation single crystal regions (Y) around the accompanying low dislocation single crystal regions (Z) under a C-plane growing surface outside of the facet pits;

utilizing solely the grain boundaries (K) or both the grain boundaries (K) and the cores (S) enclosed by the grain boundaries (K) as dislocation annihilation/accumulation regions;

gathering dislocations by the facet pits from the accompanying low dislocation single crystal regions (Z) and the extra low dislocation single crystal regions (Y) to the closed defect accumulating regions (H);

annihilating and accumulating the dislocations in the boundaries (K) or in the boundaries (K) and the cores (S) of the closed defect accumulating regions (H);

reducing dislocations in the accompanying low dislocation single crystal regions (Z) and the extra low dislocation single crystal regions (Y);

obtaining a low dislocation GaN crystal;

slicing, grinding, lapping or other mechanical processing the low dislocation GaN crystal for making a uniform GaN substrate without facets and undersubstrate;

polishing the uniform GaN substrate; and obtaining a flat, smooth GaN substrate.

40. A method of producing a single crystal gallium nitride substrate according to claim 39, wherein a plurality of GaN wafers are produced by growing a thick low dislocation GaN crystal on the undersubstrate and slicing the thick GaN crystal into a plurality of GaN wafers.

41. A method of producing a single crystal gallium nitride substrate comprising the steps of:

preparing an undersubstrate which is a single crystal gallium nitride substrate including a plurality of fundamental units (Q), the fundamental unit (Q) containing;

a closed defect accumulating region (H) including a core (S) extending vertical to surfaces of the undersubstrate and containing many accumulated defects and a grain boundary (K) enclosing the core (S), an accompanying low dislocation single crystal region (Z) surrounding the closed defect accumulating region (H) and being a single crystal of a basic orientation with low dislocation density, and an extra low dislocation single crystal region (Y) lying outside of the accompanying low dislocation single crystal region (Z) and being a single crystal with the same basic orientation as the accompanying low dislocation single crystal region (Z);

growing a GaN crystal on the GaN undersubstrate in vapor phase on a condition of producing facet pits;

forming pits composed of facets on the growing GaN crystal just above the closed defect accumulating regions (H) and the accompanying low dislocation single crystal regions (Z) of the GaN undersubstrate;

making closed defect accumulating regions (H) following bottoms of the facet pits and succeeding the closed defect accumulating regions (H) of the GaN undersubstrate, the closed defect accumulating regions (H) consisting of a core (S) having converged dislocations and extending perpendicular to the undersubstrate and grain boundary (K) enclosing the core (S);

making accompanying low dislocation single crystal regions (Z) surrounding the closed defect accumulating regions (H) under the pit facets and on the accompanying low dislocation single crystal regions (Z) of the GaN undersubstrate;

making extra low dislocation single crystal regions (Y) around the accompanying low dislocation single crystal regions (Z) under a C-plane growing surface outside of the facet pits and on the extra low dislocation single crystal regions (Y) of the GaN undersubstrate;

utilizing solely the grain boundaries (K) or both the grain boundaries (K) and the cores (S) enclosed by the grain boundaries (K) as dislocation annihilation/accumulation regions;

gathering dislocations by the facet pits from the accompanying low dislocation single crystal regions (Z) and the extra low dislocation single crystal regions (Y) to the closed defect accumulating regions (H);

annihilating and accumulating the dislocations in the boundaries (K) or in the boundaries (K) and the cores (S) of the closed defect accumulating regions (H);

reducing dislocations in the accompanying low dislocation single crystal regions (Z) and the extra low dislocation single crystal regions (Y);

obtaining a low dislocation GaN crystal;

slicing, grinding, lapping or other mechanical processing the low dislocation GaN crystal for making a uniform GaN substrate without facets and undersubstrate;

polishing the uniform GaN substrate; and obtaining a flat, smooth GaN substrate.

42. A method of producing a single crystal gallium nitride substrate according to claim 41, wherein a plurality of GaN wafers are produced by growing a thick low dislocation GaN crystal on the GaN undersubstrate and slicing the thick GaN crystal into a plurality of GaN wafers.

* * * * *